(12) United States Patent
Tanaka et al.

(10) Patent No.: US 6,906,427 B2
(45) Date of Patent: Jun. 14, 2005

(54) CONDUCTIVE PARTICLES AND METHOD AND DEVICE FOR MANUFACTURING THE SAME, ANISOTROPIC CONDUCTIVE ADHESIVE AND CONDUCTIVE CONNECTION STRUCTURE, AND ELECTRONIC CIRCUIT COMPONENTS AND METHOD OF MANUFACTURING THE SAME

(75) Inventors: Yoshiaki Tanaka, Osaka (JP); Yoshiaki Kodera, Shiga (JP); Manabu Matsubara, Himeji (JP); Kazuhiko Kanki, Shiga (JP); Tatsuo Suzuki, Shiga (JP); Kazuo Ukai, Shiga (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 10/379,582

(22) Filed: Mar. 6, 2003

(65) Prior Publication Data

US 2004/0031690 A1 Feb. 19, 2004

Related U.S. Application Data

(62) Division of application No. 09/403,271, filed as application No. PCT/JP98/01758 on Apr. 17, 1998, now Pat. No. 6,562,217.

(30) Foreign Application Priority Data

| Apr. 17, 1997 | (JP) | 9-100181 |
| Jun. 2, 1997 | (JP) | 9-143814 |
| Oct. 24, 1997 | (JP) | 9-292433 |
| Oct. 24, 1997 | (JP) | 9-292434 |
| Oct. 28, 1997 | (JP) | 9-295859 |
| Dec. 16, 1997 | (JP) | 9-346382 |
| Dec. 16, 1997 | (JP) | 9-346383 |
| Feb. 20, 1998 | (JP) | 10-39126 |

(51) Int. Cl.$^7$ .................................. H01L 23/48
(52) U.S. Cl. ............... 257/778; 257/779; 252/513; 252/514; 428/407
(58) Field of Search .................. 428/407; 257/778, 257/779, 780, 795; 252/513, 514

(56) References Cited

U.S. PATENT DOCUMENTS

| 3,428,543 | A |   | 2/1969 | Weber |
| 4,019,968 | A |   | 4/1977 | Spaziante et al. |
| 5,120,665 | A | * | 6/1992 | Tsukagoshi et al. ........... 156/64 |
| 5,603,815 | A |   | 2/1997 | Lashmore et al. |
| 5,698,081 | A |   | 12/1997 | Lashmore et al. |
| 5,965,064 | A | * | 10/1999 | Yamada et al. ............. 252/512 |
| 6,184,577 | B1 | * | 2/2001 | Takemura et al. ........... 257/701 |
| 6,281,450 | B1 | * | 8/2001 | Urasaki et al. ............. 174/261 |
| 6,337,445 | B1 | * | 1/2002 | Abbott et al. ............... 174/260 |
| 6,680,128 | B2 | * | 1/2004 | Mei ........................... 428/570 |
| 2003/0178313 | A1 |   | 9/2003 | Tanaka et al. |

FOREIGN PATENT DOCUMENTS

| EP | 001093160 A2 | * | 4/2001 |
| JP | 52-147797 |   | 12/1977 |
| JP | 61-277104 |   | 12/1986 |

(Continued)

OTHER PUBLICATIONS

F.A. Lowenhein, Electroplating, McGraw–Hill Book Company, New Your, pp 416–423, 1978.

*Primary Examiner*—Cathy F. Lam
(74) *Attorney, Agent, or Firm*—Connolly, Bove, Lodge & Hutz, LLP

(57) ABSTRACT

An electrical connection is formed by using a double laminated conductive fine particle provided with a conductive metal layer on the surface of a spherical elastic base particle by electroless plating and electroplating and a layer of a low-melting-point metal on the surface of the conductive metal layer and wherein the conductive metal layer comprises a plurality of metal layers.

30 Claims, 21 Drawing Sheets

FOREIGN PATENT DOCUMENTS

| | | |
|---|---|---|
| JP | 61-277105 | 12/1986 |
| JP | 62-55348 | 4/1987 |
| JP | 62-185749 | 8/1987 |
| JP | 63-190204 | 8/1988 |
| JP | 63-231889 | 9/1988 |
| JP | 64-11235 | 1/1989 |
| JP | 1-225776 | 9/1989 |
| JP | 1-247501 | 10/1989 |
| JP | 3-257710 | 11/1991 |
| JP | 3-291807 | 12/1991 |
| JP | 4-36902 | 2/1992 |
| JP | 4-69945 | 3/1992 |
| JP | 4-147513 | 5/1992 |
| JP | 4-259766 | 9/1992 |
| JP | 4-269720 | 9/1992 |
| JP | 5-75250 | 3/1993 |
| JP | 5-243332 | 9/1993 |
| JP | 6-96771 | 11/1994 |
| JP | 7-118896 | 5/1995 |
| JP | 7-212017 | 8/1995 |
| JP | 8-97312 | 4/1996 |
| JP | 8-239799 | 9/1996 |
| JP | 9-137289 | 5/1997 |
| JP | 9-213741 | 8/1997 |
| JP | 9-246319 | 9/1997 |
| JP | 9-293753 | 11/1997 |
| JP | 9-293754 | 11/1997 |

* cited by examiner

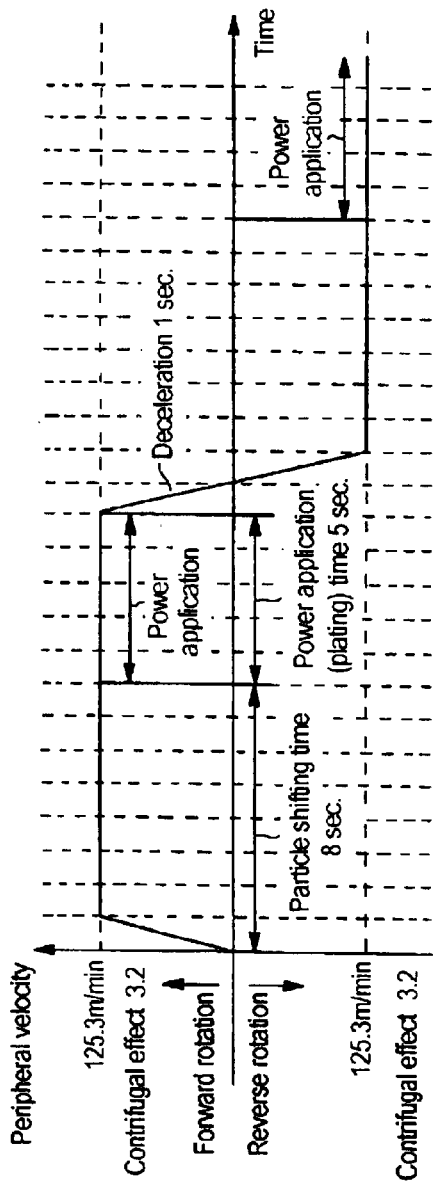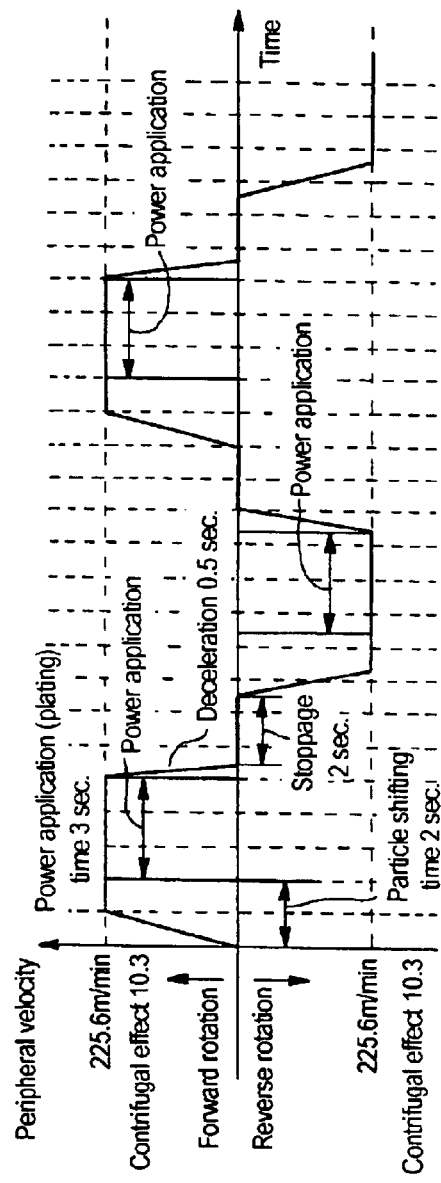

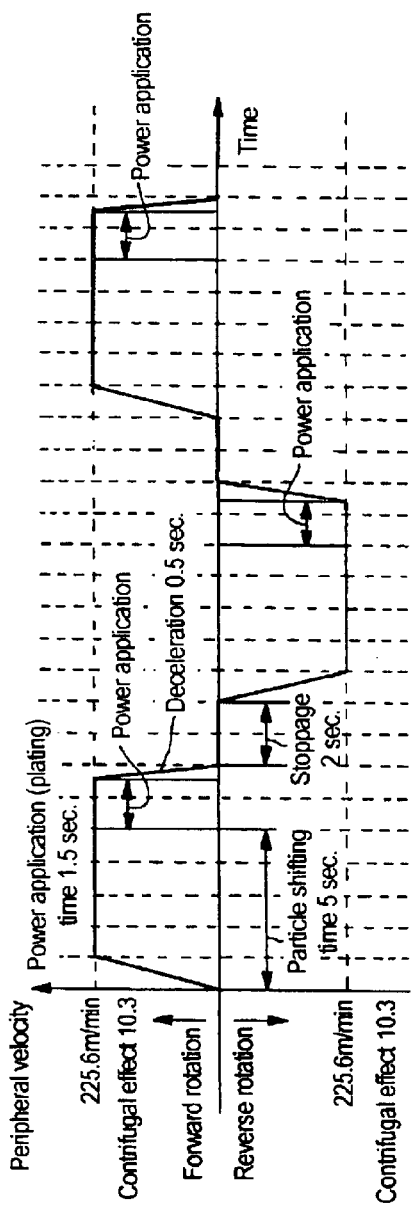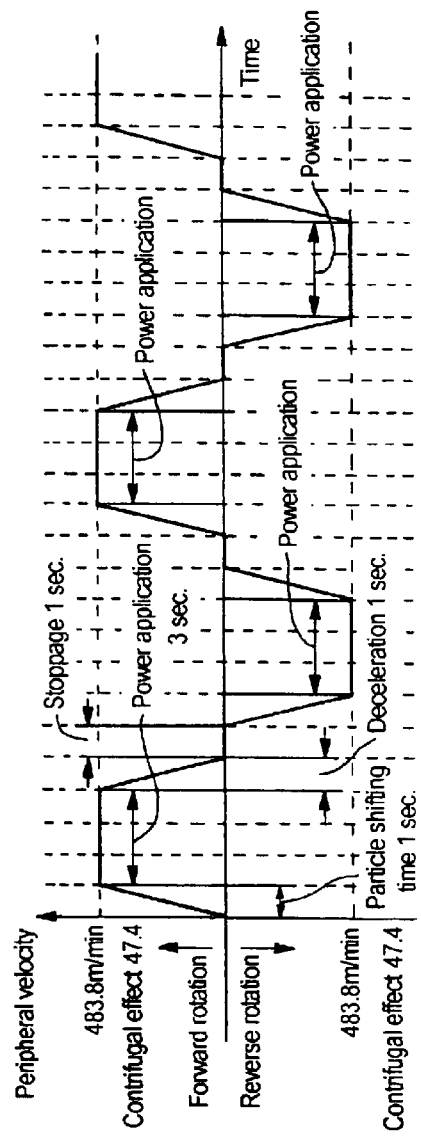

CONDUCTIVE PARTICLES AND METHOD AND DEVICE FOR MANUFACTURING THE SAME, ANISOTROPIC CONDUCTIVE ADHESIVE AND CONDUCTIVE CONNECTION STRUCTURE, AND ELECTRONIC CIRCUIT COMPONENTS AND METHOD OF MANUFACTURING THE SAME

CROSS REFRENCE OF APPLCIATION

The present application is a Divisional of Ser. No. 09/403,271 filed Dec. 27, 1999, now U.S. Pat. No. 6,562,217; which is National Phase of PCT/JP98/01758 filed Apr. 17, 1998.

FIELD OF THE INVENTION

The present invention relates to a manufacturing method of conductive fine particles which are free from aggregation in a plating solution and which forms a plating layer having a extremely uniform thickness, the manufacturing device thereof, the conductive fine particles as well as an anisotropic conductive adhesive and a conductive connecting structural element using such particles.

The present invention further concerns an electronic circuit part which is obtained by connecting an electronic circuit element, such as a semiconductor element, a quartz oscillator and a photoelectric transfer element that are used in the field of electronics, and an electronic circuit substrate through conductive fine particles in a manner so as to be connected to fine electrodes, an electronic circuit element, an electronic circuit substrate and conductive fine particles used in such an electronic circuit part, as well as a manufacturing method for such an electronic circuit part.

BACKGROUND OF THE INVENTION

Conductive materials include conductive paste, conductive adhesives, anisotropic conductive films, etc., and for this conductive material, a conductive composition comprising conductive fine particles and a resin is used. With respect to the conductive fine particles, there are generally used metal powder, carbon powder, fine particles having a metal plating layer on the surface, etc.

Manufacturing methods for such conductive fine particles having a metal plating layer on the surface are disclosed by for example, the following Japanese Kokai Applications: Sho-52-147797, Sho-61-277104, Sho-61-277105, Sho-62-185749, Sho-63-190204, Hei-1-225776, Hei-1-247501 and Hei-4-147513.

Among these manufacturing methods, when carrying out plating on fine particles having a particle size of not less than 5000 $\mu$m, barrel plating devices are generally used. In the barrel plating device, a plating target is put inside a rotatable barrel having a polygon cylinder shape in which a plating solution is contained, and while the barrel is being rotated, electroplating is carried out by allowing the plating target to contact the cathode placed inside the barrel.

However, when plating is carried out on fine particles having a particle size not more than 5000 $\mu$m by a method using the barrel plating device, problems arise in it that fine particles in an aggregated state are subjected to plating in the plating solution, failing to form mono-particles and in it that particles are not plated uniformly, causing an irregular plating layer.

In order to solve these problems, for example, the following plating devices have been proposed: Japanese Kokai Publication Hei-7-118896 discloses a manufacturing device for conductive fine particles which comprises a disk-shaped bottom plate secured to the upper end of a perpendicular driving shaft, a contact ring for conducting electricity placed on the upper face of the porous member, a porous member that is placed in the vicinity of the contact ring and that allows only a plating solution to pass there through, a hollow cover of a trapezoidal cone shape having an opening on its upper center portion, a treatment chamber formed in a manner so as to sandwich the contact ring between the outer circumferential portion of the hollow cover and the bottom plate, a supply tube for supplying the plating solution to the treatment chamber through the opening, a container for receiving plating solution scattered from the pores of the porous member, a drain tube for draining the plating solution accumulated in the container, and an electrode inserted through the opening to contact the plating solution, wherein, during the plating process, rotation and stoppage or speed reduction are repeated.

Japanese Kokai Publication Hei-8-239799 discloses a manufacturing device for conductive fine particles, in which the contact ring and the porous member are integrally connected.

Japanese Kokai Publication Hei-9-137289 discloses a manufacturing method for conductive fine particles, wherein a plating device, comprising a rotatable plating device main body having a filter section formed on at least one portion of its outer circumferential section and a cathode as a contact ring formed on the outer circumferential section and an anode placed inside the main body so as not to contact the cathode, is used for forming a plating layer on the surface of the fine particles put inside the main body, while the main body is rotated centered on its rotation axis and the plating solution is supplied to inside of the main body.

In these manufacturing devices for conductive fine particles, a plating target is pressed onto the contact ring by a centrifugal force, and rotated, and stopped or reduced in the speed repeatedly, therefore, the conductivity is improved even in the uniformly mixed state, the current density is increased, and the update of the plating solution is frequently carried out so that the fine particles are free from aggregation in the plating solution, thereby making it possible to obtain conductive fine particles having a plating layer with a uniform thickness.

However, the following problems arise in these manufacturing devices for conductive fine particles.

The pore size of the porous member and the number of revolutions (peripheral velocity) of the treatment chamber are appropriately selected in accordance with the particle size of fine particles as plating targets. In the case when fine particles having a particle size of not more than 100 $\mu$m are subjected to plating, it is necessary to increase the peripheral velocity of the treatment chamber so as to make the particles contact the contact ring. For example, in the case of fine particles having a diameter in the range of 60 to 100 $\mu$m, the pore size of the porous member needs to be set to not less than 20 $\mu$m and the peripheral velocity needs to be set to not less than 300 m/min. It is confirmed that the peripheral velocity not more than this value is hard to allow the fine particles to contact the cathode (contact ring) and plating deposition is sometimes not carried out.

However, when the peripheral velocity of the treatment chamber is increased, the plating solution is subject to a force in the outer circumferential direction by the function of a centrifugal force so that the plating solution forms a vortex having a mortar-like shape inside the treatment chamber, gradually rises along the inner wall of the hollow cover, and is scattered from the opening of the hollow cover. As a result, the problem arises in it that the fine particles flow out (overflow) from the treatment chamber together with the scattered plating solution. In addition, if the amount of the liquid within the treatment chamber is reduced so as to prevent the overflow, the area in which the electrode in contact with the plating solution is reduced, with the result that the current density is reduced and further the formation of a vortex causes the electrode to be exposed, resulting in no contact with the plating solution and no current flow.

Because of these problems, it have been impossible to actually carry out plating on fine particles of not more than 100 $\mu$m.

Moreover, with respect to the pore size of the porous member, those pore sizes not allowing a plating solution to pass there through have been adopted, and several kinds of porous members have been used in accordance with the particle size of the fine particles.

However, since these porous members are filter-shaped porous members made of plastics or ceramics having communicating bubbles, the pore sizes within the porous members have considerably much variation. For this reason, at portions where the pore sizes of the porous members are the same as or greater than the particle size of the fine particles, clogging and particle losses occur at the time of passage of the particles. Moreover, when a porous member of not more than 20 $\mu$m is used, the resistance at the time of the passage of the plating solution through the porous member becomes greater, as a result that the amount of passage of the plating solution through the porous member is remarkably reduced. When clogging occurs in this state, the plating solution within the treatment chamber is hardly circulated and/or updated, with the result that problems such as a liquid temperature rise within the treatment chamber and variations in the composition of the plating solution occur, causing serious adverse effects on the quality of the plating layer.

Moreover, in the case of these prior art manufacturing devices for conductive fine particles, it has been confirmed that, when electroplating is carried out on fine particles of approximately not more than 100 $\mu$m, aggregation occurs as the electroplating progresses, and there is a limit in efficiently carrying out electroplating on each of the fine particles.

In prior art manufacturing methods for conductive fine particles, an electric current is applied and electroplating is carried out in a state where the fine particles is being pressed against the contact ring (cathode) by the function of a centrifugal force due to rotation of the treatment chamber. Here, at the time of stoppage of the power application, the rotation is also stopped, with the result that the fine particles are dragged by gravity and the flow of the plating solution due to inertia, made to drop on the flat surface of the central portion of the bottom plate, and mixed. When the treatment chamber is rotated next time, they are pressed against the contact ring in a different attitude while being mixed, and subjected to electroplating. By using this repeated cycle of rotation and stoppage, an attempt is made to form a plating layer having a uniform thickness on each of the fine particles contained in the treatment chamber.

However, in this conventional manufacturing method for conductive fine particles, the following problems arise.

In the conventional manufacturing method for conductive fine particles, a given time is provided from the start of rotation of the treatment chamber to the start of the application of power, and during this time, the fine particles are shifted to the contact ring (cathode) (hereinafter, this time is referred to as "particle shifting time"). Next, the power application is started while the treatment chamber is being rotated at a constant speed, an electric current is applied to the fine-particle lumps contacting the contact ring, so that a plating coat film is deposited (hereinafter, this time is referred to as "power application time"). Further, at the time of the stoppage of the power application, the rotation speed of the treatment chamber is reduced gradually in a predetermined time (hereinafter, this time is referred to as "speed reduction time") so that the treatment chamber is temporarily stopped (hereinafter, this time is referred to as "stoppage time"). The process is repeated with this cycle as one cycle.

In this case, in order to improve the efficiency of plating, it is necessary to set the power application time longer or to increase the current density at the time of power application.

However, since the fine particles are allowed to contact the contact ring (cathode) in a state of aggregated fine-particle lumps, when a plating coat film is deposited in this state by applying power for a long time, some particles are subjected to plating in the aggregated state, as a result to occur a problem of aggregation lumps. In other words, in order to prevent the occurrence of aggregation lumps, the power application time cannot be set much longer.

Moreover, when the current density is increased higher, the amount of deposition of the plating coat film becomes too high within the power application time in one cycle, as a result to occur in a problem of aggregation lumps. This is presumedly because the too much amount of deposition of the plating coat film in one cycle causes a deposition of a thick plating coat film covering the surface of aggregated fine-particle lumps, thus, it is not possible to break the plating coat film covering the surface of fine-particle lumps by using only a stirring force at the time of the stoppage of the treatment chamber, and another plating coat film is again deposited on the surface thereof at the next power application.

Furthermore, the following problems arise in the prior art manufacturing methods for conductive fine particles. In the case when plating is carried out on fine particles having a small specific gravity, since there is little difference between their specific gravity and the specific gravity of the plating solution, there is a delay in their approach to the contact ring, and when power is applied before they have completely approached the contact ring, the conductive base layer tends to melt down due to the bipolar phenomenon. The bipolar phenomenon refers to a phenomenon in which in the case when contact force between the plating target and the cathode is weak, or in the case when power is applied before the plating target has contacted the cathode, the plating target itself is subjected to polarization, and the coat film melts down from portions getting positively charged.

In particular, in the case of fine particles to which electric conductivity is imparted by forming a conductive base layer of angstroms on the surface of the non-conductive fine particles, such as organic resin fine particles and inorganic fine particles, by using the electroless plating method, etc., when the bipolar phenomenon occurs, the conductive base layer melts down and the fine particle surface loses its conductivity, failing to carry out electroplating.

Moreover, in the case when the power application time is too short, since the application of power is started before all the fine particles have approached the contact ring, the bipolar phenomenon occurs, failing to carry out electroplating. In contrast, when the power application is too long, the ratio of the power application time within one cycle becomes smaller, resulting in degradation in the efficiency.

Here, anisotropic conductive adhesives have been widely used so as to electrically connect small-size parts such as semiconductor elements to a substrate, or to electrically connect substrates with each other, in the field of electronics products such as liquid crystal displays, personnel computers and portable communication devices.

With respect to these anisotropic conductive adhesives, binder resins in which conductive fine particles are blended have been widely used. With respect to such conductive fine particles, those particles made by applying metal plating onto the outer surface of organic base particles or inorganic base particles have been widely used. With respect to these conductive fine particles, various techniques have been disclosed, for example, by Japanese Kokoku Publications Hei-6-9677, Japanese Kokai Publication Hei-4-36902, Hei-4-269720 and Hei-3-257710.

Moreover, with respect to anisotropic conductive adhesives in which these conductive fine particles are blended in binder resins so as to form films and paste, various techniques have been disclosed by for example, Japanese Kokai Publications Sho-63-231889, Hei-4-259766, Hei-2-291807, and Hei-5-75250.

In anisotropic conductive adhesives based on these techniques, those adhesives that use conductive fine particles comprising a conductive layer on an electric insulating material by electroless plating have been widely adopted. However, the conductive layer formed by electroless plating generally cannot be made thicker, resulting in a problem of little current capacity at the time of connection.

For this reason, in an attempt to ensure the conductivity and to increase the current capacity at the time of connection, plating by noble metal has been adopted, however, since it is difficult to directly plate the noble metal on an insulating material, a method in which base metal such as nickel is first plated by electroless plating, and noble metal is then substitute-plated has been adopted. In the substitution reaction in this case, the surface of the base metal layer is not completely substituted, and a part of the base metal remains, therefore there is a possibility that this part gradually deteriorates, failing to provide sufficient reliability.

In particular, in recent years, miniaturization has been achieved in electronic apparatuses and electronic parts, with the result that wiring for substrates, etc., becomes finer and reliability in connecting sections has been demanded acutely. Moreover, with respect to elements to be adopted for plasma displays that have been developed recently, since these elements are of the large-current driven type, anisotropic conductive adhesives which are suitable for large electric currents have been demanded. In order to solve the problem with current capacity, there is another method to increase the concentration of the conductive fine particles, however, an increased concentration causes another problem of the possibility of leakage between electrodes.

Meanwhile, electronic circuit elements, such as semiconductor elements, quartz oscillators, and photoelectric transfer elements, are connected to an electronic circuit substrate to form an electric circuit part, thus, these are utilized in various forms in the field of electronics. Various techniques have been developed with respect to connection of these electronic circuit elements to electronic circuit substrates.

Japanese Kokai Publication Hei-9-293753 has disclosed a technique in which a conductive ball is used in order to improve the connecting property of an electronic circuit element and an electronic circuit substrate without applying any specific additional process to the respective electrode sections. However, this technique fails to solve the following various problems systematically.

Japanese Kokai Publication Hei-9-213741 discloses a semiconductor device wherein a semiconductor chip and an organic printed wiring substrate are connected with each other by solder and the entire surface, etc. of the connected section is coated with an insulating organic sealing material. However, this technique requires time-consuming tasks, and also fails to solve various problems with connecting sections systematically.

Upon manufacturing an electronic circuit part by connecting electronic circuit elements to an electronic circuit substrate, various problems arise due to the connecting property of the connecting section, and various techniques have been used so as to solve these problems.

Here, these prior art techniques are collectively described as follows by exemplifying a case in which an IC bear chip as a semiconductor element is connected to an electronic circuit substrate.

(1) Wire Bonding Method

Peripheral electrodes of the IC chip and the electronic circuit substrate are heated and press-bonded by using thin wires of gold or copper so as to connect to each other. This wire bonding method has an advantage in that wire connection is made without applying any processing to aluminum electrodes in the IC chips, however, in contrast, it has disadvantages in that the connecting pitch is not made smaller and in that the connecting section becomes bulky.

(2) Flip Chip Bonding Method by Using Solder Bumps (for Example, Japanese Kokai Publication Hei-9-246319)

Solder bumps are formed on the electrode sections of the IC bear chip, and are superposed on the electrode sections of the electronic circuit substrate, and heated so that connection is formed by molten solder (FIG. 36). The formation of solder bumps is made by a method in which after forming a multi-layer metal barrier layer on the aluminum electrodes of the IC chip, solder plating is carried out and then heated, or in which solder balls are placed on the electrode sections, and then heated.

The flip chip bonding method by solder bumps has an advantage in that positioning between the electrodes is easily carried out because of the self-alignment effect of the solder. In contrast, problems arise in it that a multi-layer metal barrier layer has to be formed on the aluminum electrodes of the IC chip, that the gap cannot be maintained constant due to molten solder bump sections, and that the solder bump sections are subjected to "shearing deformation" exerted by the difference in the thermal expansion coefficient between the IC bear chip and the electronic circuit substrate, with the result that cracks tend to occur in the connected section between the solder bump sections and the substrate electrode sections, resulting in degradation in the connecting reliability.

(3) Flip Chip Bonding Method by Using a Solder Coat Ball Having a Highly Rigid Core (for Example, Japanese Kokai Publications Hei-9-293753, Hei-9-293754, Hei-5-243332), Hei-7-212017)

For example, balls coated coating copper core with solder are placed on the electrode sections on an IC chip, and then heated so that the solder coat balls are secured to the electrode sections on the IC chip; then, the secured solder coat balls are superposed on the electrode sections of an electronic circuit substrate, and then again heated so as to make connection (FIG. 47). In the same manner as (2), in this method also, "shearing deformation" is exerted due to the difference in the thermal expansion coefficient between the IC bear chip and the electronic circuit substrate, with the result that cracks tend to occur in the connected sections between the solder coat balls and the substrate electrode sections, resulting in degradation in the connecting reliability.

(4) Flip Chip Bonding Method by the Bump Transfer Method

A gold bump formed on a bump forming substrate is transferred and placed on a lead portion of a tin- or gold-plated film carrier formed by thermal press bonding at the first stage, and next, after an IC chip has been superposed thereon, the second srage thermal press bonding is carried out (FIG. 48). This method has an advantage in that the formation of metal barrier layer is not required on the aluminum electrodes on the IC chip. In contrast, a particularly high pressure needs to be applied at the second stage thermal press bonding, resulting in a possibility of damage to the IC chip performance.

(5) Flip Chip Bonding Method by Using Bumps Comprising Conductive Resin

A conductive resin comprising silver powder and an epoxy-based adhesive is formed into a bump shape with a thickness of approximately 10 $\mu$m by a screen printing method on the electrode sections of an IC bear chip, and this is heated to be cured, and after being superposed on the electrode sections of an electronic circuit substrate, connection is performed by using another conductive adhesive (FIG. 49). This method has advantages in that upon connection, no expensive materials are required while only a simple process is used. In contrast, problems arise in that special electrodes, made of nickel/palladium, etc., have to be added to the aluminum electrodes of the IC chip, and in that the bump section is susceptible to plastic deformation, with the result that the connection reliability may deteriorate.

(6) Flip Chip Bonding Method by an Anisotropic Conductive Adhesive

Metal fine particles of approximately 5 $\mu$m, or conductive fine particles applying metal plating to resin core fine particles, are blended with a thermoplastic or thermosetting adhering resin to form a liquid or a film-shaped anisotropic conductive adhesive, and by using this anisotropic conductive adhesive, gold bump sections formed on the aluminum electrodes of an IC chip and the electrode sections of an electronic circuit substrate are joined to each other by thermal press bonding (FIG. 50). This method has an advantage in that upon joining, no reinforcing seal resin, which is required in the above-mentioned (1) to (5), for filling the gap between the IC chip and the electronic circuit substrate is required. In contrast, because of the necessity of installing the gold bump, problems arise in that the conductive fine particles enter the gap section other than the gap between the IC chip and the electrode sections of the electronic circuit substrate, resulting in a reduction in the insulating resistivity between adjacent electrodes and the subsequent possibility of a short circuit between the electrodes.

In order to solve the above-mentioned problems with the prior art techniques (1) to (6), the following devises are proposed:

In the wire bonding method (1) and the flip chip bonding method by using solder bumps (2), in order to solve the problem of the difficulty in high-density packaging with pitches of not more than 100 $\mu$m, an attempt is required to join an IC chip with high density wiring to an electronic circuit substrate.

In the flip chip bonding method by solder bumps (2) and the flip chip bonding method by using a solder coat ball having a highly rigid core (3), in order to solve the problems in which shearing deformation is exerted due to the difference in the thermal expansion coefficient between the IC chip and the electronic circuit substrate with the result that cracks tend to occur in the connected sections between the solder bumps or the solder coat balls and the substrate electrode sections, resulting in degradation in the connecting reliability, and in order to solve the problem in which, in the flip chip bonding method by bumps made of conductive resin (5), the bump section is susceptible to plastic deformation with the result that the connection reliability may deteriorate, an attempt is required to improve the connection reliability in the electronic circuit parts comprising IC chips and electronic circuit substrates.

In the filp chip bonding method by the use of the bump transfer method (4), in order to solve the problem in which a particularly high pressure needs to be applied at the second stage thermal press bonding, resulting in a possibility of damage to the IC chip performance, an attempt is required to eliminate the need for applying a high pressure in the attaching process between the IC chip and the electronic circuit substrate.

In the flip chip bonding method by an anisotropic conductive adhesive (6), in order to solve the problem in which the conductive fine particles enter the gap section other than the gap of the electrode sections with the result that the insulating resistivity between the adjacent electrodes is reduced, an attempt is required to prevent the reduction in the insulating resistivity between the adjacent electrodes of the IC chip and electronic circuit substrate.

In order to solve the problems with the prior art, attempts have been required to solve all the above-mentioned problems.

SUMMARY OF THE INVENTION

In the light of the above-mentioned problem, the present invention has its object to provide a manufacturing device for conductive fine particles which can carry out a plating process efficiently and can form a uniform plating layer on fine particles of not more than 100 $\mu$m.

Moreover, another objective of the present invention is to provide a manufacturing device for conductive fine particles which can prevent aggregation of conductive fine particles and can form an electroplating layer uniformly on the surface of each of the conductive fine particles.

Furthermore, still another objective of the present invention is to provide a manufacturing method for conductive fine particles which can form a plating layer having a uniform thickness on each of the fine particles efficiently without causing aggregation of the fine particles in a plating solution.

Still another objective of the present invention is to provide an anisotropic conductive adhesive and a conductive connecting element which have a low connecting resistance, have a large current capacity upon connection, have high connecting reliability and is free from leakage, and also to provide conductive fine particles used for such purposes.

The other objective of the present invention is to provide an electronic circuit part which can systematically eliminate malconnection, etc. between an electronic circuit element and an electronic circuit substrate resulting from various reasons, and an electronic circuit element, an electronic circuit substrate and conductive fine particles used for such an electronic circuit part, as well as a manufacturing method for such an electronic circuit part.

The present invention 1 provides a manufacturing device for conductive fine particles which comprises: a disk-shaped bottom plate secured to the upper end of a perpendicular driving shaft; a porous member that is placed on the outer circumferential upper face of the bottom plate and that allows only a plating solution to pass there through; a contact ring for conducting electricity placed on the upper face of the porous member; a hollow cover of a trapezoidal cone shape having an opening on its upper center portion, to the upper end of which a hollow cylinder having the same pore diameter as the opening diameter is joined, with the upper end of the hollow cylinder being bent toward the inner wall side of the hollow cylinder; a rotatable treatment chamber formed in a manner so as to sandwich the porous member and the contact ring between the outer circumferential portion of the hollow cover and the bottom plate; a supply tube for supplying the plating the solution to the treatment chamber through the opening; a container for receiving plating solution scattered from the pores of the porous member; a drain tube for draining the plating solution accumulated in the container, and an electrode inserted through the opening to contact the plating solution.

The present invention 2 provides a manufacturing device for conductive fine particles which comprises: a disk-shaped bottom plate secured to the upper end of a perpendicular driving shaft; a porous member that is placed on the outer circumferential upper face of the bottom plate and that comprises a plate-shaped porous support and a sheet-shaped filter, affixed on inner side face thereof, having a thickness of 10 to 1000 $\mu$m with a pore size allowing only a plating solution to pass there through; a contact ring for conducting electricity placed on the upper face of the porous member; a hollow cover of a trapezoidal cone shape having an opening on its upper center portion, a rotatable treatment chamber formed in a manner so as to sandwich the porous member and the contact ring between the outer circumferential portion of the hollow cover and the bottom plate; a supply tube for supplying the plating solution to the treatment chamber through the opening; a container for receiving the plating solution scattered from the pores of the porous member; a drain tube for draining the plating solution accumulated in the container, and an electrode inserted through the opening to contact the plating solution.

The present invention 3 provides a manufacturing device for conductive fine particles having the same construction as the manufacturing device for conductive fine particles of the present invention 1 except that the porous member comprises a plate-shaped porous support and a sheet-shaped filter, affixed on inner side face thereof, having a thickness of 10 to 1000 $\mu$m with a pore size allowing only a plating solution to pass there through.

The present invention 4 provides a manufacturing device for conductive fine particles which comprises: a disk-shaped bottom plate secured to the upper end of a perpendicular driving shaft; a plate-shaped porous member that allows only a plating solution to pass there through and that is placed on the upper face of the bottom plate; a contact ring for conducting electricity placed on the upper face of the porous member; a hollow cover of a trapezoidal cone shape having an opening on its upper center portion; a rotatable treatment chamber formed in a manner so as to sandwich the porous member and the contact ring between the outer circumferential portion of the hollow cover and the bottom plate; a supply tube for supplying the plating solution to the treatment chamber through the opening; a container for the receiving plating solution scattered from the pores of the porous member; a drain tube for draining the plating solution accumulated in the container, and an electrode inserted through the opening to contact the plating solution.

The present invention 5 provides a manufacturing device for conductive fine particles which comprises: a disk-shaped bottom plate secured to the upper end of a perpendicular driving shaft; a plate-shaped porous member that allows only a plating solution to pass there through and that is placed on the upper face of the bottom plate; a contact ring for conducting electricity placed on the upper face of the porous member; a hollow cover of a trapezoidal cone shape having an opening on its upper center portion, to the upper end of which a hollow cylinder having the same pore diameter as the opening diameter is joined, with the upper end of the hollow cylinder being bent toward the inner wall side of the hollow cylinder; a rotatable treatment chamber formed in a manner so as to sandwich the porous member and the contact ring between the outer circumferential portion of the hollow cover and the bottom plate; a supply tube for supplying the plating solution to the treatment chamber through the opening; a container for receiving the plating solution scattered from the pores of the porous member; a drain tube for draining the plating solution accumulated in the container, and an electrode inserted through the opening to contact the plating solution.

The present invention 6 provides a manufacturing device for conductive fine particles having the same construction as the manufacturing device for conductive fine particles of the present invention 4 or 5 except that the porous member comprises a plate-shaped porous support and a sheet-shaped filter, affixed on upper face thereof, having a thickness of 10 to 1000 $\mu$m with a pore size allowing only a plating solution to pass there through.

The present invention 7 provides a manufacturing method for conductive fine particles which comprises a plating process providing an electroplating layer on the surface of each of the fine particles, and a process of applying at least one kind of force selected from the group consisting of a shearing force, an impact force and cavitation in order to disperse, pulverize and divide into individual particles, aggregated lumps of fine particles formed during the plating process.

The present invention 8 provides a manufacturing method for conductive fine particles which comprises a plating process for making the fine particles collide with a cathode by a centrifugal force in a plating bath having the cathode and an anode to form an electroplating layer on the surface of each of the fine particles, and a process of applying at least one kind of force selected from the group consisting of a shearing force, an impact force and cavitation in order to disperse, pulverize and divide into individual particles, aggregated lumps of fine particles formed during the plating process.

The present invention 9 provides a manufacturing method for conductive fine particles, which comprises loading pretreated fine particles into a treatment chamber, and carrying out a plating process by allowing the treatment chamber to rotate centered on its rotation axis while supplying a plating solution into the treatment chamber to form an electroplating layer on each of the fine particles, and a step of applying at least one kind of force selected from the group consisting of a shearing force, an impact force and cavitation in order to disperse, pulverize and divide into individual particles, aggregated lumps of fine particles formed during the plating process, wherein the plating process is performed with use of an electroplating device comprising: a disk-shaped bottom plate secured to the upper end of a perpendicular driving shaft; a porous member that is placed on the outer circumferential upper face of the bottom plate and that allows only a plating solution to pass there through; a contact ring for conducting electricity placed on the upper face of the porous member; a hollow cover of a trapezoidal cone shape having an opening on its upper center portion, to the upper end of which a hollow cylinder having the same pore diameter as the opening diameter is joined, with the upper end of the hollow cylinder being bent toward the inner wall side of the hollow cylinder; a rotatable treatment chamber formed in a manner so as to sandwich the porous member and the contact ring between the outer circumferential portion of the hollow cover and the bottom plate; a supply tube for supplying the plating solution to the treatment chamber through the opening; a container for receiving the plating solution scattered from the pores of the porous member; a drain tube for draining the plating solution accumulated in the container, and an electrode inserted through the opening to contact the plating solution.

The present invention 10 provides a manufacturing device for conductive fine particles used for carrying out the manufacturing method for conductive fine particles of the present inventions 7, 8 and 9.

The present invention 11 provides a manufacturing method for conductive fine particles which comprises: a disk-shaped bottom plate secured to the upper end of a perpendicular driving shaft; a porous member that is placed on the outer circumferential upper face of the bottom plate and that allows only a plating solution to pass there through; a contact ring for conducting electricity placed on the upper face of the porous member; a hollow cover having an opening on its upper center portion; a rotatable plating vessel formed in a manner so as to sandwich the porous member and the contact ring between the outer circumferential portion of the hollow cover and the bottom plate; a treatment chamber, placed inside the plating vessel, that is formed by a partition plate allowing only a plating solution to pass there through, and that includes the inside face of the contact ring; a supply tube for supplying the plating solution to the plating vessel through the opening; a container for receiving the plating solution scattered from the pores of the porous member; a drain tube for draining the plating solution accumulated in the container, and an electrode inserted through the opening to contact the plating solution.

The present invention 12 provides a manufacturing method for conductive fine particles for forming a plating layer on the surface of each of the fine particles by a plating process, which comprises a power application process for applying power with the fine particles contacting the cathode to form a plating layer on the surface of each of the fine particles and a stirring process for stirring the fine particles, wherein said plating process is performed with use of a manufacturing device for conductive fine particles that comprising; a rotatable treatment chamber that has a cathode on its side face and a filter section allowing the plating solution to pass there through and to drain it; and an anode placed in the treatment chamber so as not to contact the cathode, is carried out by repeating rotation and stoppage of the treatment chamber.

The present invention 13 provides a manufacturing method for conductive fine particles for forming an electroplating layer on the surface of each of the fine particles by a plating process, wherein the plating process, using a manufacturing device for conductive fine particles comprising a rotatable treatment chamber having a cathode on its side face and a filter section passing the plating solution to drain it, and an anode placed in the treatment chamber so as not to contact the cathode, comprises steps of applying power with the fine particles being made contact with the cathode by the effect of a centrifugal force caused by the rotation of the treatment chamber to form an electroplating layer on the surface of each of the fine particles, and stopping the rotation of the treatment chamber and the application of power, further repeating the rotation and stoppage of the treatment chamber, and wherein the difference in gravity between the fine particles and the plating solution is set in the range of 0.04 to 22.00.

The present invention 14 provides a manufacturing method for conductive fine particles for forming an electroplating layer on the surface of each of the fine particles by a plating process, wherein the plating process, using a manufacturing device for conductive fine particles that comprises; a rotatable treatment chamber that has a cathode on its side face and a filter section allowing the plating solution to pass there through and to drain it; and an anode placed in the treatment chamber so as not to contact the cathode, comprises the steps of applying power with the fine particles being made contact with the cathode by the effect of a centrifugal force caused by the rotation of the treatment chamber, so as to form an electroplating layer on the surface of each of the fine particles, and stopping the rotation of the treatment chamber and the application of power, and repeating the rotation and stoppage of the treatment chamber, wherein the rotation of the treatment chamber is carried out with the number of revolutions so as to set the centrifugal effect at 2.0 to 40.0, the power application is started 0.5 to 10 seconds after the start of the rotation of the treatment chamber, and the time of stoppage of the treatment chamber is set to 0 to 10 seconds.

The present invention 16 provides conductive fine particle, which is subjected to electroplating on the outer surface thereof, wherein a particle size thereof is 0.5 to 500 $\mu$m, an aspect ratio of less than 1.5 and a variation coefficient of not more than 50%, and an anisotropic conductive adhesive and a conductive connecting element that use such conductive fine particles.

The present invention 17 provides an electronic circuit part which is formed by electrically connecting an electrode section of an electronic circuit element and an electrode section of an electronic circuit substrate, wherein the connection is formed by using a laminated conductive fine particle provided with a conductive metal layer on the surface of a spherical elastic base particle, and the electrical connection is formed by a plurality of the laminated conductive fine particles per each connecting section at connecting sections between the electrode section of the electronic circuit element and the electrode section of the electronic circuit substrate.

BRIEF DESCRIPTIONS OF THE DRAWINGS

FIG. 29 is a time chart showing operation conditions of Example 29.

FIG. 30 is a time chart showing operation conditions of Example 30.

FIG. 33 is a time chart showing operation conditions of Example 33.

FIG. 34 is a time chart showing operation conditions of Comparative Example 14.

Figure 1:
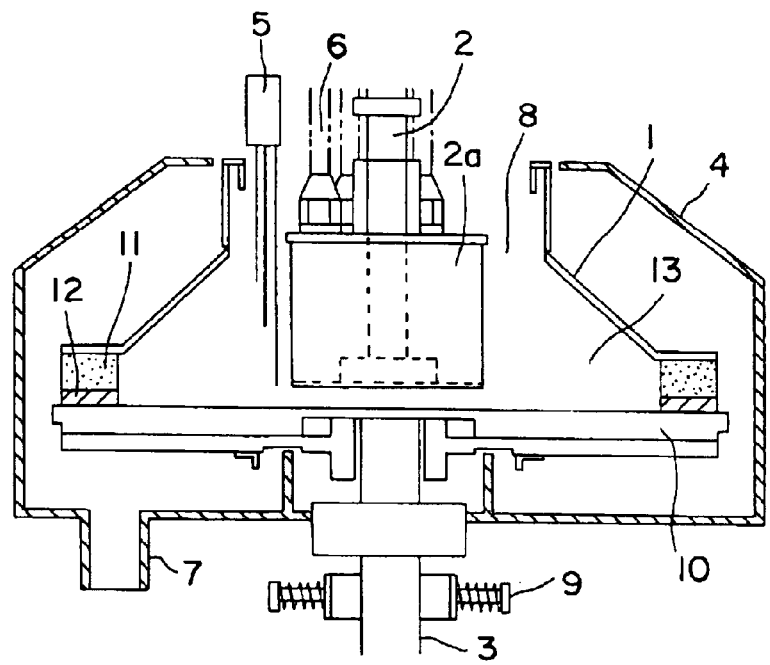
FIG. 1 is a schematic cross-sectional view that shows a manufacturing device for conductive fine particles of the present invention.

EXPLANATION OF REFERENCE NUMERALS 1 hollow cover
2 electrode
2a anode
3 driving shaft
4 container
5 level sensor
6 supply tube 7 drain tube
8 opening
9 contact brush
10 bottom plate
11 contact ring
12 ring-shaped porous member
13 treatment chamber
14 hollow cover sealing lid
15 packing
16 anode side contact brush
17 universal joint
18 air drawing valve
19 ring-shaped porous support
20 sheet-shaped filter
21 plate-shaped porous member
22 plate-shaped porous support
214 container
215 suspension of plating solution and fine particles
216 pump
217 pressure gage
218 chamber
219 heat exchanger
220 plating solution receiving vessel
221 fine particle drawing tube
222 ground fine particle supply tube
223 fine particle circulating pump
224 plating solution circulating pump
225 pipeline homomixer
226 static mixer
227 ultrasonic generator
228 pure water
229 glass container
230 ground particle transporting pump
331 plated fine particle drawing pump
313 plating vessel
314 partition plate
315 treatment chamber
316 filter sheet
317 porous support
111 base particle
122 conductive metal layer
333 low melting point metal layer
444 conductive fine particles
555 electrode section
666 electronic circuit element
777 electrode section
888 electronic circuit substrate
999 low melting point metal
510 under fill

DETAILED DESCRIPTION OF THE INVENTION

Referring to Figures, the following description will discuss embodiments of the manufacturing device for conductive fine particles of the present invention in detail.

FIG. 1 shows one embodiment of a manufacturing device for conductive fine particles of the present invention.

The manufacturing device for conductive fine particles of the present invention 1 comprises: a disk-shaped bottom plate 10 secured to the upper end of a perpendicular driving shaft; a porous member 12 that is placed on the outer circumferential upper face of the bottom plate 10 and that allows only a plating solution to pass there through; a contact ring 11 for conducting electricity placed on the upper face of the porous member; a hollow cover 1 of a trapezoidal cone shape having an opening 8 on its upper center portion, to the upper end of which a hollow cylinder having the same pore diameter as the opening diameter is joined, with the upper end of the hollow cylinder being bent toward the inner wall side of the hollow cylinder; a rotatable treatment chamber 13 formed in a manner so as to sandwich the porous member 12 and the contact ring 11 between the outer circumferential portion of the hollow cover 1 and the bottom plate 10; a supply tube 6 for supplying the plating solution to the treatment chamber 13 through the opening 8; a container 4; for receiving the plating solution scattered from the pores of the porous member 12; a drain tube 7 for draining the plating solution accumulated in the container 4, and an electrode 2 that is inserted through the opening 8 to contact the plating solution.

The above-mentioned porous member 12 has a ring shape, and is a filter-shaped porous member having communicating bubbles comprising plastics or ceramics. Those members, which have a pore size allowing a liquid such as a plating solution to pass there through but not allowing fine particles and conductive fine particles obtained to pass there through, are adopted.

The plating solution, subjected to a centrifugal force by the rotation of the driving shaft 3, is allowed to pass the porous member 12, and scattered into the plastic container 4, with the result that the liquid level of the plating solution inside the treatment chamber 13 drops, therefore, in order to compensate for the reduction, the amount of the liquid is monitored by a level sensor 5 so that the plating solution is supplied to the treatment chamber 13 from the supply tube 6 for supplying the plating solution through the opening 8 and the liquid level inside the treatment chamber 13 is always made to contact an electrode 2a. In FIG. 1, reference numeral 2 represents a positive electrode that is connected to the anode 2a. Reference numeral 9 is a contact brush. Here, a power supply used for the electrodes is not shown in the Figure.

In the present invention 1, the plating solution is supplied to the treatment chamber 13 from the plating solution supply tube 6, and fine particles having a conductive base layer formed thereon are charged into the treatment chamber 13 through the opening 8 of the hollow cover 1, and dispersed therein. With respect to the formation of the conductive base layer, electroless plating is preferably adopted; however, not limited by this, other known conductivity-applying methods may be adopted. Upon introducing the fine particles into the treatment chamber 13, the driving shaft 3 is allowed to rotate. Since the plating solution passes through the porous member 12 and goes out of the treatment chamber 13 while being subjected to the rotation of the driving shaft 3, the plating solution supply tube 6 compensates for the amount of the reduction. Other plating conditions are not particularly distinct from general plating operations.

In order to form a more uniform plating layer, it is preferable to reverse in its rotation direction or to stop the rotation of the driving shaft 3 in each predetermined time.

Figure 3:
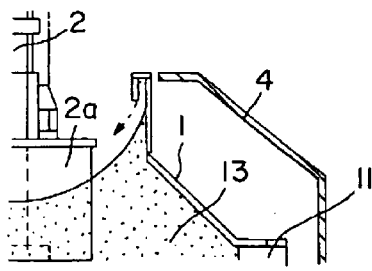
FIG. 3 is a schematic enlarged view that shows a hollow cover in one embodiment of the manufacturing device for conductive fine particles of the present invention.

In the manufacturing device for conductive fine particles of the present invention 1, the hollow cover 1 has a shape in which, to the upper end of the cover having a trapezoidal cone shape with the opening 8 on its upper center portion, a hollow cylinder having the same pore diameter as the opening diameter is joined, with the upper end of the hollow cylinder being bent toward the inner wall side of the hollow cylinder; therefore, even if, by increasing the number of revolutions of the driving shaft 3 to increase the peripheral velocity of the treatment chamber 13, the plating solution, subjected to a force in the outer circumferential direction by the effect of a centrifugal force by the rotation, forms a vortex having a mortar-like shape and gradually rises along the inner wall of the cover 1 in the treatment chamber as illustrated in FIG. 3, there is no possibility of overflow. Moreover, even if the peripheral velocity further increases, and the solution rises to the upper end of the cover, there is no possibility of scattering of the solution outside the hollow cover 1. Therefore, in the manufacturing device for conductive fine particles of the present invention 1, in the case when the fine particles having the conductive base layer formed thereon have a particle size of not more than 100 μm, the peripheral velocity of the treatment chamber 13 can be increased to a sufficient velocity so as to form a uniform plating layer.

Figure 4:
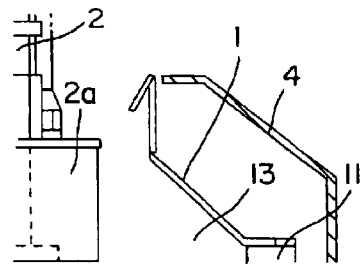
FIG. 4 is a schematic enlarged view that shows a hollow cover in one embodiment of the manufacturing device for conductive fine particles of the present invention.
Figure 5:
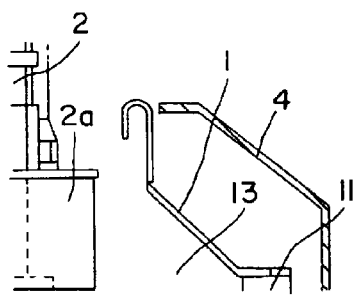
FIG. 5 is a schematic enlarged view that shows a hollow cover in one embodiment of the manufacturing device for conductive fine particles of the present invention.
Figure 6:
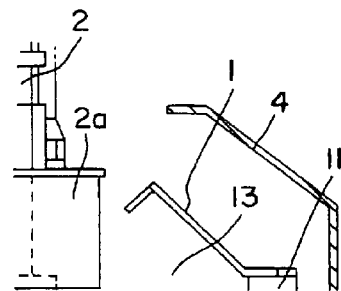
FIG. 6 is a schematic enlarged view that shows a hollow cover in one embodiment of the manufacturing device for conductive fine particles of the present invention.
Figure 7:
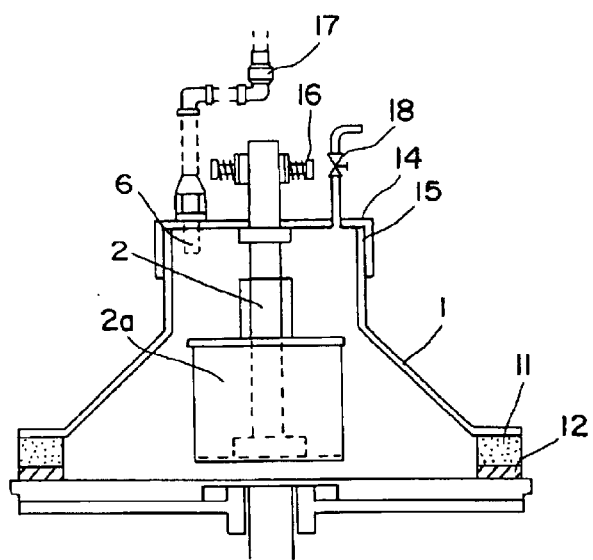
FIG. 7 is a schematic cross-sectional view that shows a treatment chamber sealing type in one embodiment of the manufacturing device for conductive fine particles of the present invention.

The upper end of the hollow cover 1 may be formed into any shape as long as it prevents the plating solution from overflowing the treatment chamber; for example, shapes shown in FIGS. 4, 5 and 6 may be adopted. Moreover, as illustrated in FIG. 7, a lid 14 for sealing the hollow cover, attached to the electrode 2, and the hollow cover 1 may seal the treatment chamber 13 while allowing the treatment chamber 13 and the electrode 2 to freely rotate. In this case, it does not have to considered to control the liquid level by the use of a liquid level gage.

The manufacturing device for conductive fine particles of the present invention 2 has the same construction as that of the manufacturing device for conductive fine particles of the present invention 1, except that a hollow cover has a trapezoidal cone shape with an opening on the upper center portion thereof and that a porous member comprises a plate-shaped porous support and a sheet-shaped filter, affixed on inner side face thereof, having a thickness of 10 to 1000 μm with a pore size allowing only a plating solution to pass there through.

In the present invention 2, by using such a porous member, it becomes possible to prevent clogging and overflow of particles without decreasing the amount of the liquid passage.

Figure 8:
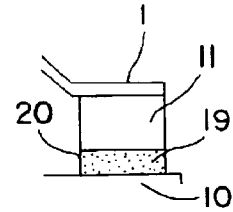
FIG. 8 is a schematic enlarged view of a porous member in one embodiment of the manufacturing device for conductive fine particles of the present invention.

FIG. 8 shows a cross-sectional structure of one embodiment of a porous member used in the present invention 2. The porous member used in this embodiment comprises affixing a sheet-shaped filter 20 having a thickness of 10 to 1000 μm with a pore size that allows only a plating solution to pass there through onto the inner side surface of a ring-shaped porous support 19. The filter 20 may be affixed onto only the inner side surface of the ring-shaped porous support 19, however it is preferable to affixed onto the upper surface and lower surface of the ring-shaped porous support 19 in an extended wrapping manner to be sandwiched by the contact ring 11 and the base plate 10.

The material of the ring-shaped porous support 19 is not particularly limited; and for example, polypropylene, polyethylene, ceramics, etc. are used.

The pore size of the ring-shaped porous support 19 is not related to the particle size of the fine particles to be loaded into the treatment chamber 13, and it only requires to have a sufficient strength to form the treatment chamber, and set in the range of 50 to 600 μm, and more preferably, 70 to 300 μm.

The material of the sheet-shaped filter 20 is not particularly limited; and for example, nylon 66, nonwoven fabric of polyester, Teflon, etc. are used.

The pore size of the sheet-shaped filter 20 is appropriately selected according to the particle size of the fine particles, thus plating objects. Moreover, a plurality of filters may be overlapped to adjust the amount of passage.

The manufacturing device for conductive fine particles of the present invention 3 has the same construction as that of the manufacturing device for conductive fine particles of the present invention 1, except that the porous member comprises a plate-shaped porous support and a sheet-shaped filter, affixed on upper face thereof, having a thickness of 10 to 1000 μm with a pore size allowing only a plating solution to pass there through. In other words, the manufacturing device for conductive fine particles of the present invention 3 comprises both a hollow cover with its upper end being bent toward the inner side wall side of the hollow cylinder, which forms a feature of the manufacturing method for conductive fine particles of the present invention 1, and the ring-shaped porous member comprising the ring-shaped porous support and the sheet-shaped filter according to the manufacturing device for conductive fine particles of the present invention 2.

The manufacturing device for conductive fine particles of the present invention 3 has such a construction that, when the peripheral velocity of the treatment chamber increases, and even when the plating solution, subjected to a force in the outer circumferential direction due to a centrifugal force by the rotation, forms a mortar-like-shaped vortex inside the treatment chamber and rises gradually along the inner wall of the cover, overflow and scattering the liquid outside the hollow cover do not occur, and it is possible to prevent clogging and overflow of particles without reducing the amount of liquid passage; therefore, it becomes possible to form a uniform plating layer efficiently, even in the case when the fine particles, each having a conductive base layer formed thereon, have a particle size of not more than 100 μm.

Figure 9:
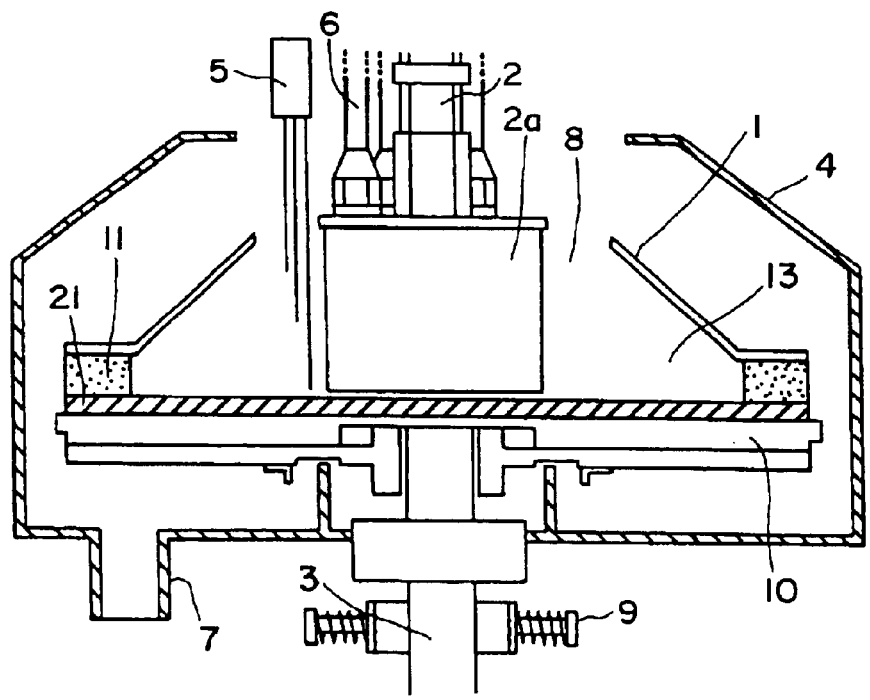
FIG. 9 is a schematic cross-sectional view that shows one embodiment of the manufacturing device for conductive fine particles in the present invention.

FIG. 9 shows one embodiment of a manufacturing device for conductive fine particles of the present invention 4.

The manufacturing device for conductive fine particles of the present invention 4 comprises a disk-shaped bottom plate 10 secured to the upper end of a perpendicular driving shaft; a plate-shaped porous member 21 that is placed on the upper face of the bottom plate 10 and that allows only a plating solution to pass there through; a contact ring 11 for conducting electricity placed on the upper face of the porous member 21; a hollow cover 1 of a trapezoidal cone shape having an opening 8 on its upper center portion; a rotatable treatment chamber 13 formed in a manner so as to sandwich the porous member 21 and the contact ring 11 between the outer circumferential portion of the hollow cover 1 and the bottom plate 10; a supply tube 6 for supplying the plating solution to the treatment chamber 13 through the opening 8; a container 4 for receiving the plating solution scattered from the pores of the porous member 21; a drain tube 7 for draining the plating solution accumulated in the container 4; and an electrode 2 that is inserted through the opening 8 to contact the plating solution.

The manufacturing device for conductive fine particles of the present invention 4 has the same construction as that of the manufacturing device for conductive fine particles of the present invention 1, except that the hollow cover of a trapezoidal cone shape having an opening on its upper center portion, and that the porous member has a plate shape.

In the manufacturing device for conductive fine particles comprising a ring-shaped porous member, in the case when plating is applied to fine particles having a particle size of not more than 100 μm, the fine particles are pressed onto the porous member filtering face due to the flow of liquid from the porous member, with the result that ring-shaped aggregated lumps may be produced. Here, the plate-shaped porous member has a wider cross-sectional area through which the plating solution passes as compared with the ring-shaped porous member. Accordingly, the manufacturing device for conductive fine particles of the present invention 4 makes the passage flow speed through the filtering face slower, thereby solving the problem of the production of ring-shaped aggregated lumps due to pressed fine particles on the porous member filtering face.

The manufacturing device for conductive fine particles of the present invention 5 has the same construction as the manufacturing device for conductive fine particles of the present invention 4, except that, to the upper end of the hollow cover of a trapezoidal cone shape having an opening on its upper center portion, a hollow cylinder having the same pore diameter as the opening diameter is joined, with the upper end of the hollow cylinder being bent toward the inner wall side of the hollow cylinder. In other words, the manufacturing device for conductive fine particles of the present invention 5 comprises the hollow cover with the upper end being bent toward the inner wall side of the hollow cylinder which features the manufacturing device for conductive fine particles of the present invention 1 and the plate-shaped porous member which features the manufacturing device for conductive fine particles of the present invention 4.

Figure 10:
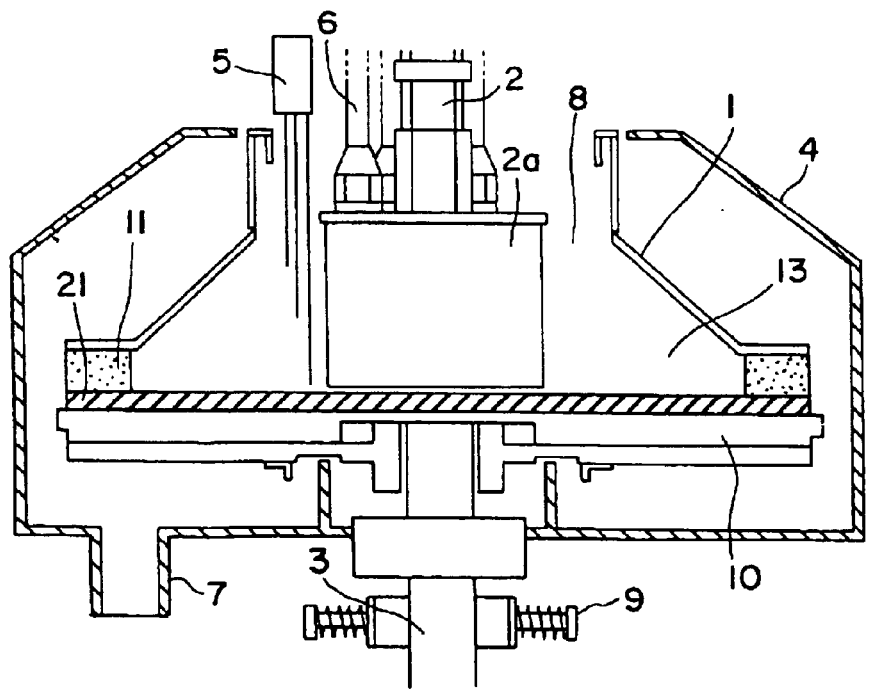
FIG. 10 is a schematic cross-sectional view that shows one embodiment of the manufacturing device for conductive fine particles in the present invention.

FIG. 10 shows one embodiment of the manufacturing device for conductive fine particles of the present invention 5.

Since the manufacturing device for conductive fine particles of the present invention 5 has such a construction that even in the case when the peripheral velocity of the treatment chamber increases and the plating solution, subjected to a force in the outer circumferential direction due to the effect of a centrifugal force by the rotation, forms a mortar-shaped vortex in the treatment chamber and rises gradually along the inner wall of the cover, overflow and scattering of the liquid outside the hollow cover do not occur; moreover, since the passage flow speed through the filtering face is slower, it becomes possible to solve the problem of the occurrence of ring-shaped aggregated lumps due to the pressed fine particles on the porous member filtering face.

The manufacturing device for conductive fine particles of the present invention 6 has the same construction as that of the manufacturing device for conductive fine particles of the present invention 4 or the manufacturing device for conductive fine particles of the present invention 5, except that the porous member comprises a disk-shaped porous support and a sheet-shaped filter, affixed on upper face thereof, having a thickness of 10 to 1000 $\mu$m with a pore size allowing only a plating solution to pass there through.

In the present invention 6, the application of this porous member makes it possible to effectively prevent clogging and overflow of particles without the need for reducing the amount of liquid passage.

Figure 11:
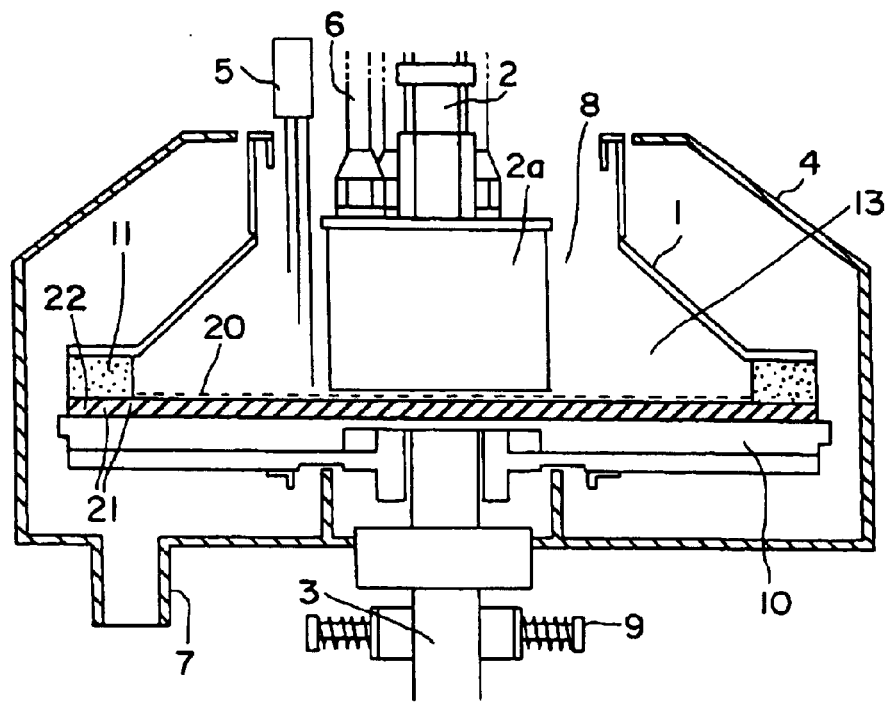
FIG. 11 is a schematic cross-sectional view that shows one embodiment of the manufacturing device for conductive fine particles in the present invention.

FIG. 11 shows one embodiment of the manufacturing device for conductive fine particles of the present invention 6.

The porous member used in this embodiment comprises a plate-shaped pore support 22 and a sheet-shaped filter 20, affixed on upper side face thereof, having a thickness of 10 to 1000 $\mu$m with a pore size allowing only a plating solution to pass there through. The plate-shaped porous support 22 is the same as the ring-shaped porous support 19 except its shape.

Figure 12:
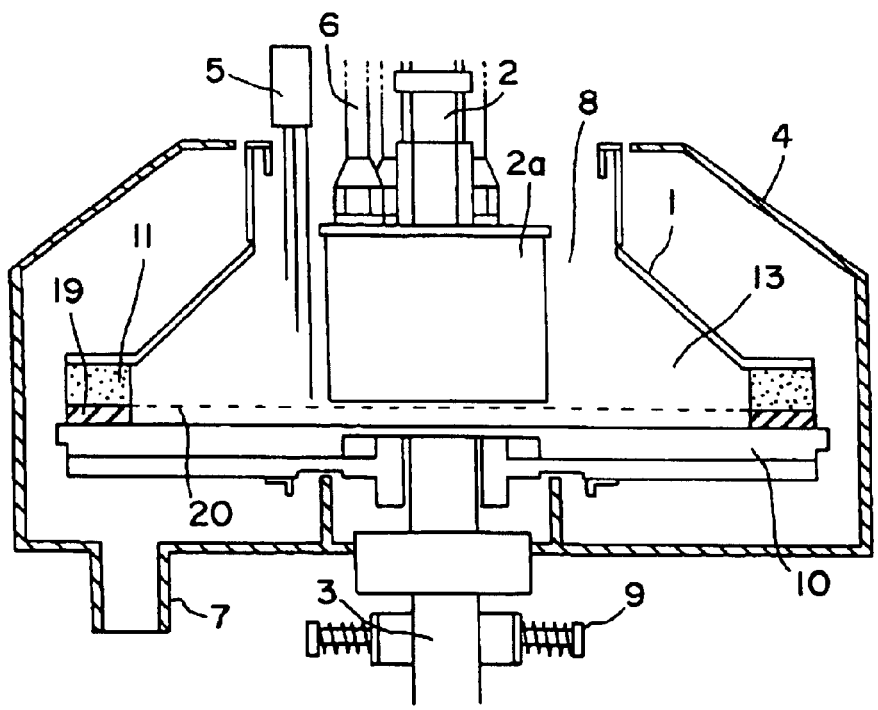
FIG. 12 is a schematic cross-sectional view that shows one embodiment of the manufacturing device for conductive fine particles in the present invention.

Moreover, with respect to another embodiment of the manufacturing device for conductive fine particles of the present invention 6, as illustrated in FIG. 12, between the ring-shaped porous support 19 placed on the upper face, outer circumferential portion of the bottom plate 10 and the contact ring 11, a sheet-shaped filter 20 may be placed so as to allow the entire bottom face of the treatment chamber 13 to form a filtering face, thereby forming a structure in which the inside of the treatment chamber 13 is divided by the sheet-shaped filter 20.

With respect to the materials for a plating layer of conductive fine particles produced by the manufacturing devices for conductive fine particles of the present inventions 1, 2, 3, 4, 5 and 6, they are not particularly limited, but include, for example, gold, silver, copper, platinum, zinc, iron, tin, aluminum, cobalt, indium, nickel, chromium, titanium, antimony, bismuth, germanium, cadmium, silica, and the like. One of these materials may be used, or not less than two kinds of these may be used concomitantly.

Those fine particles used in the manufacturing devices for conductive fine particles of the present inventions 1, 2, 3, 4, 5 and 6 may be either organic resin fine particles or inorganic fine particles.

The above-mentioned fine particles are preferably set to have a particle size of 0.5 to 5000 $\mu$m and a variation coefficient of not more than 50%.

In the present inventions 7, 8 and 9, an electroplating layer is formed on the surface of each of the fine particles by a plating process. In particular, it is preferable to form the electroplating layer on the surface of each of the fine particles by a plating process in which the fine particles are made to collide with the cathode by a centrifugal force in a plating bath provided with a cathode and an anode.

In the present inventions 7, 8 and 9, a step is required which comprises applying at least one kind of force selected from the group consisting of a shearing force, an impact force and cavitation, in order to disperse, pulverize and divide into individual particles, aggregated lumps of fine particles formed during the plating process.

In the present invention 7, the method for applying at least one kind of force selected from the group consisting of a shearing force, an impact force and cavitation is not particularly limited; and examples include methods using a pulverizing device, such as a static mixer, a homomixer, a homogenizer, a stirrer, a pump, and ultrasonic waves. The cavitation (pressure drop) means a phenomenon in which the pressure of a flowing liquid drops locally, thereby generating bubbles containing vapor and gases.

The above-mentioned plating process is carried out with an electroplating device.

With respect to the electroplating device, it is not particularly limited as long as it is generally used; and, for example, as illustrated in FIG. 1, an electroplating device comprising the following equipment is preferably used: a disk-shaped bottom plate secured to the upper end of a perpendicular driving shaft; a porous member that is placed on the outer circumferential upper face of the bottom plate and that allows only a plating solution to pass there through; a contact ring for conducting electricity placed on the upper face of the porous member; a hollow cover of a trapezoidal cone shape having an opening on its upper center portion, to the upper end of which a hollow cylinder having the same pore diameter as the opening diameter is joined, with the upper end of the hollow cylinder being bent toward the inner wall side of the hollow cylinder; a rotatable treatment chamber formed in a manner so as to sandwich the porous member and the contact ring between the outer circumferential portion of the hollow cover and the bottom plate; a supply tube for supplying the plating solution to the treatment chamber through the opening; a container for receiving plating solution scattered from the pores of the porous member; a drain tube for draining the plating solution accumulated in the container; and an electrode inserted through the opening to contact the plating solution.

In the present inventions 7, 8 and 9, the above-mentioned electroplating device and the above-mentioned pulverizing device are concomitantly used so that the fine particle aggregated lumps produced during the plating process can be dispersed, pulverized and divided into an individual particle, thereby making it possible to uniformly form an electroplating layer on the surface of each of the fine particles.

With respect to the method for combining the above-mentioned electroplating device and the pulverizing device, for example, after completion of the plating process by the above-mentioned electroplating device, the resulting product may be divided into an individual particle by using the pulverizing device; however, in this case, scratches and scrape marks remain on the surface of the plated fine particles, failing to form a uniform plating layer. Accordingly, it is preferable to continuously carry out the dividing process into individual particles by the pulverizing device while forming the plating layer in the electroplating device. Moreover, the fine particles may be circulated until an objective film thickness has been achieved, or the electroplating device and the pulverizing device may be aligned in series so as to carry out a single-pass plating process.

In the present inventions 7, 8 and 9, the electroplating layer of fine particles is not particularly limited, but includes, for example, at least one kind of metal selected from the group consisting of the following metals is preferably used: gold, silver, copper, platinum, zinc, iron, lead, tin, aluminum, cobalt, indium, nickel, chromium, titanium, antimony, bismuth, germanium, cadmium, silica, and the like.

Those fine particles used in the manufacturing devices for conductive fine particles of the present inventions 7, 8 and 9 may be either organic resin fine particles or inorganic fine particles.

The above-mentioned fine particles are preferably set to have a particle size of 0.5 to 5000 $\mu$m and a variation coefficient of not more than 50%.

The manufacturing method for conductive fine particles of the present inventions 7, 8 and 9 provide the following effects:

① Because of comprising a step of applying at least one kind of force selected from the group consisting of a shearing force, an impact force and cavitation, it is possible to obtain conductive fine particles divided into an individual particle which have a plating layer of a uniform thickness, even when fine particles have a particle size of approximately not more than 100 $\mu$m.

② The electroplating device and the pulverizing device are aligned in series so that a plating layer is formed in the electroplating device while fine particles are continuously being divided into an individual particle in the pulverizing device; therefore, it is possible to obtain conductive fine particles with a plating layer having a uniform thickness without scrap marks and scatches on the surface of the plated fine particles.

Referring to Figures, the following description will discuss one embodiment of a manufacturing device for conductive fine particles of the present invention 10.

Figure 15:
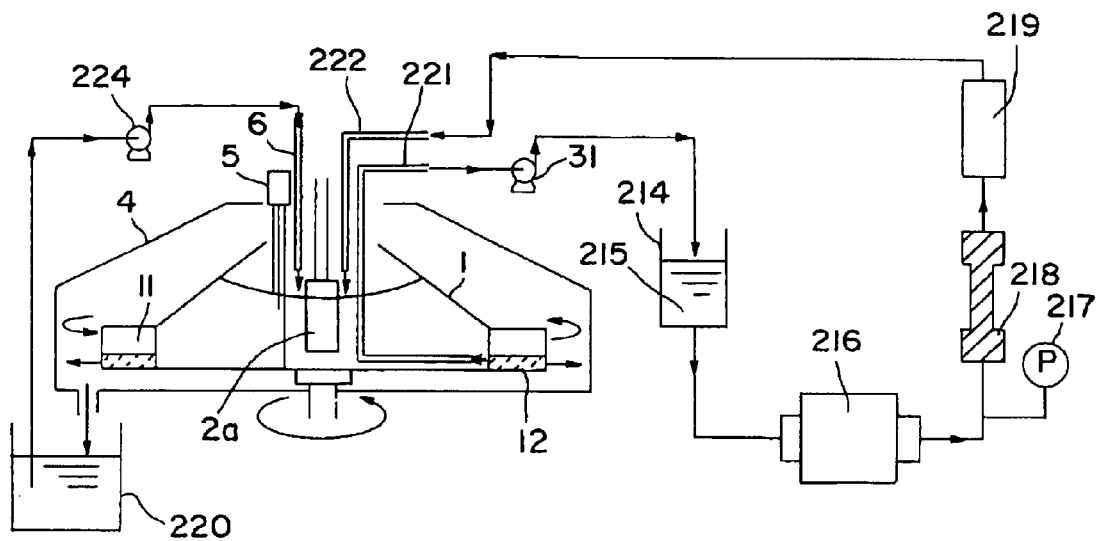
FIG. 15 is a flow diagram showing a circulation type in which an electroplating device of Example 15 and a pulverizing device (high-pressure homogenizer) are combined.

FIG. 1 shows one embodiment of an electroplating device used in the manufacturing device for conductive fine particles of the present invention 10. FIG. 15 shows a flow diagram of one embodiment of a circulating system in which the electroplating device and the pulverizing device are combined in the manufacturing device for conductive fine particles of the present invention 10.

As illustrated in FIG. 1, the electroplating device used in the manufacturing device for conductive fine particles of the present invention 10 comprises a disk-shaped bottom plate 10 secured to the upper end of a perpendicular driving shaft 3; a porous member 12 that is placed on the outer circumferential upper face of the bottom plate 10 and that allows only a treatment liquid to pass there through and; a contact ring 11 for conducting electricity placed on the upper face of the porous member; a hollow cover 1 of a trapezoidal cone shape having an opening 8 on its upper center portion, to the upper end of which a hollow cylinder having the same pore diameter as the opening diameter is joined, with the upper end of the hollow cylinder being bent toward the inner wall side of the hollow cylinder; a rotatable treatment chamber 13 formed in a manner so as to sandwich the porous member 12 and the contact ring 11 between the outer circumferential portion of the hollow cover 1 and the bottom plate 10; a supply tube 6 for supplying the treatment liquid to the treatment chamber 13 through the opening 8; a container 4 for receiving the treatment liquid scattered from the pores of the porous member 12; a drain tube 7 for draining the treatment liquid accumulated in the container 4; and an electrode 2 inserted through the opening 8 to contact the plating solution.

The above-mentioned porous member 12 is a filter-shaped porous member comprising communicating bubbles formed with plastics or ceramics. Those members, which have a pore size that allows a treatment liquid such as a plating solution to pass there through but does not allow fine particles and conductive fine particles to do, are adopted.

The treatment liquid, subjected to a centrifugal force by the rotation of the driving shaft 3, is allowed to pass the porous member 12, and scattered into the plastic container 4, with the result that the liquid level of the theatment solution inside the treatment chamber 13 drops; therefore, in order to compensate for the reduction, the amount of the liquid is monitored by a level sensor 5 so that the treatment liquid is supplied to the treatment chamber 13 from the supply tube 6 for supplying the treatment liquid through the opening 8 and the liquid level inside the treatment chamber 13 is always made to contact an electrode 2a. In FIG. 1, reference numeral 2 represents a positive electrode that is connected to the anode 2a. Reference numeral 9 is a contact brush. A power supply used for the electrodes is not shown in the Figure.

In the present invention 10, the plating solution is supplied to the treatment chamber 13 from the plating solution supply tube 6, and fine particles, each having a conductive base layer formed thereon, are charged into the treatment chamber 13 through the opening 8 of the hollow cover 1, and dispersed therein. With respect to the formation of the conductive base layer, electroless plating is preferably adopted; however, not limited, and other known conductivity-applying methods may be adopted. Upon introducing the fine particles into the treatment chamber 13, the driving shaft 3 is allowed to rotate. Since the plating solution passes through the porous member 12 and goes out of the treatment chamber 13 with being subject to the rotation of the driving shaft 3, the plating solution supply tube 6 compensates for the amount of the reduction. Other plating conditions are not particularly distinct from general plating operations.

In order to form a more uniform plating layer, it is preferable to reverse in its rotation direction or to stop the rotation of the driving shaft 3 in each predetermined time.

In the present invention 10, the fine particles, each having a conductive base layer formed thereon, are placed in the treatment chamber 13 while being immersed in a plating solution, and power is applied across the respective electrodes of the contact ring 11 (cathode) and the anode 2a while the driving shaft 3 being rotated. The fine particles are pressed against the contact ring 11 by the effect of a centrifugal force so that a plating layer is formed on each of the fine particles facing the anode 2a. When the driving shaft 3 is stopped, the fine particles are dragged by gravity and the flow of the plating solution due to inertia, made to drop on the flat surface of the central portion of the bottom plate, and mixed. When the driving shaft 3 starts to rotate reversely next time, they are pressed against the contact ring 11 by the effect of a centrifugal force in a different attitude while being mixed so that a plating layer is formed on each of other fine particles facing the anode 2a.

As described above, a plating process is carried out by repeating the rotation and stoppage of the driving shaft 3; and, as illustrated in FIG. 15, during this plating process, the fine particles inside the treatment chamber 13 are continuously taken out together with the plating solution, and transported to the pulverizing device. The fine particles, transported to the pulverizing device, are subjected to at least one kind of force selected from the group consisting of shearing force, impact force and cavitation (pressure drop), and divided into an individual particle, and these are again returned to the treatment chamber of the electroplating device.

By repeating these processes, it becomes possible to prevent aggregation of the fine particles, and consequently to provide conductive fine particles, each having a uniform electroplating layer formed thereon.

Figures 19, 20:
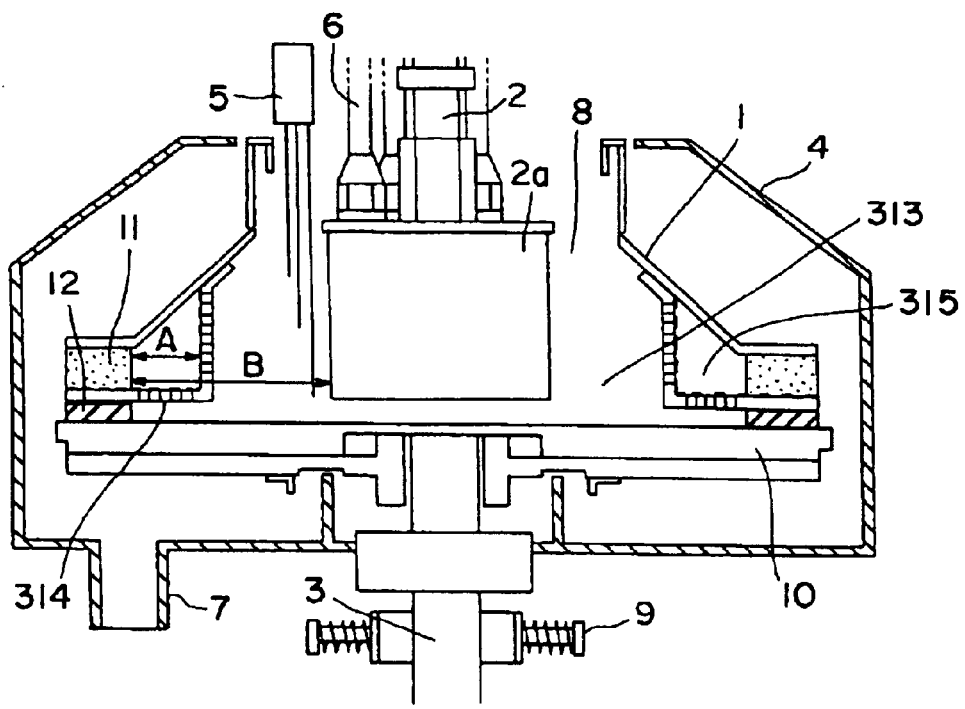
FIG. 19 is a schematic cross-sectional view that shows one embodiment of a manufacturing device for conductive fine particles of the present invention 11.
FIG. 20 is a schematic cross-sectional view that shows a conventional manufacturing device for conductive fine particles.

FIG. 19 shows one embodiment of a manufacturing device for conductive fine particles of the present invention 11.

The manufacturing device for conductive fine particles of the present invention 11 comprises a disk-shaped bottom plate 10 secured to the upper end of a perpendicular driving shaft 3; a porous member 12 that is placed on the outer circumferential upper face of the bottom plate 10 and that allows only a plating solution to pass there through; a contact ring 11 for conducting electricity that is placed on the upper face of the porous member 12; a hollow cover 1 having an opening 8 on its upper center portion; a rotatable plating vessel 313 formed in a manner so as to sandwich the porous member 12 and the contact ring 11 between the outer circumferential portion of the hollow cover 1 and the bottom plate 10; a treatment chamber 315, placed inside the plating vessel 313, that is formed by a partition plate 314 passing only a plating solution, and includes the inside face of the contact ring 11; a supply tube 6 for supplying the plating solution to the plating vessel 313 through the opening 8; a container 4 for receiving the plating solution scattered from the pores of the porous member 12; a drain tube 7 for draining the plating solution accumulated in the container 4; and an electrode 2 inserted through the opening 8 to contact the plating solution.

The plating solution, subjected to a centrifugal force by the rotation of the driving shaft 3, is allowed to pass the porous member 12, and scattered into the container 4. Consequently, the liquid level of the plating solution in the plating vessel 313 drops; therefore, in order to compensate for the reduction, the amount of the liquid is monitored by a level sensor 5 so that the plating solution is supplied to the plating vessel 313 from the supply tube 6 for supplying the plating solution through the opening 8 and the liquid level in the plating vessel 313 is always made to contact an electrode 2a. In FIG. 19, reference numeral 2 represents a positive electrode connected to the anode 2a. Reference numeral 9 is a contact brush. A power supply used for the electrodes is not shown in the Figure.

In the present invention 11, fine particles are charged into the treatment chamber 315, and a plating solution is supplied into the plating vessel 313 through the supply tube 6. Since the plating solution passes through the porous member 12 and goes out of the plating vessel 313 subjected to the rotation of the driving shaft 3, the plating solution supply tube 6 compensates for the amount of the reduction. Other plating conditions are not particularly distinct from general plating operations.

In order to form a more uniform plating layer, it is preferable to reverse in its rotation direction or to stop the rotation of the driving shaft 3 in each predetermined time.

Power is applied while the fine particles are being pressed onto the contact ring 11 by the effect of a centrifugal force due to the rotation of the plating vessel 313, and plating is carried out. Simultaneously with the power cut-off, the rotation is slowed and stopped, with the result that the fine particles are dragged by gravity and the flow of the plating solution due to inertia, and shifted to the central portion of the bottom plate 10; however, since they are shielded by the treatment chamber 15 formed with the partition plate 314 allowing only the treatment liquid to pass there through, they collide with the inner wall of the treatment chamber 315, and are mixed violently. Next, when the plating vessel 13 rotates, the fine particles are pressed against the contact ring 11 in a different attitude while being mixed, and subjected to plating. By repeating this cycle, all the fine particles contained in the treatment chamber 315 are allowed to have a plating layer of a uniform thickness.

As described above, in the manufacturing device for conductive fine particles of the present invention, fine particles are allowed to shift only ones inside of the treatment chamber 315 formed inside the plating vessel 313. For this reason, it is possible to shorten the distance of shift of the fine particles, and consequently to shorten the time required for the fine particles until pressed against the contact ring 11; therefore, the efficiency of plating is improved. Moreover, upon stoppage of the rotation of the plating vessel 313, the fine particles are made to collide with the inner wall of the treatment chamber 315, and mixed, resulting in a superior stirring effect.

The size of the treatment chamber 315 is appropriately set by taking into account the particle size of the fine particles, the kind of plating metal, etc. It is preferable to set the distance (particle shift distance) from the inner side face of the contact ring 11 to the inner side face of the opposing partition plate 314, shown in A of FIG. 19, to be greater than the thickness of the fine particle layer in the state where the fine particles are pressed against the contact ring 11, and it is also preferable to set this distance smaller than the distance from the inner side face of the contact ring 11 to the outer circumferential face of the electrode 2a inserted into the center of the plating vessel 313, as an anode shown in B in FIG. 19 (particle shift distance in the case of no formation of the treatment chamber 315 inside the plating vessel 13).

With respect to the partition plate 314 forming the treatment chamber 315, its shape and material are not particularly limited as long as it allows only the plating solution to pass through. However, it is preferable to use a plate having a construction wherein a filter sheet has a pore size allowing only the treatment liquid to pass but not allowing fine particles to do is affixed to the inner side face of a resin plate comprising a number of pores. The shape and the size of the pores are only required to set so as to allow smooth passage for the plating solution, regardless of the particle size of fine particles to be loaded into the treatment chamber 315. Moreover, the thickness of the resin plate also is not particularly limited as long as it has sufficient strength for forming the treatment chamber 315.

The fine particles used in the manufacturing device for conductive fine particles of the present invention 11 may be either organic resin fine particles or inorganic fine particles. The fine particles are preferably ones comprising a conductive base layer. With respect to the formation method of the conductive base layer, the electroless plating method is preferably used; however, not limited to this method, other known conductivity-applying methods may be adopted.

The above-mentioned organic resin fine particles may be fine particles comprising a linear polymer, fine particles comprising a network polymer, fine particles comprising a thermosetting resin, or fine particles comprising an elastic member.

With respect to the linear polymer, it is not particularly limited, but include for examples, nylon, polyethylene, polypropylene, methylpentene polymer, polystyrene, polymethylmethacrylate, polyvinyl chloride, polyvinyl fluoride, polytetrafluoroethylene, polyethylene terephthalate, polybutyleneterephthalate, polysulfone, polycarbonate, polyacrylonitrile, polyacetal, polyamide, and the like.

With respect to the network polymer, it is not particularly limited, but includes for example, mono-polymers of crosslinkable monomer, such as divinylbenzene, hexatoluene, divinylether, divinylsulfone, diallylcarbinol, alkylenediacrylate, oligo or poly(alkyleneglycol)diacrylate, oligo or poly(alkyleneglycol)dimethacrylate, alkylenetriacrylate, alkylene trimethacylate, alkylenetetraacrylate, alkylenetetramethacrylate, alkylenebisacrylamide, and alkylenebismethacylamide, or copolymers of these crosslinkable monomers and other polymerizable monomers. Among these, divinylbenzene, hexatoluene, divinylether, divinylsulfone, alkylenetriacrylate, alkylenetetraacrylate, etc. are more preferably used.

With respect to the thermosetting resin, it is not particularly limited, but includes for example, phenol-formaldehyde resins, melamine-formaldehyde resins, benzoguanamine-formaldehyde resins, urea-formaldehyde resins, epoxy resins, etc.

With respect to the elastic member, it is not particularly limited, but includes for example, natural rubber, synthetic rubber, etc.

With respect to the material for the inorganic fine particles, it is not particularly limited, but includes for example, silica, titanium oxide, iron oxide, cobalt oxide, zinc oxide, nickel oxide, manganese oxide, aluminum oxide, etc.

The particle size of the fine particles is preferably set in the range of 0.5 to 5000 $\mu$m, more preferably 0.5 to 2500 $\mu$m, and most preferably 1 to 1000 $\mu$m.

The variation coefficient of the fine particles is preferably set to not more than 50%, more preferably, not more than 35%, most preferably, not more than 20%, and by far the most preferably, not more than 10%. Here, the variation coefficient means a value representing the standard deviation by the use of percentage based upon the average value; this is represented by the following formula:

variation coefficient=(standard deviation of particle sizes/average value of particle sizes)×100(%)

With respect to the plating metal used in the manufacturing device for conductive fine particles of the present invention 11, it is not particularly limited, but includes for example, gold, silver, copper, platinum, zinc, iron, tin, aluminum, cobalt, indium, nickel, chromium, titanium, antimony, bismuth, germanium, cadmium, silica, etc. One of these materials may be used, or not less than two kinds of these may be used concomitantly.

In the manufacturing device for conductive fine particles of the present invention 11, in the case of not more than 50 $\mu$m of the average size of the fine particles, or in the case when the plating metal tends to aggregation, like solder, plating may be carried out in a state where dummy chips are mixed with the fine particles.

In the manufacturing device for conductive fine particles of the present invention 12, a plating layer is formed on the surface of each of the fine particles by using a plating process.

In the present invention, the above-mentioned plating process is carried out by using a manufacturing device for conductive fine particles which comprises; a rotatable treatment chamber that has a cathode on its side face and a filter section allowing a plating solution to pass there through and to drain it; and an anode placed in the above-mentioned treatment chamber in a manner so as not to contact the cathode.

The above-mentioned plating process is carried out by repeating the rotation and stoppage of the treatment chamber, and comprises a power application process and a stirring process.

The above-mentioned power application process is a process for forming a plating layer on the surface of each of the fine particles by applying power in a state where the treatment chamber is being rotated at a constant speed. The fine particles, loaded into the treatment chamber, are pressed onto the cathode located on the side face of the treatment chamber by the effect of a centrifugal force due to the rotation of the treatment chamber. By applying power in this state, a plating layer is formed on the surface of each of the fine particles. Thereafter, when the rotation of the treatment chamber and the power application are stopped at the same time, that is, upon completion of the power application process, the fine particles are dragged by gravity and the flow of the plating solution due to inertia is made to drop on the bottom plate of the treatment chamber and mixed.

When, upon completion of the power application process or the stirring process described later, the treatment chamber is again rotated and the above-mentioned power application process is started, the fine particles are pressed against the cathode in an attitude different from that at the time of the previous power application process while being mixed. By applying power in this state, a plating layer is further formed on the surface of each of the fine particles, thereby making it possible to form a plating layer having a uniform thickness on each of all the fine particles contained in the treatment chamber.

The above-mentioned stirring process is a process which comprises stirring fine particles by rotating only the treatment chamber. During this stirring process, no power application is made.

The number of revolutions of the treatment chamber in the above-mentioned stirring process is appropriately selected according to the degree of aggregation of the fine particles, and it may be the same as the number of revolutions in the power application process, or may be different therefrom. Moreover, the rotation direction of the treatment chamber in the above-mentioned stirring process may be set either in the forward or reverse direction; however, in order to improve the stirring effect, it is preferable to set it in the direction reversed to the rotation direction in the preceding process of the current stirring process.

The operation pattern of the stirring process may be the same as the operation pattern of the power application process, or may be different therefrom; however, in order to improve the efficiency and the stirring effect, it is preferably set as short as possible.

The above-mentioned stirring process improves the stirring effect of the plating process as a whole; as a result, it becomes possible to extend the power application time. Moreover, even in the case when the current density is increased higher than that conventionally used, since the resulting aggregated lumps can be pulverized, it is possible to form a uniform plating layer with high efficiency.

It is preferable to carry out the stirring process after the power application process, and the stirring process may be carried out after carrying out the power application process a plurality of times. Moreover, in the case when the fine particles tend to aggregation, the above-mentioned stirring process may be carried out a plurality of times after the power application process.

The fine particles used in the manufacturing device for conductive fine particles of the present invention 12 may be either organic resin fine particles or inorganic fine particles. The fine particles are preferably one comprising a conductive base layer thereon. With respect to the formation method of the conductive base layer, the electroless plating method is preferably used. However, not limited to this method, other known conductivity-applying methods may be adopted.

The above-mentioned organic resin fine particles may be fine particles comprising a linear polymer, fine particles comprising a network polymer, fine particles comprising a thermosetting resin, or fine particles comprising an elastic member.

With respect to the linear polymer constituting the above-mentioned fine particles comprising a linear polymer, there can be mentioned, nylon, polyethylene, polypropylene, methylpentene polymer, polystyrene, polymethylmethacrylate, polyvinyl chloride, polyvinylfluoride, polytetrafluoroethylene, polyethylene, terephthalate, polybutyleneterephthalate, polysulfone, polycarbonate, polyacrylonitrile, polyacetal, polyamide, etc.

With respect to the network polymer constituting the above-mentioned fine particles comprising a network polymer, there can be mentioned, monopolymers of crosslinkable monomer, such as divinylbenzene, hexatoluene, divinylether, divinylsulfone, diallylcarbinol, alkylenediacrylate, oligo or poly(alkyleneglycol)diacrylate, oligo or poly(alkyleneglycol)dimethacrylate, alkylenetriacrylate, alkylene trimethacylate, alkylenetetraacrylate, alkylenetetramethacrylate, alkylenebisacrylamide, and alkylenebismethacrylamide, or copolymers of these crosslinkable monomers and other polymerizable monomers. Among these, divinylbenzene, hexatoluene, divinylether, divinylsulfone, alkylenetriacrylate, alkylenetetraacrylate, etc.

With respect to the thermosetting resin constituting the above-mentioned fine particles comprising a thermosetting resin, there can be mentioned, phenol-formaldehyde resins, melamine-formaldehyde resins, benzoguanamine-formaldehyde resins, urea-formaldehyde resins, epoxy resins, etc.

With respect to the elastic member, constituting the above-mentioned fine particles of an elastic member, for example, natural rubber, synthetic rubber, etc. are used.

With respect to the material for the inorganic fine particles, it is not particularly limited; and examples thereof include silica, titanium oxide, iron oxide, cobalt oxide, zinc oxide, nickel oxide, manganese oxide, aluminum oxide, etc.

The particle size of the fine particles is preferably set in the range of 0.5 to 5000 $\mu$m, more preferably 0.5 to 2500 $\mu$m, and much more preferably 1 to 1000 $\mu$m. Moreover, the variation coefficient of the fine particles is preferably set to not more than 50%, more preferably not more than 35%, much more preferably not more than 20%, and the most preferably, not more than 10%. Here, the variation coefficient means a value which represents the standard deviation by the use of percentage based upon the average value; this is represented by the following formula:

variation coefficient=(standard deviation of particle sizes/average value of particle sizes)×100(%)

With respect to the plating metal forming the above plating layer used in the manufacturing device for conductive fine particles of the present invention, it is not particularly limited, but includes for examples, gold, silver, copper, platinum, zinc, iron, lead, tin, aluminum, cobalt, indium, nickel, chromium, titanium, antimony, bismuth, germanium, cadmium, silica, etc. These materials may be used singly, or not less than two kinds of these may be used concomitantly.

Referring to Figures, the following description will discuss one embodiment of a manufacturing method of conductive fine particles of the present invention 12.

FIG. 11 shows one example of a manufacturing device for conductive fine particles that is preferably used in the manufacturing method for conductive fine particles of the present invention.

The manufacturing device for conductive fine particles, shown in FIG. 11, comprises a disk-shaped bottom plate 10 secured to the upper end of a perpendicular driving shaft 3; a porous member 21 that is placed on the outer circumferential upper face of the bottom plate 10 and that allows only a plating solution to pass there through; a contact ring 11 for conducting electricity placed on the upper face of the porous member 21; a hollow cover 1 having an opening 8 on its upper center portion; a rotatable treatment chamber 13 formed in a manner so as to sandwich the porous member 21 and the contact ring 11 between the outer circumferential portion of the hollow cover 1 and the bottom plate 10; a supply tube 6 for supplying the plating solution to the treatment chamber 13 through the opening 8; a container 4 for receiving the plating solution scattered from the pores of the porous member 21; a drain tube 7 for draining the plating solution accumulated in the container 4; and an electrode 2 inserted through the opening 8 to contact the plating solution. Here, in the manufacturing device for conductive fine particles having the above-mentioned construction, the contact ring 11 forms a cathode, the porous member 21 forms a filter section, and the electrode 2 forms an anode.

The plating solution, subjected to a centrifugal force due to the rotation of the driving shaft 3, is allowed to pass the porous member 21, and scattered into the plastic container 4, with the result that the liquid level of the plating solution inside the treatment chamber 13 drops; therefore, in order to compensate for the reduction, the amount of the liquid is monitored by a level sensor 5 so that the plating solution is supplied to the treatment chamber 13 from the supply tube 6 for supplying the plating solution through the opening 8 and the liquid level inside the treatment chamber 13 is always made to contact with an electrode 2a. In FIG. 1, reference numeral 2 represents a positive electrode connected to the anode 2a. Reference numeral 9 is a contact brush. Here, a power supply used for the electrodes is not shown in the Figure.

In the present embodiment, the plating solution is supplied to the treatment chamber 13 from the plating solution supply tube 6, and fine particles, each having a conductive base layer formed thereon, are charged into the treatment chamber 13 through the opening 8 of the hollow cover 1, and dispersed therein. Since the plating solution passes through the porous member 21 and goes out of the treatment chamber 13 subjected to the rotation of the driving shaft 3, the plating solution supply tube 6 compensates for the amount of the reduction. Other plating conditions are not particularly distinct from general plating operations.

The above-mentioned porous member 21 is a filter-shaped porous member having communicating bubbles formed by plastics or ceramics, and those having a pore size to pass only the plating solution such as a plating solution, but not to pass fine particles and conductive fine particles are adopted; and it is preferably one having a construction in which a filter sheet 20 having a pore size to allow only a plating solution to pass there through is placed on the upper face of the plate-shaped porous support 22.

In order to form a more uniform plating layer, it is preferable to reverse in its rotation direction or to stop the rotation of the driving shaft 3 in each predetermined time. The number of revolutions and the operation pattern may be the same in both of the forward rotation time and the reverse rotation time, or may be different in these cases.

In the manufacturing method for conductive fine particles of the present invention 13, an electroplating layer is formed on the surface of each of fine particles by a plating process.

In the present invention 13, the above-mentioned plating process is carried out by using a manufacturing device for conductive fine particles which comprises; a rotatable treatment chamber that has a cathode on its side face and a filter section allowing a plating solution to pass there through and to drain it; and an anode placed in the treatment chamber in a manner so as not to contact the cathode.

Fine particles, loaded into the treatment chamber, are pressed onto the cathode located on the side face of the treatment chamber by the effect of a centrifugal force due to the rotation of the treatment chamber. By applying power in this state, an electroplating layer is formed on the surface of each of the fine particles. Thereafter, when the rotation of the treatment chamber and the power application are stopped at the same time, the fine particles are dragged by gravity and the flow of the plating solution due to inertia, made to drop on the bottom plate, of the treatment chamber and mixed. When the treatment chamber is further rotated, the fine particles are pressed against the cathode in a different attitude while being mixed. By applying power in this state, an electroplating layer is further formed on the surface of each of the fine particles. By repeating the rotation and stoppage of the treatment chamber, it becomes possible to form an electroplating layer having a uniform thickness on all the fine particles contained in the treatment chamber.

With respect to the fine particles used in the present invention 13, they are not particularly limited, but include for example, metal fine particles, organic resin fine particles, and inorganic fine particles. In the case of the application of the organic resin fine particles or the inorganic particles, those fine particles comprising a conductive base layer on the surface thereof are preferably used. With respect to the formation method of the conductive base layer, the electroless plating method is preferably used. However, it is not limited to this method, other known conductivity-applying methods may be adopted.

With respect to the metal fine particles, they are not particularly limited, but include for example, iron, copper, silver, gold, tin, lead, platinum, nickel, titanium, cobalt, chromium, aluminum, zinc, tungsten, etc., and alloys thereof.

The above-mentioned organic resin fine particles may include fine particles comprising a linear polymer, fine particles comprising a network polymer, fine particles comprising a thermosetting resin, and fine particles comprising an elastic member.

With respect to the linear polymer constituting the above-mentioned fine particles comprising a linear polymer, there can be mentioned, nylon, polyethylene, polypropylene, methylpentene polymer, polystyrene, polymethylmethacrylate, polyvinyl chloride, polyvinylfluoride, polytetrafluoroethylene, polyethylene terephthalate, polybutyleneterephthalate, polysulfone, polycarbonate, polyacrylonitrile, polyacetal, polyamide, etc.

With respect to the network polymer constituting the above-mentioned fine particles comprising a network polymer, there can be mentioned, mono-polymers of crosslinkable monomer, such as divinylbenzene, hexatoluene, divinylether, divinylsulfone, diallylcarbinol, alkylenediacrylate, oligo or poly(alkyleneglycol)diacrylate, oligo or poly(alkyleneglycol)dimethacrylate, alkylenetriacrylate, alkylenetrimethacylate, alkylenetetraacrylate, alkylenetetramethacrylate, alkylenebisacrylamide, and alkylenebismethacylamide, or copolymers, etc. obtained by copolymerizing these crosslinkable monomers and other polymerizable monomers. Among these, divinylbenzene, hexatoluene, divinylether, divinylsulfone, alkylenetriacrylate, alkylenetetraacrylate, etc. are more preferably used.

With respect to the thermosetting resin constituting the above-mentioned fine particles comprising a thermosetting resin, there can be mentioned phenol-formaldehyde resins, melamine-formaldehyde resins, benzoguanamine-formaldehyde resins, urea-formaldehyde resins, epoxy resins, etc.

With respect to the elastic member constituting the above-mentioned fine particles comprising an elastic member, there can be mentioned, natural rubber, synthetic rubber, etc.

With respect to the material for the inorganic fine particles, it is not particularly limited, but includes for example, silica, titaniumoxide, iron oxide, cobalt oxide, zinc oxide, nickel oxide, manganese oxide, aluminum oxide, etc.

The particle size of the fine particles is preferably set in the range of 0.5 to 5000 $\mu$m, more preferably 0.5 to 2500 $\mu$m, and much more preferably 1 to 1000 $\mu$m. The variation coefficient of the fine particles is preferably set to not more than 50%, more preferably not more than 35%, much more preferably not more than 20%, and the most preferably not more than 10%. Here, the variation coefficient means a value representing the standard deviation by the use of percentage based upon the average value; this is represented by the following formula:

variation coefficient=(standard deviation of particle sizes/average value of particle sizes)×100(%)

In the present invention 13, the difference in the specific gravity between the fine particles and the plating solution is set in the range of 0.04 to 22.00. When this is less than 0.04, it takes a long time for the fine particles to come into contact with the cathode, and power application is started before all the fine particles have been pressed on the cathode, with the result that bipolar phenomenon occurs. Moreover, when the number of revolutions of the treatment chamber is increased in order to increase the shifting speed of the fine particles, the plating solution, which is subjected to a force in the outer circumferential direction due to the effect of a centrifugal force, forms a vortex in a mortar-like shape within the treatment chamber, with the result that the electrode placed in the center of the treatment chamber is exposed, resulting in failure to apply electric current.

When the shifting time for the fine particles to reach the cathode takes long time, the ratio of the power application time in one cycle gets to be smaller, causing not only degradation in the efficiency, but also an extreme reduction in the amount of power application due to the formation of the vortex in a mortar-like shape by the liquid face resulting from the long rotation time of the treatment chamber.

Here, the specific gravity of generally known solid substances is approximately in the range of 0.5 to 23, and in the manufacturing method of the present invention, the greater the difference in the specific gravity between the fine particles and the plating solution, the more effective because the fine particles in the plating solution are allowed to shift more easily.

In other words, the difference in the specific gravity required for a plating process is in the range of 0.04 to 22.00, more preferably 0.04 to 11.00, and much more preferably 0.04 to 0.2.

With respect to the method for setting the difference in the specific gravity between the fine particles and the plating solution in the above-mentioned range, a method for increasing the specific gravity of the fine particles and a method for decreasing the specific gravity of the plating solution are proposed.

As to the method for increasing the specific gravity of the fine particles, for example, in the case when the organic resin fine particles or the inorganic fine particles are used as the fine particles, a method for increasing the film thickness of the conductive base layer formed on the surface of each of the fine particles is adopted. More specifically, when the electroless nickel plating (specific gravity: 8.85) is applied to organic resin fine particles having a specific gravity of, for example, 1.19, the specific gravity of the fine particles increases as the thickness of the plating film increases, as shown in a graph in FIG. 1. In this manner, the specific gravity of the fine particles can be controlled desirably by forming the conductive base layer, etc. on the surface of each of the fine particles by using the electroless plating, etc.

In the method for decreasing the specific gravity of the plating solution, for example, a method for diluting the plating solution, etc. is proposed. More specifically, for example, in the case when a Watt bath (specific gravity: not less than 1.18) generally used as a plating solution in a nickel plating process is used, it can be diluted to approximate 60% with pure water. Here, with respect to additives, it is preferable to maintain the concentration thereof constant, taking into consideration better adhesion of the plating, etc. Moreover, in order to properly maintain the conductivity of the plating solution, it is also preferable to maintain the concentration of nickel chloride constant. Here, a Watt bath having a composition of nickel chloride 35 to 45 g/L, nickel sulfate 140 to 155 g/L and boric acid 30 to 40 g/L forms a specific gravity in the range of 1.05 to 1.12; and this is preferably used in the present invention 13.

In the present invention 13, the electroplating layer formed on the surface of each of the fine particles is not particularly limited, but includes for example, an electroplating layer, etc. comprising at least one kind of metal selected from the group consisting of gold, silver, copper, platinum, zinc, iron, lead, tin, aluminum, cobalt, indium, nickel, chromium, titanium, antimony, bismuth, germanium, cadmium and silica.

Referring to Figures, the following description will discuss one embodiment of a manufacturing method of conductive fine particles of the present invention 13.

FIG. 1 shows one example of a manufacturing device for conductive fine particles that is preferably used in the manufacturing method for conductive fine particles of the present invention 13.

The manufacturing device for conductive fine particles, shown in FIG. 1 comprises a disk-shaped bottom plate 10 secured to the upper end of a perpendicular driving shaft 3; a porous member 12 that is placed on the outer circumferential upper face of the bottom plate 10 and that allows only a plating solution to pass there through; a contact ring 11 for conducting electricity placed on the upper face of the porous member 12; a hollow cover 1 having a trapezoidal cone shape with an opening 8 on its upper center portion; a rotatable treatment chamber 13 formed in a manner so as to sandwich the porous member 12 and the contact ring 11 between the outer circumferential portion of the hollow cover 1 and the bottom plate 10; a supply tube 6 for supplying the plating solution to the treatment chamber 13 through the opening 8; a container 4 for receiving the plating solution scattered from the pores of the porous member 12; a drain tube 7 for draining the plating solution accumulated in the container 4, and an electrode 2 inserted through the opening 8 so as to contact the plating solution. Here, in the manufacturing device for conductive fine particles having the above-mentioned construction, the contact ring 11 forms a cathode, the porous member 12 forms a filter section, and the electrode 2 forms an anode.

Figure 2:
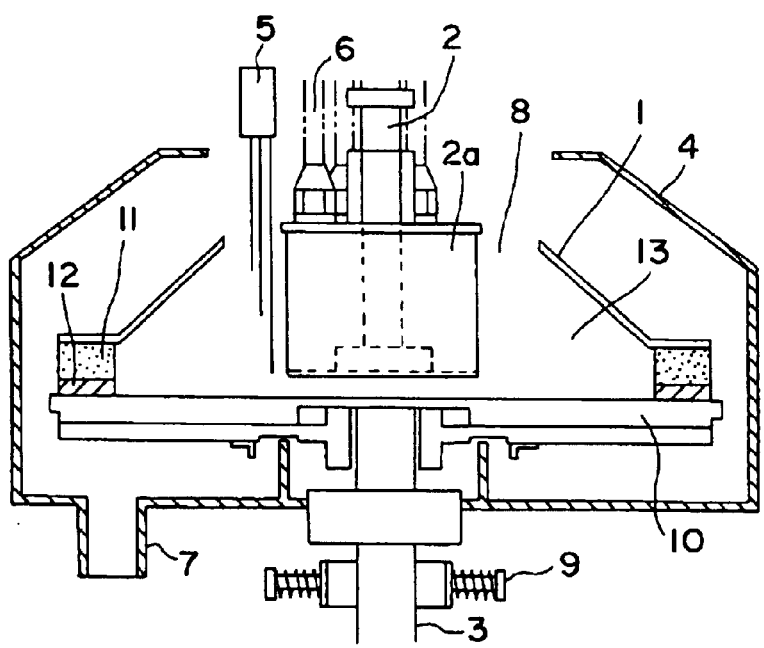
FIG. 2 is a schematic cross-sectional view that shows a conventional manufacturing device for conductive fine particles.

The plating solution, subjected to a centrifugal force due to the rotation of the driving shaft 3, is allowed to pass the porous member 12, and scattered into the plastic container 4, with the result that the liquid level of the plating solution in the treatment chamber 13 drops, therefore, in order to compensate for the reduction, the amount of the liquid is monitored by a level sensor 5 so that the plating solution is supplied to the treatment chamber 13 from the supply tube 6 for supplying the plating solution through the opening 8 and the liquid level inside the treatment chamber 13 is always made to contact an electrode 2a. In FIG. 2, reference numeral 2 represents a positive electrode and is connected to the anode 2a. Reference numeral 9 is a contact brush. Here, a power supply used for the electrodes is not shown in the Figure.

In the present embodiment, the plating solution is supplied to the treatment chamber 13 from the plating solution supply tube 6, and fine particles, each having a conductive base layer formed thereon, are charged into the treatment chamber 13 through the opening 8 of the hollow cover 1, and dispersed therein. Since the plating solution passes through the porous member 12 and goes out of the treatment chamber 13 subjected to the rotation of the driving shaft 3, the plating solution supply tube 6 compensates for the amount of the reduction. Other plating conditions are not particularly distinct from general plating operations.

The above-mentioned porous member 12 is a ring-shaped porous member with a filter shape having communicating bubbles formed by plastics or ceramics, and those having a pore size to allow only the plating solution such as a plating solution to pass there through, but not to allow fine particles to do and conductive fine particles are adopted; and a construction may be adopted in which a filter sheet having a pore size that allows only a plating solution to pass there through is placed on the upper face of the plate-shaped porous support.

In order to form a more uniform electroplating layer, it is preferable to reverse in its rotation direction or to stop the rotation of the driving shaft 3 in each predetermined time. The number of revolutions and the operation pattern may be the same in both of the forward rotation time and the reverse rotation time, or may be different in these cases.

In the manufacturing method for conductive fine particles of the present invention 14, an electroplating layer is formed on the surface of each of fine particles by a plating process.

In the present invention 14, the above-mentioned plating process is carried out by using a manufacturing device for conductive fine particles which comprises; a rotatable treatment chamber that has a cathode on its side face and a filter section for allowing a plating solution to pass there through and to drain it; and an anode placed in the treatment chamber in a manner so as not to contact the cathode.

Fine particles, loaded into the treatment chamber, are pressed onto the cathode on the side face of the treatment chamber by the effect of a centrifugal force due to the rotation of the treatment chamber. By applying power in this state, an electroplating layer is formed on the surface of each of the fine particles. Thereafter, when the rotation of the treatment chamber and the power application are stopped at the same time, the fine particles are dragged by gravity and the flow of the plating solution due to inertia is made to drop on the bottom plate of the treatment chamber and mixed. When the treatment chamber is further rotated, the fine particles are pressed against the cathode in a different attitude while being mixed. By applying power in this state, an electroplating layer is further formed on the surface of each of the fine particles. By repeating the rotation and stoppage of the treatment chamber, it becomes possible to form an electroplating layer having a uniform thickness on all the fine particles contained in the treatment chamber.

In the present invention 14, the number of revolutions of the above-mentioned treatment chamber is set so that the centrifugal effect is maintained in the range of 2.0 to 40.0. With the number of revolutions of the treatment chamber in this range, it becomes possible to allow the fine particles to reach the cathode in a shorter time, and consequently to obtain a sufficient contact force to carry out an electroplating process, even in the case when there is little difference between the true specific gravity of the fine particles and the specific gravity of the plating solution. The centrifugal effect less than 2.0 makes the time required for the fine particles to reach the cathode extremely longer, causing problems such as extreme degradation in the efficiency, an insufficient contact force between the fine particles and the cathode, and the occurrence of a bipolar phenomenon due to the existence of fine particles failing to completely reach the cathode; consequently, these problems make it impossible to carry out the electroplating process. Moreover, in the case of the centrifugal effect exceeding 40.0, although the time required for the fine particles to reach the cathode is greatly shortened, the plating solution, subjected to a force in the outer circumferential direction due to a centrifugal force, forms a vortex having a mortar-like shape within the treatment chamber, with the result that the anode placed in the center of the treatment chamber is exposed, failing to supply a current flow. Furthermore, in the case when the electroplating layer comprises a metal which tends to aggregation and that forms a soft deposition coat film, such as eutectic solder plating, a problem arises in that aggregation occurs as the coat film grows, when the contact force of the fine particles to the cathode is too strong. Therefore, the centrifugal effect is limited to the range of 2.0 to 40.0. The range is more preferably set to 3 to 30, and much more preferably 7 to 20.

The above-mentioned centrifugal effect is given as the ratio of magnitudes between the centrifugal force and the gravity, and found as follows:

The centrifugal force Fc (N) on the mass point of mass M (kg) in circular motion at a constant velocity is represented by the following formula:

$$Fc = M\omega^2 r = MV^2/r = MN^2\pi^2 r/900$$

In the formula, $\omega$ represents the rotation angular velocity (rad/sec), r represents the rotation radius (m), V represents the peripheral velocity (m/sec), and N represents the rotation speed (rpm).

Therefore the centrifugal effect Z is represented by the following formula:

$$Z = \omega^2 r/g = V^2/gr = N^2\pi^2 r/900\,g$$

In the formula, g represents gravity acceleration (m/sec$^2$).

From the above-mentioned formula, the centrifugal effect is represented as a function between the rotation speed of the treatment chamber and the radius of the treatment chamber. The following table shows the number of revolutions of the treatment chamber, the centrifugal effect and the peripheral velocity in the case of a treatment chamber having a diameter of 280 mm, as reference.

| Number of revolutions (rpm) | 855 | 600 | 500 | 300 | 250 | 150 | 100 |
|---|---|---|---|---|---|---|---|
| Centrifugal effect | 114.5 | 56.4 | 39.2 | 14.1 | 9.8 | 3.5 | 1.6 |
| Peripheral velocity (m/min.) | 752.1 | 527.8 | 439.8 | 263.9 | 219.9 | 131.9 | 88.0 |

In order to form an electroplating layer on the surface of each of all the fine particles, it is necessary to start power application after a lapse of time until all the fine particles have been shifted to the cathode and pressed thereon by the effect of the centrifugal force of the rotating treatment chamber. If the power application is started before all the fine particles have been pressed onto the cathode, a bipolar phenomenon will occur, causing the electroplating layer or the conductive base layer to melt down and resulting in malplating.

Therefore, in the present invention 14, the power application is started after a lapse of 0.5 to 10 seconds from the start of the rotation of the treatment chamber. In the case of the lapse of less than 0.5 second, since the power application is started before all the fine particles have been pressed onto the cathode, a bipolar phenomenon occurs, and in the case of the lapse exceeding 10 seconds, the ratio of the power application time in one cycle gets to be smaller, resulting in degradation in the efficiency; thus, the limitation to the above-mentioned range is provided. This is more preferably set in the range of 1 to 8 seconds, and much more preferably 1 to 5 seconds. Here, the above-mentioned power application time varies depending on the difference between the true specific gravity of the fine particles and the specific gravity of the plating solution and the particle size of the fine particles; therefore, this needs to be appropriately set within the above-mentioned range depending on factors, such as the material, shape, particle size of the fine particles, the kind of plating metal and the kind of plating bath.

In the present invention 14, the stoppage time of the treatment chamber is set in the range of 0 to 10 seconds. With this range, a sufficient stirring is carried out from the time the fine particles have left the cathode to the time they are again allowed to reach the cathode by the next rotation; therefore, it is possible to carry out a more uniform plating. If this exceeds 10 seconds, although a uniform plating is obtainable since the fine particles are sufficiently mixed in the treatment chamber, the ratio of the power application time in one cycle gets to be smaller, resulting in degradation in the efficiency; thus, the above-mentioned limitation to the range is provided. The range is more preferably set to 0.5 to 5 seconds, and much more preferably 1 to 3 seconds. If the stoppage time is too short, the next rotation is started before the fine particles have returned to the center of the bottom plate in the treatment chamber due to the stoppage of the rotation of the treatment chamber; this may cause failure to provide sufficient stirring and the subsequent ununiformity in the plating. Here, the stoppage time has variations depending on the difference between the true specific gravity of the fine particles and the specific gravity of the plating solution, or depending on the pore diameter of fine particles; therefore, this needs to be appropriately set within the above-mentioned range depending on factors, such as the material, shape, particle size of the fine particles, the kind of plating metal and the kind of plating bath.

The present invention 15 provides a manufacturing method for conductive fine particles which forms an electroplating layer on the surface of each of the fine particles by a plating process, wherein the plating process, using a manufacturing device for conductive fine particles that comprises; a rotatable treatment chamber that has a cathode on its side face and a filter section allowing the plating solution to pass there through and to drain it; and an anode placed in the treatment chamber in a manner so as not to contact the cathode, comprises steps applying power with the fine particles being made contact with the cathode by the effect of a centrifugal force due to the rotation of the treatment chamber, so as to form an electroplating layer on the surface of each of the fine particles, and then stopping the rotation of the treatment chamber and the application of power, repeating the rotation and stoppage of the treatment chamber, the number of revolutions of the treatment chamber is set so that the centrifugal effect in the range of 2.0 to 40.0, and the power application is started after a lapse of 3 to 10 seconds from the start of the rotation of the treatment chamber before the film thickness of the electroplating layer formed on the surface of each of the fine particles has gotten a predetermined value, and after the film thickness of the electroplating layer formed on the surface of each of the fine particles has gotten a predetermined value, the power application is started after a lapse of 0.5 to 10 seconds from the start of the rotation of the treatment chamber, and said lapse is set shorter than the lapse taken before the film thickness of the electroplating layer formed on the surface of each of the fine particles has become a predetermined value.

In the manufacturing method for conductive fine particles of the present invention 15, the same manufacturing device for conductive fine particles as the manufacturing method for conductive fine particles of the present invention 14 is used; however, the objective is to prevent a bipolar phenomenon that tends to occur at the initial stage of the plating process by delaying the power application start time at the initial stage of the plating process.

In the present invention 15, the power application is started after a lapse of 3 to 10 seconds from the start of the rotation of the treatment chamber before the film thickness of the electroplating layer formed on the surface of each of the fine particles has become a predetermined value. In other words, by delaying the power application start time at the initial stage of the plating process, all the fine particles are allowed to completely reach and contact the cathode so that the occurrence of a bipolar phenomenon is prevented. Here, in the case when the current density is set lower at the initial stage of the plating process, it is possible to reduce the possibility of a bipolar phenomenon; therefore, the current density is preferably set in the range of 0.1 to 1.0 A/dm$^2$. This is more preferably set in the range of 0.2 to 0.5 A/dm$^2$.

In the present invention 15, after the film thickness of the electroplating layer formed on the surface of each of the fine particles has gotten to be a constant value, the power application is started after a lapse of 0.5 to 10 seconds from the start of the rotation of the treatment chamber, and this lapse is set shorter than the lapse taken before the film thickness of the electroplating layer formed on the surface of each of the fine particles has gotten to be a predetermined value. In other words, when the plating process has progressed and the electroplating layer has been formed on the surface of each of the fine particles to a certain extent, the difference in specific gravity between the fine particles and the plating solution becomes greater, so that the fine particles to reach the cathode in a shorter time. Therefor, by shortening the lapse to the power application start time as compared with the initial stage of the plating process, it becomes possible to improve the efficiency of the plating process. In this stage, the higher the current density, the higher the efficiency; therefore, the current density is preferably set in the range of 0.5 to 5.0 A/dm$^2$, and more preferably, 1.0 to 3.0 A/dm$^2$.

As described above, by alternating the plating conditions in the course of the plating process, it becomes possible to prevent the occurrence of a bipolar phenomenon in the initial stage of the plating process, and consequently to form an electroplating layer more efficiently. With respect to timing for changing the plating conditions, it is preferred the time when the film thickness of the electroplating layer formed on the surface of each of the fine particles has reached a predetermined value, with the result that the specific gravity of the fine particles gets to be greater so that, even if the power application start time, thus, the time required for the fine particles to shift is shortened, all the fine particles are allowed to sufficiently reach and contact the cathode; here, since the shifting speed of the fine particles has variations depending on factors, such as the particle size, the difference in specific gravity between the fine particles and the plating solution, the increase in the specific gravity of the particles subjected to the growth of plating, the viscosity of the plating solution, and the filtering speed of the plating solution, it is appropriately determined based upon factors such as the particle size of the fine particles to be plated, the kind of the plating solution, the number of revolutions of the treatment chamber and the pore size of the porous member.

The fine particles used in the present inventions 14 and 15 are not particularly limited, but include for example, metal fine particles, organic resin fine particles or inorganic fine particles. In the case of the application of the organic resin fine particles or the inorganic fine particles, the fine particles formed with a conductive base layer on its surface are preferably used. The electroless plating method is preferably used as the formation method of the conductive base layer. However, it is not limited to this method, but other known conductivity-applying methods may be adopted.

The above-mentioned metal fine particles are not particularly limited, but include for example, iron, copper, silver, gold, tin, lead, platinum, nickel, titanium, cobalt, chromium, aluminum, zinc, tungsten, and alloys thereof.

The above-mentioned organic resin fine particles are not limited but include fine particles comprising a linear polymer, or fine particles comprising a network polymer, or fine particles comprising a thermosetting resin, or fine particles made of an elastic member.

With respect to the linear polymer constituting the above-mentioned fine particles comprising a linear polymer, it includes, nylon, polyethylene, polypropylene, methylpentene polymer, polystyrene, polymethylmethacrylate, polyvinyl chloride, polyvinylfluoride, polytetrafluoroethylene, polyethylene terephthalate, polybutyleneterephthalate, polysulfone, polycarbonate, polyacrylonitrile, polyacetal, polyamide, etc.

With respect to the network polymer constituting the above-mentioned fine particles comprising a network polymer, it includes, monopolymers of crosslinkable monomer, such as divinylbenzene, hexatoluene, divinylether, divinylsulfone, diallylcarbinol, alkylenediacrylate, oligo or poly(alkyleneglycol)diacrylate, oligo or poly(alkyleneglycol)dimethacrylate, alkylenetriacrylate, alkylene trimethacylate, alkylenetetraacrylate, alkylenetetramethacrylate, alkylenebisacrylamide, and alkylenebismethacrylamide, or copolymers of these crosslinkable monomers and other polymerizable monomers. As a particularly suitable polymerizable monomer, divinylbenzene, hexatoluene, divinylether, divinylsulfone, alkylenetriacrylate, alkylenetetraacrylate, etc. are more preferably used.

With respect to the thermosetting resin constituting the above-mentioned fine particle comprising a thermosetting resin, it includes phenol-formaldehyde resins, melamine-formaldehyde resins, benzoguanamine-formaldehyde resins, urea-formaldehyde resins, epoxy resins, etc.

With respect to the elastic member constituting the above-mentioned fine comprising an elastic member, for example, natural rubber, synthetic rubber, etc. are used.

With respect to the material for the inorganic fine particles, it is not particularly limited, but include for example, silica, titanium oxide, iron oxide, cobalt oxide, zinc oxide, nickel oxide, manganese oxide, aluminum oxide, etc.

The particle size of the fine particles is preferably set in the range of 0.5 to 5000 $\mu$m, more preferably 0.5 to 2500 $\mu$m, and much more preferably 1 to 1000 $\mu$m. The variation coefficient of the fine particles is preferably set to not more than 50%, more preferably not more than 35%, much more preferably 20%, and the most preferably not more than 10%. Here, the variation coefficient means a value representing the standard deviation by the use of percentage based upon the average value; this is represented by the following formula:

variation coefficient=(standard deviation of particle sizes/average value of particle sizes)×100(%)

In general, the shifting speed of particles in a fluid receiving a centrifugal force have variations depending on the centrifugal effect, the difference in specific gravity between the particles and the fluid, the particle size and the viscosity of the fluid. For this reason, under a constant centrifugal effect, the greater the difference in specific gravity and the particle size, the faster the shifting speed. Accordingly, since the shifting speed of the particles becomes slower as the particle size of the fine particles to be plated becomes smaller, the fine particles used in the present invention 14 and invention 15 are preferably designed to have a greater difference in specific gravity from the plating solution.

With respect to the electroplating layer, it is not particularly limited, but includes for example, an electroplating layer, etc. comprising at least one kind of metal selected from the group consisting of gold, silver, copper, platinum, zinc, iron, lead, tin, aluminum, cobalt, indium, nickel, chromium, titanium, antimony, bismuth, germanium, cadmium and silica.

Referring to Figures, the following description will discuss one embodiment of a manufacturing method for conductive fine particles of the present inventions of 14 and 15.

FIG. 11 shows one example of a manufacturing device for conductive fine particles that is preferably used in the manufacturing method for conductive fine particles in the present invention 14.

The manufacturing device for conductive fine particles, shown in FIG. 11, comprises a disk-shaped bottom plate 10 secured to the upper end of a perpendicular driving shaft 3; a porous member 21 that is placed on the outer circumferential upper face of the bottom plate 10 and that allows only a plating solution to pass there through; a contact ring 11 for conducting electricity placed on the upper face of the porous member 21; a hollow cover 1 having a trapezoidal cone shape with an opening 8 on its upper center portion; a rotatable treatment chamber 13 formed in a manner so as to sandwich the porous member 21 and the contact ring 11 between the outer circumferential portion of the hollow cover 1 and the bottom plate 10; a supply tube 6 for supplying the plating solution to the treatment chamber 13 through the opening 8; a container 4 for receiving the plating solution scattered from the pores of the porous member 22; a drain tube 7 for draining the plating solution accumulated in the container 4; and an electrode 2 inserted through the opening 8 to contact the plating solution. Here, in the manufacturing device for conductive fine particles having the above-mentioned construction, the contact ring 11 forms a cathode, the porous member 21 forms a filter section, and the electrode 2 forms an anode.

The plating solution, subjected to a centrifugal force due to the rotation of the driving shaft 3, is allowed to pass the porous member 21, and scattered into the plastic container 4, with the result that the liquid level of the plating solution into the treatment chamber 13 drops; therefore, in order to compensate for the reduction, the amount of the liquid is monitored by a level sensor 5 so that the plating solution is supplied to the treatment chamber 13 from the supply tube 6 for supplying the plating solution through the opening 8 and the liquid level into the treatment chamber 13 is always made to contact an electrode 2a. In FIG. 1, reference numeral 2 represents a positive electrode connected to the anode 2a. Reference numeral 9 is a contact brush. Here, a power supply used for the electrodes is not shown in the Figure.

In the present embodiment, the plating solution is supplied to the treatment chamber 13 from the plating solution supply tube 6, fine particles each having a conductive base layer formed thereon, are charged into the treatment chamber 13 through the opening 8 of the hollow cover 1, and dispersed therein. Since the plating solution passes through the porous member 21 and goes out of the treatment chamber 13 subjected to the rotation of the driving shaft 3, the plating solution supply tube 6 compensates for the amount of the reduction. Other plating conditions are not particularly distinct from general plating operations.

The above-mentioned porous member 21 is a filter-shaped porous member having communicating bubbles formed by plastics or ceramics, and those having a pore size that allows only the plating solution such as a plating solution to pass there through, but does not allow fine particles and conductive fine particles to do are adopted; and it is preferred that those have a construction in which a filter sheet 20 having a pore size that allows only a plating solution to pass there through is placed on the upper face of the plate-shaped porous support 22.

In order to form a more uniform plating layer, it is preferable to reverse in its rotation direction or to stop the rotation of the driving shaft 3 in each predetermined time. The number of revolutions and the operation pattern may be the same in both of the forward rotation time and the reverse rotation time, or may be different within the scope of the present invention.

Referring to a time chart of operation conditions shown in FIG. 2, the following description will discuss one embodiment of a manufacturing device for conductive fine particles of the present invention in which the manufacturing device for conductive fine particles shown in FIG. 11 is used.

First, organic resin fine particles having a specific gravity of 1.23 and a particle size of 650 $\mu$m, each having an electroless nickel plating layer formed on its surface, are loaded into the treatment chamber 13 having a Watt bath having a specific gravity of 1.11 served as a plating solution. In this case, the difference in specific gravity between the fine particles and the Watt bath is 0.05. Next, the treatment chamber 13 is accelerated for one second. After the treatment chamber 13 has reached a peripheral velocity of 226 m/min, it is rotated constantly at this velocity. Three seconds after the start of the constant rotation (4 seconds after the start of the rotation of the treatment chamber 13, that is, the particle shifting time is determined at 4 seconds), a rectifier is turned on so that power application is started and a plating process is carried out. The power application time is 5 seconds. Thereafter, the treatment chamber 13 is decelerated in one second, and stopped for one second. These operations constitute one cycle, and the treatment chamber 13 is reversed in its rotation for each cycle to carry out the plating process.

Here, in the manufacturing device for conductive fine particles used in the present embodiment, the porous member 21 has a construction in which a filter sheet 20 made from nylon having a pore size of 10 $\mu$m and a thickness of 10 $\mu$m is affixed to the upper surface of a plate-shaped porous support 22 formed by high-density polyethylene having a pore size of 100 $\mu$m and a thickness of 6 mm.

The present invention 16 relates to conductive fine particles, and an anisotropic, a conductive adhesive and a conductive connecting element utilizing the particles.

The conductive fine particles of the present invention 16 has a particle size in the range of 0.5 to 5000 $\mu$m. When particles having a particle size of less than 0.5 $\mu$m exist, the conductive fine particles are not allowed to contact the electrodes to be connected between these, resulting in a gap between the electrodes and the subsequent malconnection. The particle size exceeding 5000 $\mu$m fails to make a minute conductive connection; thus, it is limited to the above-mentioned range.

This is preferably set in the range of 0.5 to 2500 $\mu$m, more preferably 1 to 1000 $\mu$m, much more preferably 5 to 300 $\mu$m, in particular preferably 10 to 100 $\mu$m, and the most preferably 20 to 50 $\mu$m.

The conductive fine particles of the present invention 16 has a variation coefficient of not more than 50%. The variation coefficient is represented by the following formula:

$$(\sigma/Dn) \times 100$$

$\sigma$ represents the standard deviation of the particle size, and Dn represents the number average particle size.

The variation coefficient exceeding 50% makes the particles ununiform, with the result that upon making the electrodes contact with each other through the conductive fine particles in a step described later, a great number of particles are left untouched, thereby causing the possibility of leakage between the electrodes; therefore, it is limited to the above-mentioned range.

This is preferably set at not more than 35%, more preferably not more than 20%, much more preferably not more than 10%, and the most preferably not more than 5%.

The conductive fine particles of the present invention 16 has an aspect ratio of less than 1.5. The aspect ratio refers to a value that is obtained by dividing the average major diameter by the average minor diameter of particles. The aspect ratio not less than 1.5 makes the particles ununiform, with the result that upon making the electrodes contact with each other through the conductive fine particles, a great number of particles are left untouched, thereby causing the possibility of leakage between the electrodes; therefore, it is limited to the above-mentioned range.

This is more preferably set to less than 1.1, more preferably less than 1.05.

The above-mentioned particle size, aspect ratio and variation coefficient related to the conductive fine particles of the present invention 16 can be measured by observation using an electronic microscope.

The conductive fine particles of the present invention 16 are not particularly limited as long as they are particles whose outer surface is plated; and, for example, those coated with an organic compound, a resin, or an inorganic substance, etc. may be used.

The conductive fine particles of the present invention 16 allow electric currents to flow from one of the electrodes to the other when pressed in a sandwiched manner between a plurality of electrodes, and since their outer surface is plated, the current capacity upon connection is increased.

The above-mentioned plating is preferably carried out by using a noble metal. In the case of plating without noble metal, oxidation occurs on the contact face to the electrode when exposed to heating and cooling cycles or a high temperature and high moisture state for a long time, resulting in an extreme increase in the connection resistivity and the subsequent degradation in reliability. With respect to the above-mentioned noble metal, in particular, gold, platinum and palladium are preferably used.

The above-mentioned plating may be curried out with a low-melting-point metal having a melting point of not more than 300° C., such as, for example, solder and a tin alloy. In this case, in order to obtain a sufficient metal bonding, the thickness of the plating is set to preferably not less than 0.2 $\mu$m, and more preferably 3 to 30 $\mu$m.

In the case when the outer surface of each of the conductive fine particles of the present invention 16 is subjected to plating, a conductive layer formed by the electroless plating and the like is preferably formed as a base layer and from the viewpoint of conductivity and easiness in plating, the conductive layer is preferably provided by the electroless plating using nickel, copper, or silver.

When the outer surface of each of the conductive fine particles of the present invention 16 is subjected to plating, an electroplating is preferably adopted as the plating, and the method of the electroplating is not particularly limited; and with viewpoint of carrying out more uniform plating easily, a rotatable plating device, which has a cathode on the outer circumferential portion thereof and an anode placed so as not to contact the cathode, is preferably used to carry out the electroplating. More preferably, a plating device, which has a filter section on its outer circumferential portion and carries out plating while rotating and supplying a plating solution, is used to carry out the electroplating.

In the above-mentioned plating, the thickness of the plating is set in the range of 0.001 to 50 μm. The thickness less than 0.001 μm fails to obtain a sufficient electric capacity, and the thickness exceeding 50 μm fails to sufficiently demonstrate the performance of the base material. More preferably, it is set in the range of 0.01 to 10 μm, and much more preferably 0.2 to 3 μm. With viewpoint of obtaining uniform particles, the variation coefficient of the plating thickness is set to not more than 20%, and more preferably not more than 10%.

The base material of the conductive fine particles of the present invention 16 is not particularly limited, but includes, resins, inorganic particles, metal particles, and mixtures thereof. In particular, those having a K value of 200 to 2000 kgf/m$^2$, and more preferably 300 to 500 kgf/m$^2$, a recovery rate of not less than 10%, and more preferably, not less than 50%, a variation coefficient of particle size of not less than 5% and an aspect ratio of less than 1.05 are preferably used. In the case of low K value and recovery rate, malconnection may occur due to impacts and cooling and heating cycles. In contrast, in the case of a high K value, the electrodes may be damaged.

The anisotropic conductive adhesive of the present invention 16 is obtained by dispersing the conductive fine particles of the present invention 16 in an insulating resin. The anisotropic conductive adhesive includes an anisotropic conductive film, anisotropic conductive paste, anisotropic conductive ink, etc.

With respect to a binder resin for the anisotropic conductive adhesive, not particularly limited, but includes for example, thermoplastic resins such as acrylic resins, ethylene-vinylacetate copolymerization resin and styrene-butadiene block copolymer resin, and compositions set by heat and/or light, such as setting agents and setting resin compositions of monomers and oligomers having a glycidyl group and isocyanate.

The thickness of a coat film of the anisotropic conductive adhesive is preferably set to 10 to several hundreds μm.

With respect to an object to be connected by using the anisotropic conductive adhesive of the present invention 16, there can be mentioned parts and the like of substrates and semiconductors. Electrode sections are respectively formed on the surface of these parts. The present invention 16 includes constructions connected by the anisotropic conductive adhesive of the present invention 16.

The above-mentioned substrates are classified into flexible substrates and rigid substrates. A resin sheet having a thickness of 50 to 500 μm is used as the flexible substrate, and, for example, polyimide, polyamide, polyester, polysulfone, etc. are used as the resin sheet.

The above-mentioned rigid substrates are classified into those formed by resins and those formed by ceramics. Examples of those formed by resins include glass fiber reinforced epoxy resins, phenol resins, cellulose fiber reinforced phenol resins, etc. Examples of those formed by ceramics include silicon dioxide, alumina, etc.

The above-mentioned substrate structure may be a monolayer structure, or a multi-layer substrate in which a plurality of layers are formed, for example, by means of formation of through holes, etc., with electrical connection being made with each other, in order to increase the number of electrodes per unit area.

With respect to the above-mentioned parts, they are not particularly limited, but include example, active parts for semiconductors, etc., such as transistors, diodes, ICs and LSIs, and passive parts, etc., such as resistors, capacitors and quartz oscillators.

Electrodes are formed on the surface of each of the above-mentioned substrates and parts. The shape of the above-mentioned electrodes is not particularly limited but includes those having a striped shape, a dot shape, or a desired shape, are used.

With respect to the material of the electrodes, examples thereof include gold, silver, copper, nickel, palladium, carbon, aluminum, ITO, etc. In order to reduce its contact resistivity, those having a gold coat on copper, nickel, etc., may be used.

The thickness of the electrodes is preferably set in the range of 0.1 to 100 μm. The width of the electrodes is preferably set in the range of 1 to 500 μm.

The conductive fine particles of the present invention 16 may be dispersed at random in the anisotropic conductive adhesive of the present invention 16, or may be placed at specific positions. In the case of the random dispersion, the electrodes can be generally electrically connected in a universal manner, and in particular, in the case of the specific distribution, electrical connection can be made efficiently.

The method for electrically connecting the opposing two electrodes with opposite phases by using the conductive fine particles in the present invention 16 may be a method in which the anisotropic conductive adhesive, the binder resin and the conductive fine particles are used in a separated manner.

With respect to the method for using the anisotropic conductive adhesive of the present invention 16, for example, on a substrate or a part having electrodes formed on its surface, the anisotropic conductive film of the present invention 16 is placed, and a substrate or a part having an opposing electrode face is then placed, and followed by heating and pressing. In place of the anisotropic conductive film, a predetermined amount of the anisotropic paste may be applied by a printing means such as screen printing and a dispenser. In the above-mentioned heating and pressing processes, a pressing device, a bonding machine, etc., having a heater, are used.

A method without using the anisotropic conductive film or the anisotropic conductive paste may be proposed, for example, a method wherein liquid binder is injected into a gap between the two electrode sections joined by using the conductive fine particles, and followed by curing. In the connection structure obtained by the above-mentioned method, since electroplating particles having a superior conductive property are used as the conductive fine particles, a greater electric current can be stably provided.

Moreover, by the application of particles having an appropriate average particle size, leakage hardly occurs on the opposing electrodes with opposing phases, and by limiting the variation coefficient and aspect ratio, non-contact particles are hardly generated so that leakage hardly occurred between the electrodes, when making the electrodes contact with each other through the conductive fine particles.

Furthermore, in the case of noble metal or low-melting-point metal plating, even when exposed to heating and cooling cycles or a high-temperature, high moisture state for a long time, oxidation hardly occurs on the contact face, etc. to the electrodes; therefore, it is not likely to occur large increase in the connection resistivity, or degradation in the reliability. Therefor, the reliability for a long time can be ensured even under such conditions.

The following description will discuss the electronic circuit parts, etc. of the present invention 17. Hereinafter, the simple term "the present invention" refers to the electronic circuit parts, the related electronic circuit substrates, the electronic circuit elements, etc. of the present invention 17.

In the present specification, "electronic circuit elements" refer to semiconductor elements having electrodes formed thereon, and for example, diodes, transistors, ICs, LSIs, SCRs (Silicon Controlled Rectifier), photoelectric elements, solar batteries, light-emitting diodes (LED), etc. are listed. In particular, examples of ICs include bear chips, package type ICs, chip size packages (CSP), etc., and also include hybrid ICs and multi chip modules (MCM) that are manufactured in combination with elements other than semiconductors, such as resistors, capacitors, inductors and quartz oscillators.

Electrodes for the above-mentioned electronic circuit elements are manufactured by, for example, the vapor deposition method or the sputtering method, and examples of the material for the electrodes include metals such as aluminum and copper, and alloys such as nickel-chromium-gold, nickel-chromium-copper, chromium-gold, nickel-chromium-palladium-gold, nickel-chromium-copper-palladium-gold, molybdenum-gold, titanium-palladium-gold, titanium-platinum-gold, etc.

With respect to the layout of the electrodes on the electronic circuit element, those of the peripheral type and the area type or the mixed type thereof can be mentioned.

In the present specification, "electronic circuit substrates" means those substrates having electrodes formed thereon which are used by placing the above-mentioned electronic circuit elements thereon, and examples thereof include; printed wiring substrates formed by paper phenol resin, glass epoxy resin, or glass polyimide resin, as a base; flexible printed wiring substrates formed by polyimide, or saturated polyester resin; and ceramics substrates. Moreover, they also include packages formed by resins or ceramics which are used for packaging bear chips.

In the present specification, "electronic circuit parts" refer to those parts that are constituted by the electronic circuit substrates on which the above-mentioned electronic circuit elements are placed and that are utilized as parts in the electronics field, and with respect to the packaging system used in their manufacturing process, for example, flip chips, BGAs, etc. are preferably used.

The present invention 17 relates to an electronic circuit part which is formed by electrically connecting electrode sections of an electronic circuit element and electrode sections of an electronic circuit substrate, wherein the connection is formed by applying a laminated conductive fine particle provided with a conductive metal layer on the surface of each of spherical elastic base particles, at each connecting section between the electrode section of the electronic circuit element and the electrode section of the electronic circuit substrate, the electrical connection is formed by a plurality of laminated conductive fine particles per connecting section, and the connection is formed by using double laminated conductive fine particles provided with the conductive metal layer around each of the spherical elastic base particles, a low-melting-point metal layer around the conductive metal layer, and at each connecting section between the electrode section of the electronic circuit element and the electrode section of the electronic circuit substrate, the electrical connection is formed by a plurality of laminated conductive fine particles per connecting section.

Moreover, the present invention 17 also relates to the above-mentioned electronic circuit part wherein the thickness of the conductive metal layer (t: unit mm) is represented by the following [formula 1].

$$P \times D / \sigma < t < 0.2 \times D \quad \text{[Formula 1]}$$

where P is a constant based on pressure unit, 0.7 Kg/mm², D is the diameter (unit: mm) of an elastic base particle, and σ is a tensile strength (unit: Kg/mm²) of a metal material forming the conductive metal layer, the tensile strength being measured under the condition that the sheet-shaped material having a thickness of 0.5 to 2 mm is tested at a tensile speed of 10 mm/min. by a tensile tester.

The present invention 17 relates to an electronic circuit part that is formed by electrically connecting electrode sections of an electronic circuit element and electrode sections of an electronic circuit substrate, wherein the connection is formed by applying laminated conductive fine particles provided with a conductive metal layer around each of spherical elastic base particles, at each contact section between the conductive metal layer of the laminated conductive fine particle and the electrode section of the electronic circuit element, the electrical connection is formed by one laminated conductive fine particle per each contact section, and at each contact section between the conductive metal layer of the laminated conductive fine particle and the electrode section of the electronic circuit substrate, the electrical connection is formed by one laminated conductive fine particle per each contact section, and the above-mentioned connection is formed by using double laminated conductive fine particles provided with the conductive metal layer around each of the spherical elastic base particles and a low-melting-point metal layer around the conductive metal layer, and at each contact section between the conductive metal layer and the low-melting-point metal layer of the double laminated conductive fine particle and the electrode section of the electronic circuit element, the electrical connection is formed by one double laminated conductive fine particle per contact section, and at each contact section between the conductive metal layer of the double laminated conductive fine particle and the electrode section of the electronic circuit substrate, the electrical connection is formed by one double laminated conductive particle per each contact section.

Figure 39:
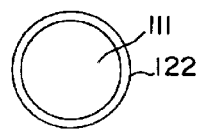
FIG. 39 is a cross-sectional view that schematically shows laminated conductive fine particles of the present invention 17.
Figure 40:
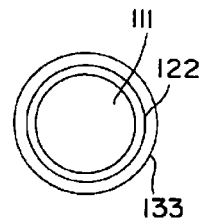
FIG. 40 is a cross-sectional view that schematically shows double laminated conductive fine particles of the present invention 17.

In the present invention 17, the laminated conductive fine particles and/or the double laminated conductive fine particles are used. In the present specification, the laminated conductive fine particles and the double laminated conductive fine particles are also collectively referred to as conductive fine particles. The above-mentioned laminated fine particle comprises a spherical elastic base particle 111 and a conductive metal layer 2 (FIG. 39). The above-mentioned double laminated conductive fine particle comprises a spherical elastic base particle 111, a conductive metal layer 222 and a low-melting-point metal layer 333 (FIG. 40).

With respect to the spherical elastic base particle, it is not particularly limited as long as it is a material having elasticity, and examples thereof include particles formed by a resin material or an organic-inorganic hybrid material, etc. The resin material is not particularly limited, but includes for example, linear copolymers such as polystyrene, polymethylmethacrylate, polyethylene, polypropylene, polyethyleneterephthalate, polybutyleneterephthalate, polysulfone, polycarbonate, andpolyamide; anddivinylbenzene, hexatoluene, divinylether, divinylsulfone, diallylcarbinol, alkylenediacrylate, oligo or polyalkylene glycoldiacrylate, oligo or polyalkylene glycoldimethacrylate, alkylenetriacrylate, alkylenetetraacrylate, alkylenetrimethacylate, alkylenetetramethacrylate, alkylenebisacrylamide, and alkylenebismethacylamide, and network polymers obtained by polymerizing both-ends acryl denatured polybutadiene oligomer solely or together with other polymerizable monomer.

With respect to particles formed by the resin material, it is not particularly limited, but includes for example, thermosetting resins such as phenol-formaldehyde resins, melamine-formaldehyde resins, benzoguanamine-formaldehyde resins, urea-formaldehyde resins.

With respect to the organic-inorganic hybrid material, for example, the following materials are used: those materials obtained by forming a copolymer between acrylate or methacrylate with a silyl group on its side chain and a vinyl monomer such as styrene and methylmethacrylate, and then allowing the silyl group to undergo a condensation reaction; those materials obtained by allowing tetraethoxysilane, triethoxysilane, or diethoxysilane to undergo a sol-gel reaction in the coexistence of an organic polymer; and those materials obtained by allowing tetraethoxysilane, triethoxysilane, or diethoxysilane to undergo a sol-gel reaction, and then baking this at a low temperature, thereby allowing the organic components to remain.

The particle size of the spherical elastic base particles is preferably set to 5 to 700 $\mu$m, and more preferably 10 to 150 $\mu$m.

With respect to the particle size distribution of the spherical elastic base particles, a variation coefficient [(standard deviation)/(average particle size)×100] is preferably not more than 5%, and more preferably not more than 3%.

The above-mentioned spherical elastic base particles are preferably designed to have a thermal conductivity of not less than 0.30 W/m·K.

The conductive fine particles used in the invention 17 are allowed to exert a superior performance when the thickness of the conductive metal layer (t: mm) satisfies the following [formula 1].

$$P \times D/\sigma < t < 0.2 \times D \qquad \text{[Formula 1]}$$

where P is a constant based on pressure unit, 1.0 Kg/mm$^2$, D is the diameter (unit: mm) of an elastic base particle, and $\sigma$ is a tensile strength (unit: Kg/mm$^2$) of a metal material forming the conductive metal layer, and the tensile strength is measured under the condition that the sheet-shaped material having a thickness of 0.5 to 2 mm is tested at a tensile speed of 10 mm/min. by a tensile tester.

Thus, in the case of the thickness t of the conductive metal layer of not more than P×D/$\sigma$, the conductive metal layer is not allowed to resist the thermal expansion of the elastic base particles upon heat application, and the degradation in performance such as cracking and fatigue destruction is consequently occurred. In contrast, in the case of the thickness t of not less than 0.2×D, in response to the shearing stress that the conductive fine particles receive, which will be described later, the elastic base particles hardly receive an elastic shearing deformation beyond its recovery, with the result that an excessive stress is applied to the connection section between the conductive metal layer of the conductive fine particles and the electronic circuit element as well as the conductive circuit substrate, resulting in degradation in the connecting reliability.

Since the lower limit value of the thickness t of the conductive metal layer is represented by P×D/$\sigma$, this is inversely proportional to the tensile strength of the conductive metal layer; therefore, the more the tensile strength increases, the lower limit value decreases. In the case of formation of the conductive metal layer formed by nickel, since the tensile strength is approximately 85 Kg/mm$^2$, P×D/$\sigma$ is approximately 0.0012 mm in the case when D is 100 $\mu$m.

The kind of the metal constituting the conductive metal layer is not particularly limited, but includes for example, those materials containing at least one kind selected from the following group consisting in nickel, palladium, gold, silver, copper, platinum, and aluminum.

With respect to the conductive metal layer, those comprising a plurality of metal layers provide desirable results, as compared with those made of a single metal layer.

With respect to the formation method of the conductive metal layer, dry plating methods such as vacuum vapor deposition and sputtering, and wet plating methods such as electroless plating and electroplating, are used. In particular, the wet plating methods are more preferably used, and the most preferable results are obtained when a metal layer formed by electroless plating and a metal layer formed by electroplating are concomitantly used.

Figure 41:
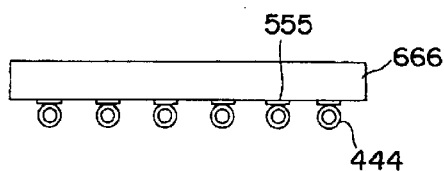
FIG. 41 is a cross-sectional view that schematically shows an electronic circuit element of the present invention on which laminated conductive fine particles are stacked.

The above-mentioned electroplating is carried out by using a plating device as illustrated in FIG. 41. Thus, the electroplating layer is formed on the surface of each particle by plating process, wherein the plating device comprises a disk-shaped bottom plate secured to the upper end of a perpendicular driving shaft; a porous member that is placed on the outer circumferential upper face of the bottom plate and that allows only a plating solution to pass there through; a contact ring for conducting electricity placed on the upper face of the porous member; a hollow cover of a trapezoidal cone shape having an opening on its upper center portion, to the upper end of which a hollow cylinder having the same pore diameter as the opening diameter is joined, with the upper end of the hollow cylinder being bent toward the inner wall side of the hollow cylinder; a rotatable treatment chamber formed in a manner so as to sandwich the porous member and the contact ring between the outer circumferential portion of the hollow cover and the bottom plate; a supply tube for supplying the plating solution to the treatment chamber through the opening; a container for receiving the plating solution scattered from the pores of the porous member; a drain tube for draining the plating solution accumulated in the container; and an electrode inserted through the opening to contact with the plating solution, and in this device, spherical elastic base particles, which have been preliminarily subjected to a pre-treatment, for example, an electroless plating process, are loaded into the treatment chamber, and a plating process is carried out by rotating the treatment chamber centered on its rotation shaft while a plating solution is being supplied to the treatment chamber and power is being applied thereto.

The low-melting-point metal layer is preferably formed with a thickness of 3 to 50% of the particle size of the spherical elastic base particle. The thickness exceeding 50% causes not only a reduction in the elastic property of the conductive fine particles, but also a problem in which upon melting down, the low-melting-point metal layer shifts in the horizontal direction resulting in a bridge phenomenon between the adjacent electrodes. In contrast, the thickness of the low-melting point metal layer of less than 3% sometimes cause a problem of weak connecting strength between the conductive metal layer of the conductive fine particles and the electrode section of the electronic circuit element or the conductive circuit substrate.

The above-mentioned low-melting-point metal layer is formed by metals having a melting point of not more than 260° C. Examples of the low-melting-point metals include not less than one element selected from the group consisting of tin, lead, bismuth, silver, zinc, indium, and copper. In the case when an alloy layer is used as the low-melting-point metal layer, the low-melting-point metal layer containing tin as its main component is preferable, and that containing tin as the main component and not less than one element selected from the group consisting of lead, bismuth, silver, zinc, indium and copper, is more preferable. The low-melting-point metal layer may comprise a plurality of metal layers.

The formation of the low-melting-point metal layer is carried out by using wet plating methods such as electroless plating and electroplating, and in particular, the electroplating method is preferably used together with the above-mentioned electroplating device.

Next, the following description will discuss a manufacturing method for an electronic circuit part using the above-mentioned conductive fine particles.

Figure 42:
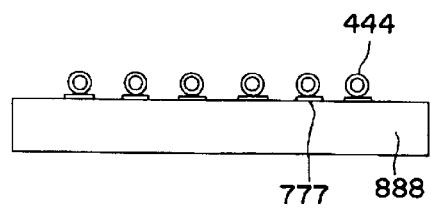
FIG. 42 is a cross-sectional view that schematically shows an electronic circuit substrate of the present invention on which laminated conductive fine particles are stacked.

In the case when an electronic circuit part comprising the electronic circuit elements and the electronic circuit substrates is manufactured by using the laminated conductive fine particles provided with the conductive metal layer around each of the spherical elastic base particles, a conductive material, formed by either a conductive adhesive or cream solder, is placed on either of the electrode sections of the electronic circuit element or the electrode section of the electronic circuit substrate, and the conductive fine particles are placed on said electrode section, and then the conductive metal layer of the conductive fine particles and the electrode section are electrically connected by heating. FIG. 41 schematically shows the electronic circuit element on which the laminated conductive fine particles are placed. Moreover, FIG. 42 schematically shows the electronic circuit substrate on which the laminated conductive fine particles are placed.

Next, the conductive material comprising either a conductive adhesive or cream solder is placed on the other electrode section of the electronic circuit element or the electrode section of the electronic circuit substrate, and this is then superposed on the conductive fine particles which have already been joined, and heated; thus, electrical connection is formed. In this manufacturing process, since it is not necessary to apply any high pressure, no damage is given to the performance of the IC chip. Upon placing the laminated conductive fine particles on either of the electrode sections of the electronic circuit element or the electrode section of the electronic circuit substrate, a mold having recesses each of which is smaller than the diameter of the conductive fine particle is placed on the position corresponding to the electrode section of either the electrode circuit element or the electrode section of the electronic circuit substrate, and the conductive fine particles are positioned on the recesses of this mold. Next, after adhering liquid has been applied to one portion of the exposed surfaces of the conductive fine particles positioned on the mold, the conductive fine particles are transferred on the electrode section by allowing the mold to contact the one of the electrode sections. Accordingly, the conductive fine particles are not placed at positions other than the electrode sections, and a reduction in the insulating resistivity between the adjacent electrodes can be prevented.

Figure 43:
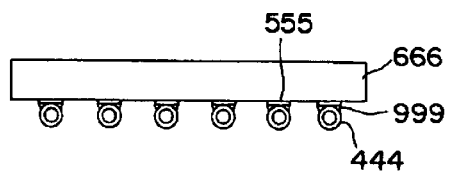
FIG. 43 is a cross-sectional view that schematically shows an electronic circuit element of the present invention on which double laminated conductive fine particles are stacked.
Figure 44:
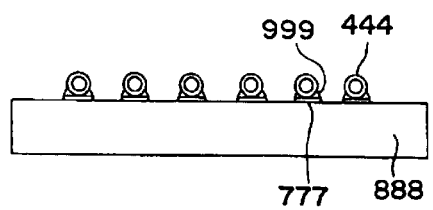
FIG. 44 is a cross-sectional view that schematically shows an electronic circuit substrate of the present invention on which double laminated conductive fine particles are stacked.

Moreover, in the case when an electronic circuit part comprising the electronic circuit elements and the electronic circuit substrates is manufactured by using the double laminated conductive fine particles provided with the conductive metal layer and the low-melting-point metal layer around each of the spherical elastic base particles, the double laminated conductive fine particles are first placed on either the electrode section of the electronic circuit element or the electrode section of the electronic circuit substrate, and by heating to the vicinity of the electrode section on which the double laminated conductive fine particles are placed, the low-melting-point metal layer of the double laminated conductive fine particle is allowed to melt down so that the conductive metal layer of the double laminated conductive fine particle and the electrode section are electrically connected. FIG. 43 schematically illustrates the electronic circuit element on which the double laminated conductive fine particles are placed. Moreover, FIG. 44 schematically illustrates the electronic circuit substrate on which the double laminated conductive fine particles are placed.

Next, by cooling while the electric connection is maintained, the electric connection is secured, and the other electrode section is superposed onto the double laminated conductive fine particles secured on the one of the electrode section and heated so that the low-melting-point metal layer is allowed to melt down and the other electrode section and the double laminated conductive fine particles secured on the electrode section are electrically connected, and then the connection is maintained to be secured, by cooling. In this manufacturing process also, it is not necessary to apply any high pressure.

In the case when the double laminated conductive fine particles are placed on either the electrode section of the electronic circuit element or the electrode section of the electronic circuit substrate, the above-mentioned mold is also used in the same manner as the case in which the laminated conductive fine particles are placed.

With respect to another manufacturing method for electronic circuit parts, a method has been proposed, in which onto either the electrode section of the electronic circuit element or the electrode section of the electronic circuit substrate, one conductive fine particle, coated with a conductive metal layer around the periphery of a spherical elastic base particle, is heated and pressed to be placed thereon; thus, the conductive metal layer of the conductive fine particle and the electrode section are allowed to maintain the electric connection by the conductive material.

In the electronic circuit part manufactured as described above, the above-mentioned connection is formed by using the conductive fine particles provided with the conductive metal layer or the conductive metal layer and the low-melting-point metal layer around the spherical elastic base particle, and at the connecting section between the conductive metal layer of the conductive fine particle and the electrode section of the electronic circuit element, connection is electrically formed by a conductive fine particle per a contact section, and at the connecting section between the conductive metal layer of the conductive fine particle and the electrode section of the electronic circuit substrate, connection is electrically formed by one conductive fine particle per each contact section.

Figure 45:
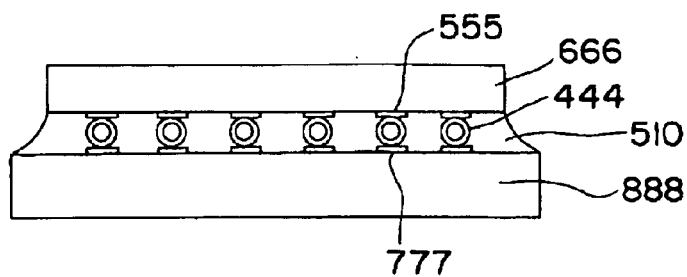
FIG. 45 is a cross-sectional view that schematically shows an electronic circuit part of the present invention.
Figure 46:
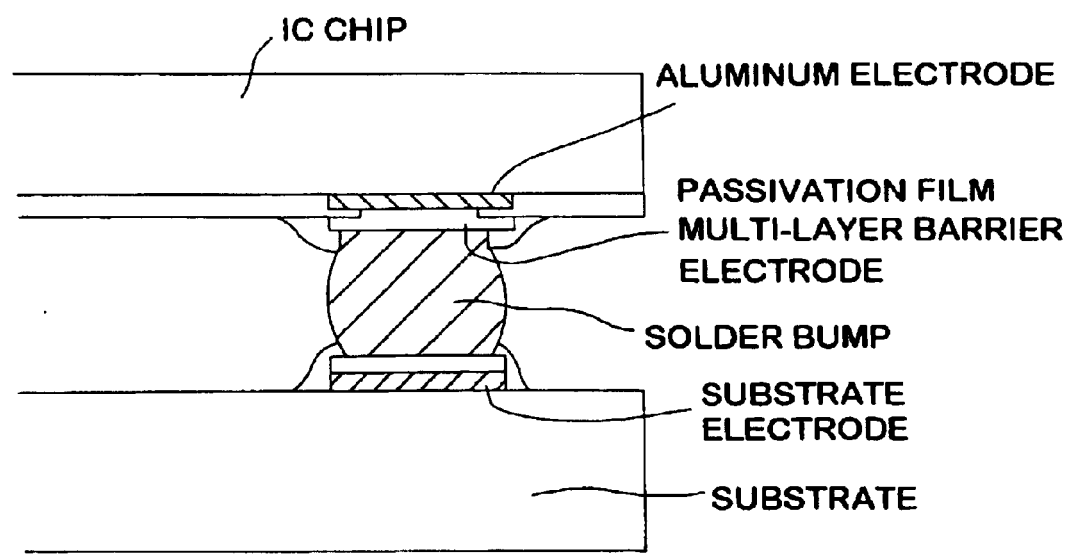
FIG. 46 is an explanatory drawing that schematically shows a flip chip bonding method using solder bumps.
Figure 47:
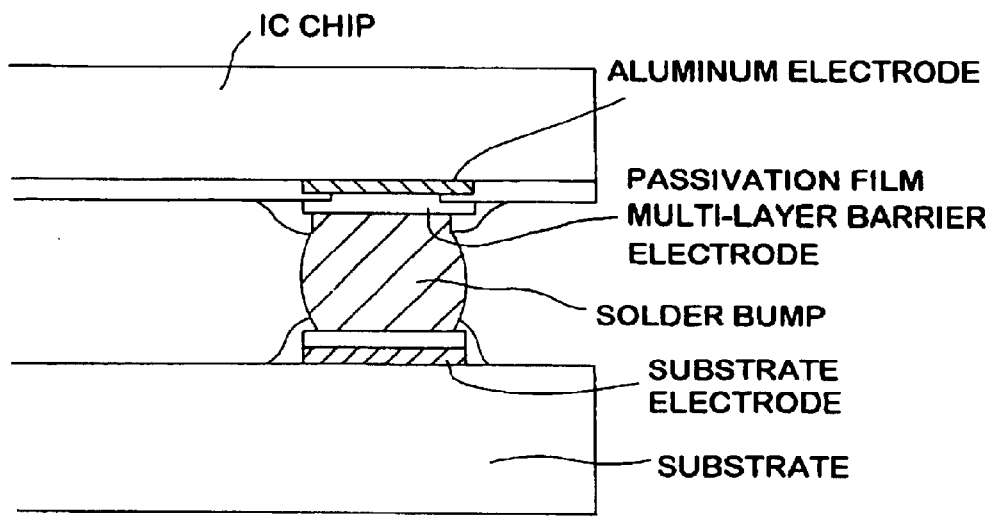
FIG. 47 is an explanatory drawing that schematically shows a flip chip bonding method using solder coat balls each having a highly rigid core.
Figure 48:
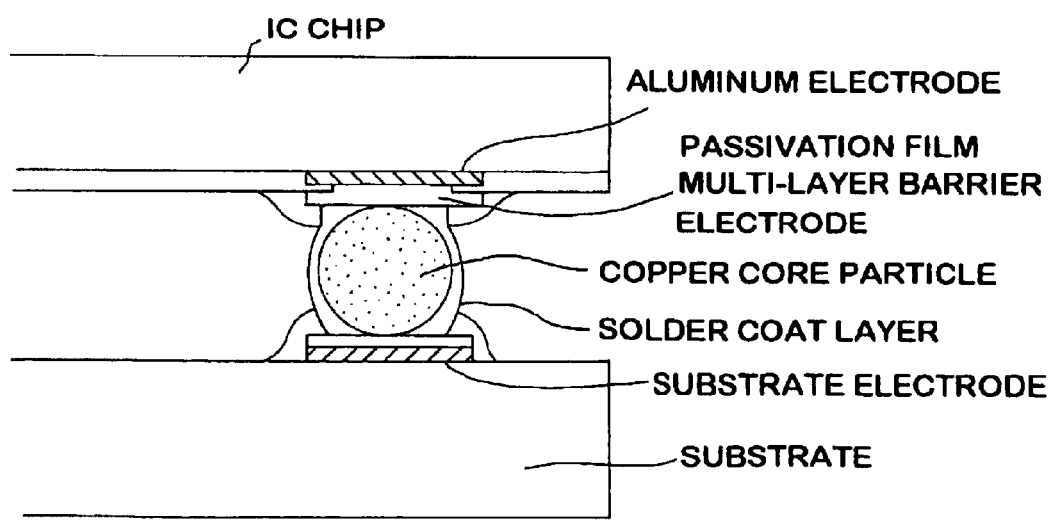
FIG. 48 is an explanatory drawing that schematically shows a flip chip bonding method using a bump transfer system.
Figure 49:
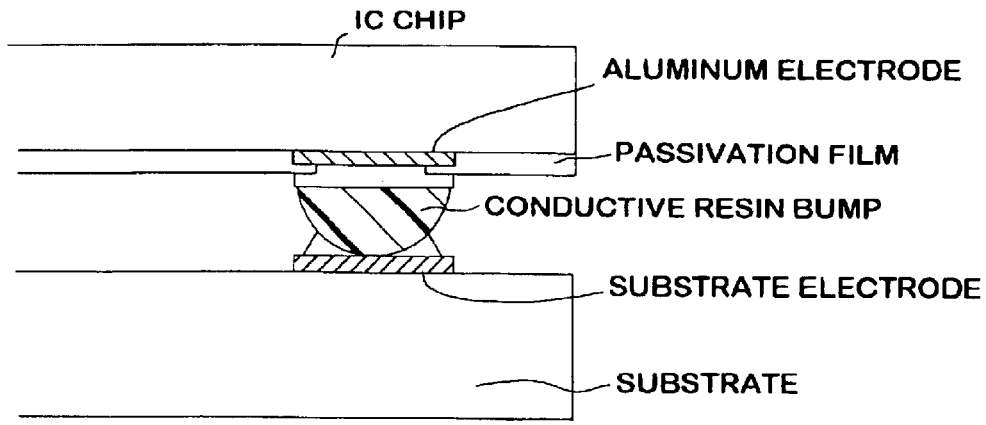
FIG. 49 is an explanatory drawing that schematically shows a flip chip bonding method using bumps formed by conductive resin.
Figure 50:
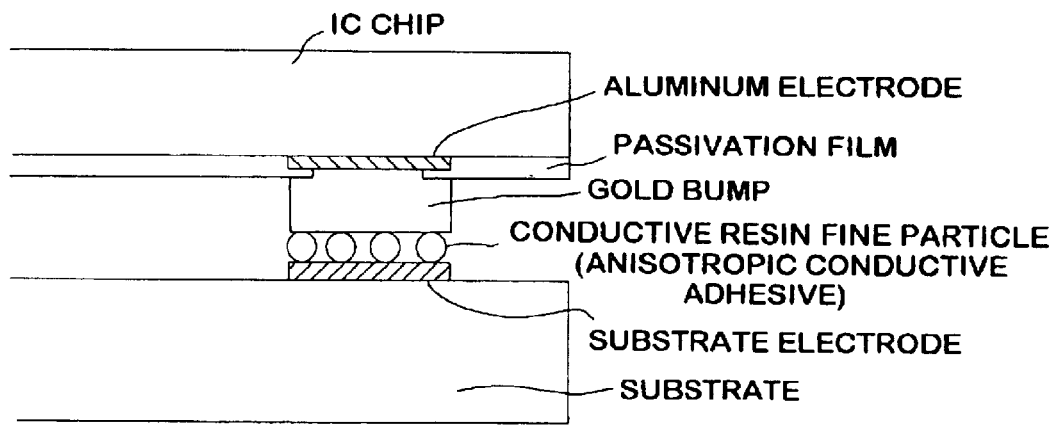
FIG. 50 is an explanatory drawing that schematically shows a flip chip bonding method using an anisotropic conductive adhesive.
Figure 51:
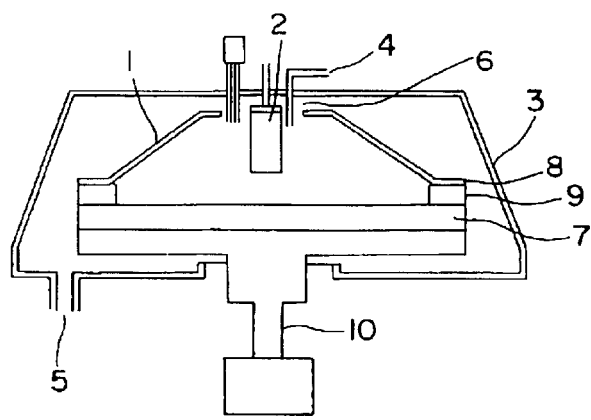
FIG. 51 is an explanatory drawing that schematically shows an electroplating device used in the present invention, wherein respective reference numerals are used in the drawing.

FIG. 45 schematically shows an electronic circuit part of the present invention.

In this electronic circuit part, upon heating or cooling, of the electrode section of the electronic circuit element and the base electrode section of the electronic circuit substrate, one is dislocated in parallel with the other due to the difference in the thermal expansion coefficient between the above-mentioned electronic circuit element and the electronic circuit substrate.

For this reason, the conductive fine particles are subjected to a shearing deformation, but in this case, since the spherical elastic base particle is elastically subjected to the shearing deformation, and this deformation can be recovered in the electronic circuit part using the conductive fine particles, a shearing stress, exerted on the connecting interface between the conductive metal layer of the conductive fine particles and the electrode section of the electronic circuit element or the electrode section of the electronic circuit substrate, is reduced, thereby improving the connecting reliability.

This reducing effect to the shearing stress can be measured and evaluated by using a bonding tester (PTR-10 type, Leska K.K.). With respect to the measurement samples, the conductive fine particles connected to and secured on the electronic circuit substrates are used. The electronic circuit substrate to which the conductive fine particles are connected and secured is attached to a stage, a tool for shear test is placed perpendicular to the stage, and while keeping in contact with the side face of the conductive fine particles, the stage is shifted so that a shearing stress is exerted on the connecting interface between the conductive metal layer of the conductive fine particles and the electrode section of the electronic circuit substrate.

The amount of elastic strain that can be recovered represents the capability of recover from the shearing deformation. Here, in the conductive fine particles of the present invention, the base particles having a sufficient elasticity are used; therefore, the elastic strain that can be recovered is greater so that a greater capability of recover from the shearing deformation can be provided.

In the electronic circuit part of the present invention, even in the case when, of the electrode section of the electronic circuit element and the electrode section of the electronic circuit substrate, one is dislocated in parallel with the other due to the physical force of parallel direction, since the conductive fine particles of the present invention have a greater recovering capability from shearing deformation, they can be recovered even upon receipt of such a dislocation, thereby providing high connecting reliability.

Moreover, in the electronic circuit part of the present invention, the conductive fine particles which contain base particle having a sufficient elasticity are used; therefore, since the peel strength F from the electrode section against the strain deformation of the conductive fine particles is great as shown in the following [formula 2], the conductive fine particles are hard to peel even upon receipt of a great dislocation, thereby maintaining the electrical connection, and consequently to provide high connecting reliability.

$$500 \times D' \times D'(\text{gr/mm} \cdot \text{mm}) < F < 8000 \times D' \times D'(\text{gr/mm} \cdot \text{mm}) \quad \text{[Formula 2]}$$

wherein D' represents the diameter (unit: mm) of the conductive fine particles.

In the electronic circuit part of the present invention, the distance between the electrode section of the electronic circuit element and the electrode section of the electronic circuit substrate is preferably set to 90 to 100% of the diameter of the conductive fine particles.

In the case of the distance of less than 90%, the distance between the electrode section of the electronic circuit element and the electrode section of the electronic circuit substrate is too close, sometimes resulting in deformation of the conductive fine particles and the subsequent deterioration in the electrical connection. When the distance exceeds 100%, the conductive fine partices is likely to run det contact deterioration with the electronic circuit element or the electronic circuit substrate, thereby deterioration in the electrical connection may occur.

Moreover, in the electronic circuit part of the present invention, the limit value of the current flowing between the electrode section of the electronic circuit element and the electrode section of the electronic circuit substrate is extremely great, that is, 0.5 to 10 Amp per electrode section; therefore, even in the case of a large current flowing between these electrodes, no damage is given to the electrode sections and the conductive fine particles, thereby ensuring high reliability. Moreover, in the present invention, connection is formed by using flip chip bonding and BGA bonding as well as using the conductive fine particles; therefore, so that high-density wiring to the electronic circuit element and the electronic circuit substrate can be provided.

BEST MODE FOR CARRYING OUT THE INVENTION

The following description will discuss the present invention in detail by means of examples; however, the present invention is not intended to be limited only by these examples.

EXAMPLE 1

A nickel plating layer is formed as a conductive base layer on each of organic resin fine particles obtained by copolymerizing styrene and divinylbenzene; thus, a nickel plating fine particle having an average particle size of 75.72 μm and a standard deviation of 2.87 μm was obtained. The resulting nickel plating fine particles (16 g) were subjected to nickel plating on their surface by using a manufacturing device for conductive fine particles shown in FIG. 1.

With respect to the porous member 12, a porous member having a pore size of 20 μm, formed by high-density polyethylene, was used. Metal nickel was used as the anode 2a.

A Watt bath was used as the plating solution. The composition of the applied Watt bath had a nickel concentration of 42 g/L, nickel sulfate 150 g/L, and boric acid 31 g/L.

Power was applied across the electrodes with a voltage of 14 to 15 V for 25 minutes, under the conditions that the temperature of the plating solution was 5° C., the current was 30 A, and the current density was 0.3 A/dm$^2$. The peripheral velocity of the treatment chamber was set at 300 m/min, and the rotation direction was reversed every 11 seconds.

During the rotation of the treatment chamber, the plating solution, which was subjected to a force in the outer circumferential direction due to the effect of a centrifugal force, formed a vortex having a mortar-like shape; however, there was no overflowing from the upper opening of the hollow cover 1.

The nickel plated resin fine particles having a nickel plated layer as the outermost layer thus obtained were observed under a microscope, and all the particles existed as individually isolated particles without any aggregation. Moreover, the average particle size of 100 of the nickel plated resin fine particles was 78.52 μm and the thickness of the nickel plated layer was 1.4 μm. The variation coefficient of the particle size was 2.7%, thereby indicating that the thickness of the nickel plated layer was extremely uniform.

Here, clogging occurred in the porous member, resulting in a particle loss of approximately 30%. After the plating test was repeated three times, clogging occurred too much, with the result that the porous member was no longer usable.

EXAMPLE 2 (COMPARATIVE EXAMPLE)

Plating was carried out in the same manner as Example 1 except that a conventional manufacturing device for conductive fine particles shown in FIG. 2 was used as the plating device, and that as illustrated in FIG. 8, a porous member, which was formed by affixing a nylon filter having a pore size of 10 μm onto the inner side surface on the treatment chamber side of a porous member having a pore size of 70 μm made from polypropylene, was used as the porous member 12.

When the treatment chamber was rotated, the plating solution, which was subjected to a force in the outer circumferential direction due to the effect of a centrifugal force, formed a vortex having a mortar-like shape, and rose gradually along the inner wall of the cover 1, with the result that the liquid was scattered from the opening 8 of the cover 1; consequently, the fine particles flowed (overflow) out of the treatment chamber together with the scattering plating solution, as a result failing to carry out plating.

However, after completion of the plating process, no clogging was found in the porous member.

Here, this Example 2 should be described as a comparative example.

EXAMPLE 3

Plating was carried out in the same manner as Example 1 except that a manufacturing device for conductive fine particles shown in FIG. 1 was used as the manufacturing device for conductive fine particles, and that as illustrated in FIG. 8, a porous member, which was formed by affixing a nylon filter having a pore size of 10 $\mu$m onto the inner side surface on the treatment chamber side of a porous member having a pore size of 70 $\mu$m made from polypropylene, was used as a porous member 12.

During the rotation of the treatment chamber, the plating solution, which was subjected to a force in the outer circumferential direction due to the effect of a centrifugal force, formed a vortex having a mortar-like shape; however, there was no overflowing from the upper opening of the hollow cover 1.

The nickel plated resin fine particles having a nickel plated layer as the outermost layer thus obtained were observed under a microscope, and all the particles existed as individually isolated particles without any aggregation. Moreover, the average particle size of 100 of the nickel plated resin fine particles was 78.72 $\mu$m and the thickness of the nickel plated layer was 1.5 $\mu$m. The variation coefficient of the particle size was 2.6%, thereby indicating that the thickness of the nickel plated layer was extremely uniform.

Here, no clogging was found in the porous member 12, and even after the plating test had been repeated five times, no clogging was found.

EXAMPLE 4

A nickel plating layer was formed as a conductive base layer on each of organic resin fine particles obtained by copolymerizing styrene and divinylbenzene; thus, a nickel plating fine particle having an average particle size of 250.68 $\mu$m and a standard deviation of 8.02 $\mu$m was obtained. The resulting nickel plating fine particles (30 g) were subjected to nickel plating on their surface by using a manufacturing device for conductive fine particles shown in FIG. 1.

With respect to the porous member 12, a porous member having a pore size of 70 $\mu$m, formed from polypropylene, was used. Metal nickel was used as the anode 2a. A Watt bath was used as the plating solution.

Power was applied across the electrodes with a voltage of 16 to 17 V for 20 minutes, under the conditions that the temperature of the plating solution was 50° C., the current was 38 A, and the current density was 0.65 A/dm². The peripheral velocity of the treatment chamber was set at 250 m/min, and the rotation direction was reversed every 11 seconds.

The nickel plated resin fine particles having a nickel plated layer as the outermost layer thus obtained were observed under a microscope, and all the particles existed as individually isolated particles without any aggregation. Moreover, the average particle size of 100 of the nickel plated resin fine particles was 255.68 $\mu$m and the thickness of the nickel plated layer was 2.5 $\mu$m. The variation coefficient of the particle size was 2.4%, thereby indicating that the thickness of the nickel plated layer was extremely uniform. Here, the total plating time was approximately 45 minutes.

EXAMPLE 5

The conductive fine particles (28 g) obtained in Example 3 were subjected to solder plating on their surface by using the manufacturing device for conductive fine particles shown in FIG. 1.

With respect to the porous member 12, a porous member having a pore size of 20 $\mu$m, formed from high-density polyethylene, was used.

An alloy of tin (Sn):lead (Pb)=6:4 was used as the anode 2a.

Acid bath (537A) made by Ishihara Chemical Co., Ltd. was used as the plating solution. The composition of the plating solution was adjusted so that the total metal concentration was set in the range of 15 to 30 g/L, the metal ratio in the bath, Sn %=55 to 70%, alkanol sulfonic acid, 100 to 150 g/L, and an additive, 40 mL. The results of analysis on the plating solution showed that the total metal concentration was 21 g/L, the metal ratio in the bath, Sn %=65%, and alkanol sulfonic acid, 107 g/L.

Power was applied across the electrodes with a voltage of 7 to 8 V for 15 minutes, under the conditions that the temperature of the plating solution was 20° C., the current was 50 A, and the current density was 0.5 A/dm². The peripheral velocity of the treatment chamber was set at 300 m/min, and the rotation direction was reversed every 11 seconds.

During the rotation of the treatment chamber, the plating solution, which was subjected to a force in the outer circumferential direction due to the effect of a centrifugal force, formed a vortex having a mortar-like shape; however, there was no overflowing from the upper opening of the hollow cover 1.

The solder plated resin fine particles having a solder plated layer as the outermost layer thus obtained were observed under a microscope, and all the particles existed as individually isolated particles. Moreover, the average particle size of 100 of the solder plated resin fine particles was 84.88 $\mu$m and the thickness of the solder plated layer was 3.2 m. The variation coefficient of the particle size was 3.2%, thereby indicating that the thickness of the nickel plated layer was extremely uniform.

Here, clogging occurred in the porous member, resulting in a particle loss of approximately 30%. After the plating test was repeated three times, clogging occurred too much, with the result that the porous member was no longer usable.

EXAMPLE 6 (COMPARATIVE EXAMPLE)

Plating was carried out in the same manner as Example 5 except that the conventional manufacturing device for conductive fine particles shown in FIG. 2 was used, and that as illustrated in FIG. 8, a porous member which was formed by affixing a nylon filter having a pore size of 10 $\mu$m onto the inner side surface on the treatment chamber side of a porous member with a pore size of 70 $\mu$m that was formed from polypropylene, was used as the porous member 12.

During the rotation of the treatment chamber, the plating solution, which was subjected to a force in the outer circumferential direction due to the effect of a centrifugal force, formed a vortex having a mortar-like shape and gradually rose along the inner wall of the cover 1, with the result that the liquid was scattered from the opening 8 of the cover 1; consequently, the fine particles flowed (overflow) out of the treatment chamber together with the scattering plating solution, as a result failing to carry out plating.

However, after completion of the plating process, no clogging was found in the porous member.

Here, this Example 6 should be described as a comparative example.

EXAMPLE 7

Solder plating was carried out on the surface in the same manner as Example 5, except that as illustrated in FIG. 8, a porous member, which was formed by affixing a nylon filter having a pore size of 10 $\mu$m onto the inner side surface on the treatment chamber side of a porous member with a pore size of 70 $\mu$m that was formed from polypropylene, was used as the porous member 12.

During the rotation of the treatment chamber, the plating solution, which was subjected to a force in the outer circumferential direction due to the effect of a centrifugal force, formed a vortex having a mortar-like shape; however, there was no overflowing from the upper opening of the hollow cover 1.

The solder plated resin fine particles having a solder plated layer as the outermost layer thus obtained were observed under a microscope, and all the particles existed as individually isolated particles. Moreover, the average particle size of 100 of the solder plated resin fine particles was 84.92 $\mu$m and the thickness of the solder plated layer was 3.4 $\mu$m. The variation coefficient of the particle size was 3.1%, thereby indicating that the thickness of the solder plated layer was extremely uniform.

Here, no clogging was found in the porous member 12, and even after the plating test had been repeated five times, no clogging was found.

EXAMPLE 8

A nickel plating layer is formed as a conductive base layer on each of organic resin fine particles obtained by copolymerizing styrene and divinylbenzene; thus, a nickel plating fine particle having an average particle size of 5.43 $\mu$m and a standard deviation of 0.16 $\mu$m was obtained. The resulting nickel plating fine particles (2.5 g) were subjected to nickel plating on their surface by using a manufacturing device for conductive fine particles shown in FIG. 1.

As illustrated in FIG. 8, a porous member, which was formed by affixing a nylon filter having a pore size of 3 $\mu$m onto the inner side surface on the treatment chamber side of a porous member with a pore size of 70 $\mu$m that was formed from polypropylene, was used as the porous member 12. Metal nickel was used as the anode 2a. A Watt bath was used as the plating solution.

Power was applied across the electrodes with a voltage of 14 to 15 V for 25 minutes, under the conditions that the temperature of the plating solution was 50° C., the current was 30 A, and the current density was 0.3 A/dm². The peripheral velocity of the treatment chamber was set at 300 m/min, and the rotation direction was reversed every 11 seconds.

During the rotation of the treatment chamber, the plating solution, which was subjected to a force in the outer circumferential direction due to the effect of a centrifugal force, formed a vortex having a mortar-like shape; however, there was no overflowing from the upper opening of the hollow cover 1.

The nickel plated resin fine particles having a nickel plated layer as the outermost layer thus obtained were observed under a microscope, and all the particles existed as individually isolated particles. Moreover, the average particle size of 100 of the nickel plated resin fine particles was 7.23 $\mu$m and the thickness of the nickel plated layer was 0.9 $\mu$m. The variation coefficient of the particle size was 2.8%, thereby indicating that the thickness of the nickel plated layer was extremely uniform.

Moreover, no clogging was found in the porous member 12, and even after the repeated plating tests of five times, no clogging was found.

COMPARATIVE EXAMPLE 1

Plating was carried out in the same manner as Example 1 except that the conventional manufacturing device for conductive fine particles shown in FIG. 2 was used as the manufacturing device for conductive fine particles, and that a porous member having a pore size of 20 $\mu$m, formed from high-density polyethylene, was used as the porous member 12.

During the rotation of the treatment chamber, the plating solution, which was subjected to a force in the outer circumferential direction due to the effect of a centrifugal force, formed a vortex having a mortar-like shape and gradually rose along the inner wall of the hollow cover 1, with the result that the liquid was scattered from the opening 8 of the hollow cover 1; consequently, the fine particles flowed (overflow) out of the treatment chamber together with the scattering plating solution, as a result failing to carry out plating. Moreover, clogging occurred in the porous member.

COMPARATIVE EXAMPLE 2

Plating was carried out in the same manner as Comparative Example 1 except that the peripheral velocity was set to 250 m/min.

Even during the rotation of the treatment chamber, no overflowing occurred; however, power was applied before the fine particles had reached the contact ring, resulting in no adhesion of the plating material.

COMPARATIVE EXAMPLE 3

Plating was carried out in the same manner as Example 4 by using the conventional manufacturing device for conductive fine particles shown in FIG. 2. Since the amount of the liquid in the treatment chamber was small, only the gross current amount of 26 A was allowed to flow with a low current density of 0.44 A/dm²; consequently, it took approximately 70 minutes to complete all the plating in order to obtain the same thickness of nickel layer as Example 3. The plating time took about 1.5 times as long.

COMPARATIVE EXAMPLE 4

Solder plating was carried out in the same manner as Example 5 except that the conventional manufacturing device for conductive fine particles shown in FIG. 2 was used as the manufacturing device for conductive fine particles.

During the rotation of the treatment chamber, the plating solution, which was subjected to a force in the outer circumferential direction due to the effect of a centrifugal force, formed a vortex having a mortar-like shape and gradually rose along the inner wall of the hollow cover 1, with the result that the liquid was scattered from the opening 8 of the hollow cover 1; consequently, the fine particles flowed (overflow) out of the treatment chamber together with the scattering plating solution, as a result failing to carry out plating. Moreover, clogging occurred in the porous member.

COMPARATIVE EXAMPLE 5

Solder plating was carried out in the same manner as Example 8 except that the conventional manufacturing device for conductive fine particles shown in FIG. 2 was used as the manufacturing device for conductive fine particles, and that a porous member having a pore size of 2 μm, formed of ceramics, was used as the porous member 12.

During the rotation of the treatment chamber, the plating solution, which was subjected to a force in the outer circumferential direction due to the effect of a centrifugal force, formed a vortex having a mortar-like shape and gradually rose along the inner wall of the hollow cover 1, with the result that the liquid was scattered from the opening 8 of the hollow cover 1; consequently, the fine particles flowed (overflow) out of the treatment chamber together with the scattering plating solution, as a result failing to carry out plating.

Table 2 shows the results of Examples 1 to 8 and Comparative Examples 1 to 5.

(Pb)=6:4 was used as the anode 2a. Acid bath (537A) made by Ishihara Chemical Co., Ltd. was used as the plating solution.

The composition of the plating solution was adjusted so that the total metal concentration was set in the range of 15 to 30 g/L, the metal ratio in the bath, Sn %=55 to 65%, alkanol sulfonic acid, 100 to 150 g/L, and an additive, 40 mL. The results of analysis on the plating solution showed that the total metal concentration was 20 g/L, the metal ratio in the bath, Sn %=65%, and alkanol sulfonic acid, 106 g/L.

Power was applied across the electrodes with a voltage of 10 to 12 V for the total power application time of approximately 25 minutes, under the conditions that the temperature of the plating solution was 20° C., the current was 50 A, and the current density was 0.5 A/dm$^2$. The peripheral velocity of the treatment chamber was set at 226 m/min, and the rotation direction was reversed every 7.5 seconds and total plating time was about 1 hour.

As a result, the application of the above-mentioned arrangement of the porous member solved the problem of the production of ring-shaped aggregated lumps due to pressed fine particles on the porous member filtering face during plating.

TABLE 1

| | Kinds of plating metal | Particle size (μm) | Cover | Porous member | Support Material | Support pore size (μm) | Filter pore size (μm) | Overflow | Clogging | Evaluation |
|---|---|---|---|---|---|---|---|---|---|---|
| Example | | | | | | | | | | |
| 1 | Nickel | 75 | FIG. 1 | — | PE | 20 | — | none | occurred | ○ |
| 2 | Nickel | 75 | FIG. 2 | FIG. 8 | PP | 70 | 10 | occurred | none | Δ |
| 3 | Nickel | 75 | FIG. 1 | FIG. 8 | PP | 70 | 10 | none | none | ◉ |
| 4 | Nickel | 250 | FIG. 1 | — | PP | 70 | — | none | none | ◉ |
| 5 | Solder | 75 | FIG. 1 | — | PE | 20 | — | none | occurred | ○ |
| 6 | Solder | 75 | FIG. 2 | FIG. 8 | PP | 70 | 10 | occurred | none | Δ |
| 7 | Solder | 75 | FIG. 1 | FIG. 8 | PP | 70 | 10 | none | none | ◉ |
| 8 | Nickel | 5 | FIG. 1 | FIG. 8 | PP | 70 | 3 | none | none | ◉ |
| Comparative Example | | | | | | | | | | |
| 1 | Nickel | 75 | FIG. 2 | — | PE | 20 | — | occurred | occurred | X |
| 2 | Reduced number of rotations of Comparative Example 1 | | | | | | | none | occurred | X |
| 3 | Nickel | 250 | FIG. 2 | — | PP | 70 | — | none | none | Δ |
| 4 | Solder | 75 | FIG. 2 | — | PE | 20 | — | occurred | occurred | X |
| 5 | Nickel | 5 | FIG. 2 | — | Ceramics | 2 | — | occurred | occurred | X |

EXAMPLE 9

A nickel plating layer is formed as a conductive base layer on each of organic resin fine particles having an average particle size of 93.45 μm, a standard deviation of 1.30 μm and a variation coefficient of 1.4%, obtained by copolymerizing styrene and divinylbenzene; thus, a nickel plating fine particle having an average particle size of 97.10 μm, a standard deviation of 1.86 μm and a variation coefficient of 1.9% was obtained. The resulting nickel plating fine particles (32.7 g) were subjected to nickel plating on their surface by using a manufacturing device for conductive fine particles shown in FIG. 11.

A porous member, which was formed by affixing a nylon sheet-shaped filter 20 having a pore size of 10 μm and a thickness of 10 μm onto the upper surface of a plate-shaped porous support 22 comprising high-density polyethylene having a pore size of 100 μm and a thickness of 6 mm, was used as the porous member 21. An alloy of tin (Sn):lead The nickel plated resin fine particles having an eutectic solder plated layer as the outermost layer thus obtained were observed under a microscope, and all the particles existed as individually isolated particles. Moreover, the average particle size of 100 of the solder plated resin fine particles was 103.78 μm and the thickness of the solder plated layer was 3.34 μm. The variation coefficient of the particle size was 2.8%, thereby indicating that the thickness of the solder plated layer was extremely uniform. Moreover, no scratches were found on the surface. The resulting solder coat was analyzed by the atomic absorption method, and Sn was 59.1%, which proved its eutectic composition.

In the following Examples and Comparative Examples, the evaluation items of the resulting conductive fine particles are given as (1) the ratio of aggregated lumps (Table 2) and (2) the surface condition of particles after plating (Table 3).

TABLE 2

| Glade | Degree of aggregation of plated particles |
| --- | --- |
| 0 | none of aggregated lumps, each comprising not less than 5 particles, in 1000 particles |
| 1 | 1 to 10 of aggregated lumps, each comprising not less than 5 particles, in 1000 particles |
| 2 | 11 to 30 of aggregated lumps, each comprising not less than 5 particles, in 1000 particles |
| 3 | 31 to 50 of aggregated lumps, each comprising not less than 5 particles, in 1000 particles |
| 4 | 51 or more of aggregated lumps, each comprising not less than 5 particles, in 1000 particles |

TABLE 3

| Glade | Presence of separation marks and scratches on the surface of plated particles |
| --- | --- |
| 0 | none of particles having separation marks and/or scratches on the surface in 100 particles |
| 1 | 1 to 3 particles having separation marks and/or scratches on the surface in 100 particles |
| 2 | 4 to 10 particles having separation marks and/or scratches on the surface in 100 particles |
| 3 | 11 to 20 particles having separation marks and/or scratches on the surface in 100 particles |
| 4 | 21 or more of particles having separation marks and/or scratches on the surface in 100 particles |

Moreover, from the results of observation on 100 particles under microscope, the average particle size and the thickness of the plating layer were calculated.

EXAMPLE 10

A nickel layer was formed as a conductive base layer on each of organic resin fine particles obtained by copolymerizing styrene and divinylbenzene; thus, nickel coated fine particles having an average particle size of 30.25 μm and a standard deviation of 1.13 μm were obtained. The resulting nickel coated fine particles (7.5 g) were subjected to nickel plating on their surface by using an electroplating device shown in FIG. 1.

A nylon filter having a pore size of 10 μm was affixed onto the inner side surface on the treatment chamber side of a porous member that was formed from polypropylene with a pore size of 70 μm; and this was used as the porous member 12. Metal nickel was used as the anode 2a. A Watt bath was used as the plating solution.

Power was applied across the electrodes with a voltage of 15 to 16 V for 20 minutes, under the conditions that the temperature of the plating solution was 50° C., the current was 36 A, and the current density was 0.36 A/dm². The peripheral velocity of the treatment chamber was set at 250 m/min, and the rotation direction was reversed every 11 seconds.

Figure 13:
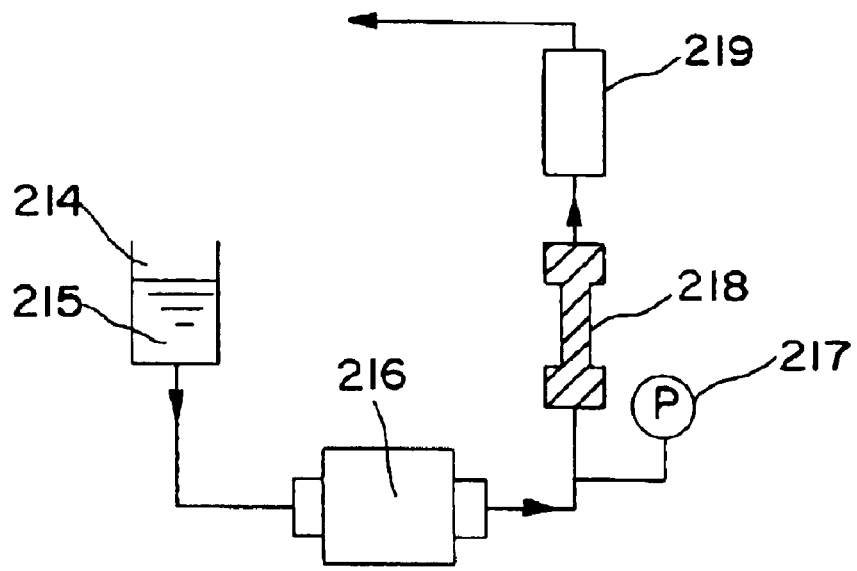
FIG. 13 is a system flow diagram of a high-pressure homogenizer in Example 10.

Nickel plated resin fine particles having a nickel plating layer on their outermost surface, thus obtained, were subjected to a pulverizing process under a pressure of 500 kg/cm² by using a high-pressure homogenizer (made by Mizuho Kogyo K.K., Micro-fluidizer M-110Y). One-pass pulverizing process was carried out. FIG. 13 shows a system flow diagram of the high-pressure homogenizer, and FIG. 14 shows a flow diagram showing the inside of the chamber 18.

Figure 14:
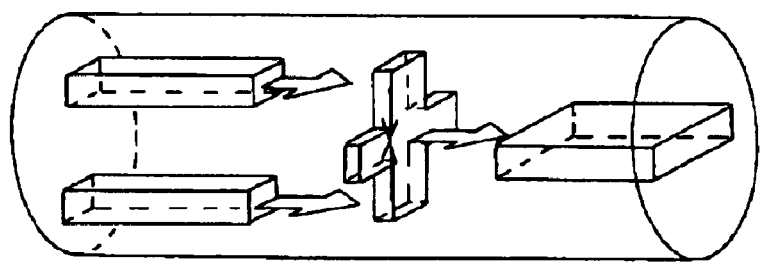
FIG. 14 is a flow diagram inside the chamber of the high-pressure homogenizer in Example 10.

As illustrated in FIGS. 13 and 14, the material was supplied by a pump 216, and a difference in pressures is occurred inside the chamber 218 due to the correlation between the orifice diameter of the chamber 218 and the supplying energy of the pump. This drop in pressure (cavitation), a shearing force due to the acceleration of the material, and an impact force exerted by the frontal collision of the accelerated fluid were utilized for pulverizing the fine particles inside the chamber.

In this manner, conductive fine particles, each having a nickel plated layer formed on its surface, were obtained.

EXAMPLE 11

In the same manner as Example 10 except that three passes of the pulverizing process were carried out, conductive fine particles, each having a nickel plated layer formed on its surface, were obtained.

EXAMPLE 12

In the same manner as Example 10 except that five passes of the pulverizing process were carried out, conductive fine particles, each having a nickel plated layer formed on its surface, were obtained.

EXAMPLE 13

The same plating process as Example 10 was carried out; however, during the plating process, the fine particles are drawn together with the plating solution continuously from the treatment chamber 13, and this was subjected to a pulverizing process by under a pressure of 500 kg/cm² by using a high-pressure homogenizer (made by Mizuho Kogyo K.K., Micro-fluidizer M-110Y), and again returned to the treatment chamber 13; this operation was repeated until the completion of the plating process.

FIG. 15 shows a flow diagram showing a circulation system having the combination of the electroplating device and the pulverizing device.

As illustrated in FIG. 15, a fine-particle drawing tube 221 was inserted from the upper opening of the treatment chamber (in which the tip of the drawing tube is placed in the vicinity of the contact ring 11), and a suspension of the plating solution and the fine particles in the vicinity of the contact ring was sent to a container 214 by a plating fine-particle drawing pump 231. The suspension 215 of the plating solution and the fine particles, sent to the container 214, was supplied to the chamber 218 by a pump 216, and isolated into individual particles by a pressure drop, a shearing force and an impact force, and then returned to the treatment chamber 13 by a pulverized fine-particle supply tube 222.

Thus, conductive fine particles, each having a nickel plated layer formed on its surface, were obtained.

COMPARATIVE EXAMPLE 6

The same plating process as Example 10 was carried out so that conductive fine particles, each having a nickel plated layer formed on its surface, were obtained; however, the pulverizing process was omitted.

The results of Examples 10 to 13 and Comparative Example 6 are shown in Table 4.

TABLE 4

| | Number of pulverizing process | Degree of aggregation | Presence of separation marks/scratches |
| --- | --- | --- | --- |
| Ex. 10 | 1 pass | Grade 2 | Grade 2 |
| Ex. 11 | 3 passes | Grade 1 | Grade 3 |
| Ex. 12 | 5 passes | Grade 0 | Grade 4 |
| Ex. 13 | Continuous pulverization | Grade 0 | Grade 0 |
| Compar. Ex. 6 | none | Grade 3 | Grade 0 |

As shown in Table 4, when the pulverizing process was carried out after completion of the plating (Example 10), the amount of aggregation was reduced as compared with Comparative Example 6. However, separation marks and scratches due to the pulverizing process were found on the plated surface. Moreover, the amount of aggregation reduced as the number of the pulverizing processes increased, and it became virtually zero after 5 passes; however, the amount of particles having separation marks and scratches on their surface increased.

In the circulation system (Example 13) using the combination of the electroplating device and the pulverizing device, the plating process and the pulverizing process are repeatedly carried out from the initial stage; therefore, aggregation hardly occurs, and it is possible to form a plating coat film without separation marks and scratches on the surface of each particle.

EXAMPLE 14

A nickel layer was formed as a conductive base layer on each of organic resin fine particles obtained by copolymerizing styrene and divinylbenzene; thus, nickel coated fine particles having an average particle size of 15.24 μm and a standard deviation of 0.70 μm were obtained. The resulting nickel coated fine particles (10.0 g) were subjected to nickel plating on their surface by using an electroplating device shown in FIG. 1.

A nylon filter having a pore size of 10 μm was affixed onto the inner side surface on the treatment chamber side of a porous member with a pore size of 70 μm that was formed from polypropylene; and this was used as the porous member 12. Metal nickel was used as the anode 2a. A Watt bath was used as the plating solution.

Power was applied across the electrodes with a voltage of 15 to 16 V for 20 minutes, under the conditions that the temperature of the plating solution was 50, the current was 36 A, and the current density was 0.36 A/dm². The peripheral velocity of the treatment chamber was set at 250 m/min, and the rotation direction was reversed every 11 seconds.

During the plating process, the fine particles were drawn together with the plating solution continuously from the treatment chamber 13, and this was subjected to a pulverizing process by a homomixer (made by Tokushukika Kogyo K.K., T.K. Pipeline Homomixer PL-SL) at 5000 rpm, and again returned to the treatment chamber 13; this operation was repeated until the completion of the plating process.

Figure 16:
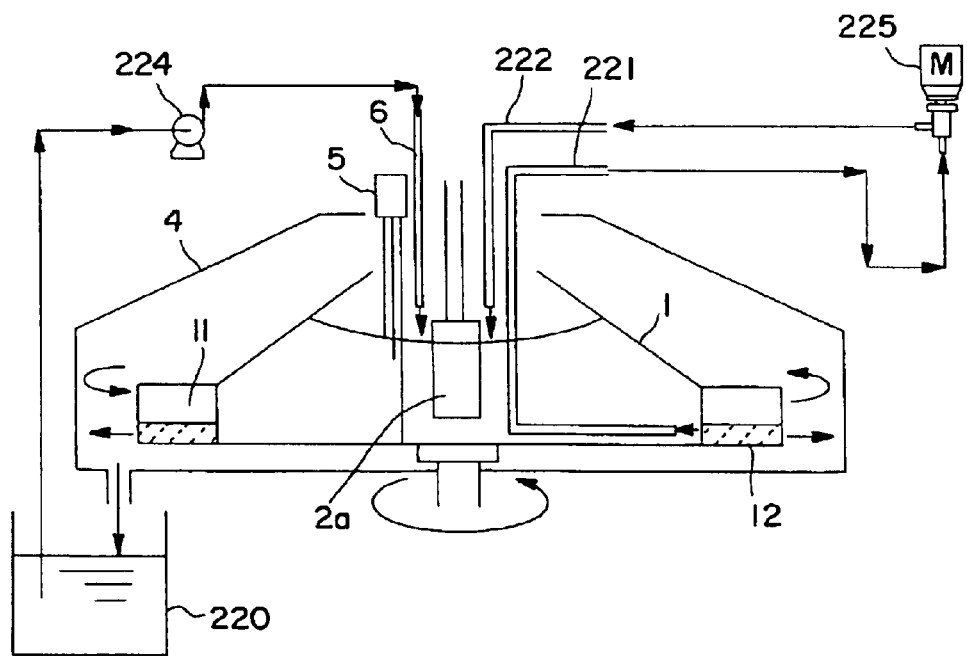
FIG. 16 is a flow diagram showing a circulation type in which an electroplating device of Example 16 and a pulverizing device (high pressure homomixer) are combined.

FIG. 16 shows a flow diagram showing such a circulation system having the combination of the electroplating device and the pulverizing device.

As illustrated in FIG. 16, a fine-particle drawing tube 221 was inserted from the upper opening of the treatment chamber (in which the tip of the drawing tube is placed in the vicinity of the contact ring 11), and a suspension of the plating solution and the fine particles in the vicinity of the contact ring was drawn, and subjected to a pulverizing process by a Pipeline, Homomixer 225, and then returned to the treatment chamber 13 by a pulverized fine-particle supply tube 222.

Thus, conductive fine particles, each having a nickel plated layer formed on its surface, were obtained.

COMPARATIVE EXAMPLE 7

The same plating process as Example 14 was carried out so that conductive fine particles, each having a nickel plated layer formed on its surface, were obtained; however, the pulverizing process was omitted.

The results of Examples 14 and Comparative Example 7 are shown in Table 5.

TABLE 5

|  | Number of pulverizing process | Degree of aggregation | Presence of separation marks/scratches |
|---|---|---|---|
| Ex. 14 | Continuous pulverization | Grade 0 | Grade 1 |
| Compar. Ex. 7 | none | Grade 3 | Grade 0 |

EXAMPLE 15

A nickel layer was formed as a conductive base layer on each of organic resin fine particles obtained by copolymerizing styrene and divinylbenzene; thus, nickel coated fine particles having an average particle size of 6.74 μm and a standard deviation of 0.40 μm were obtained. The fine particles obtained were subjected to nickel electroplating in the same manner as Example 5 so that nickel plated fine particles having an average particle size of 8.82 μm and a nickel plating thickness of 1.04 μm were obtained. These nickel plated fine particles were subjected to solder plating on their surface by using an electroplating device shown in FIG. 1.

A nylon filter having a pore size of 5 μm was affixed onto the inner side surface on the treatment chamber side of a porous member with a pore size of 70 μm that was formed from polypropylene; and this was used as the porous member 12. Metal nickel was used as the anode 2a. An alkane sulfonic acid solder bath was used as the plating solution. The composition of the bath was: tin(I)alkanesulfonate 60 ml/L, lead alkane sulfonate 30 ml/L, radical alkane sulfonic acid 100 ml/L and brightener 80 ml/L.

Power was applied across the electrodes with a voltage of 16 to 17 V for 15 minutes, under the conditions that the temperature of the plating solution was 20° C., the current was 80.6 A, and the current density was 0.75 A/dm². The peripheral velocity of the treatment chamber was set at 250 m/min, and the rotation direction was reversed every 15 seconds.

During the plating process, the fine particles were drawn together with the plating solution continuously from the treatment chamber 13, and this was subjected to a pulverizing process by a static mixer (products by Tokushukika Kogyo K.K., T.K.—ROSS ISG mixer), and again returned to the treatment chamber 13; this operation was repeated until the completion of the plating process.

Figure 17:
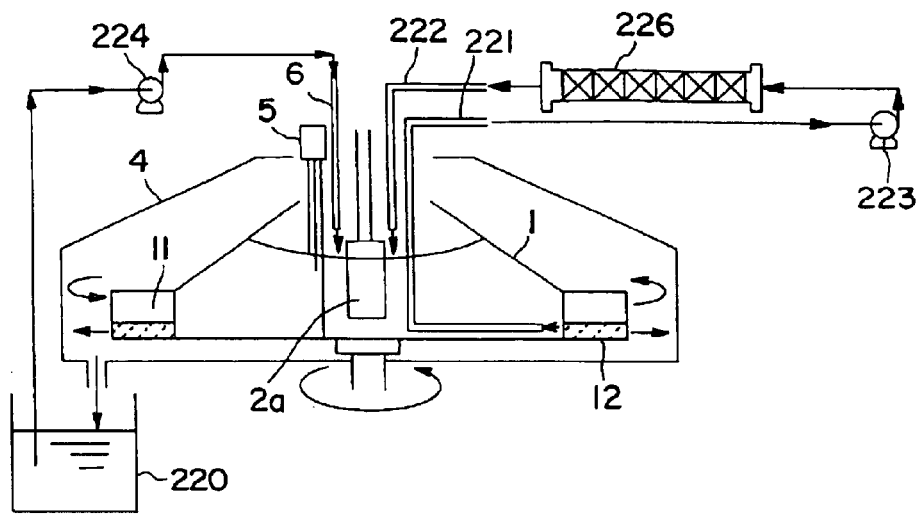
FIG. 17 is a flow diagram showing a circulation type in which an electroplating device of Example 17 and a pulverizing device (static mixer) are combined.

FIG. 17 shows a flow diagram showing such a circulation system having the combination of the electroplating device and the pulverizing device.

As illustrated in FIG. 17, a fine-particle drawing tube 221 was inserted from the upper opening of the treatment chamber (in which the tip of the drawing tube is placed in the vicinity of the contact ring 11), and a suspension of the plating solution and the fine particles in the vicinity of the contact ring was drawn, and subjected to a pulverizing process by a static mixer 226, and then returned to the treatment chamber 13 by a pulverized fine-particle supply tube 222.

Thus, conductive fine particles, each having a solder plated layer formed on its surface, were obtained.

COMPARATIVE EXAMPLE 8

The same plating process as Example 6 was carried out so that conductive fine particles, each having a nickel plated layer formed on its surface, were obtained; however, the pulverizing process was omitted.

The results of Examples 15 and Comparative Example 8 are shown in Table 6.

TABLE 6

|  | Number of pulverizing process | Degree of aggregation | Presence of separation marks/scratches |
|---|---|---|---|
| Ex. 15 | Continuous pulverization | Grade 0 | Grade 1 |
| Compar. Ex. 8 | none | Grade 4 | Grade 0 |

EXAMPLE 16

A nickel layer was formed as a conductive base layer on each of organic resin fine particles obtained by copolymerizing styrene and divinylbenzene; thus, nickel coated fine particles having an average particle size of 2.98 μm and a standard deviation of 0.22 μm were obtained. The resulting nickel coated fine particles (8.0 g) were subjected to nickel plating on their surface by using an electroplating device shown in FIG. 1.

A membrane filter having a pore size of 10 μm was affixed onto the inner side surface on the treatment chamber side of a porous member with a pore size of 70 μm that was formed from polypropylene; and this was used as the porous member 12. The membrane filter has a collecting efficiency of 98% with respect to 2 μm particles and a collecting efficiency of not less than 99.9% with respect to 3 μm particles. Metal nickel was used as the anode 2a. A Watt bath was used as the plating solution.

Power was applied across the electrodes with a voltage of 16 to 17 V for 50 minutes, under the conditions that the temperature of the plating solution was 50° C., the current was 36 A, and the current density was 0.20 A/dm². The peripheral velocity of the treatment chamber was set at 250 m/min, and the rotation direction was reversed every 15 seconds.

During the plating process, the fine particles were drawn together with the plating solution continuously from the treatment chamber 13, and this was subjected to a pulverizing process by an ultrasonic generator (products by Tsutsui Rikagakukikaisha K.K. Ultrasonic washer AU-70C) at a frequency of 28 kHz/s, and then again returned to the treatment chamber 13; this operation was repeated until the completion of the plating process.

Figure 18:
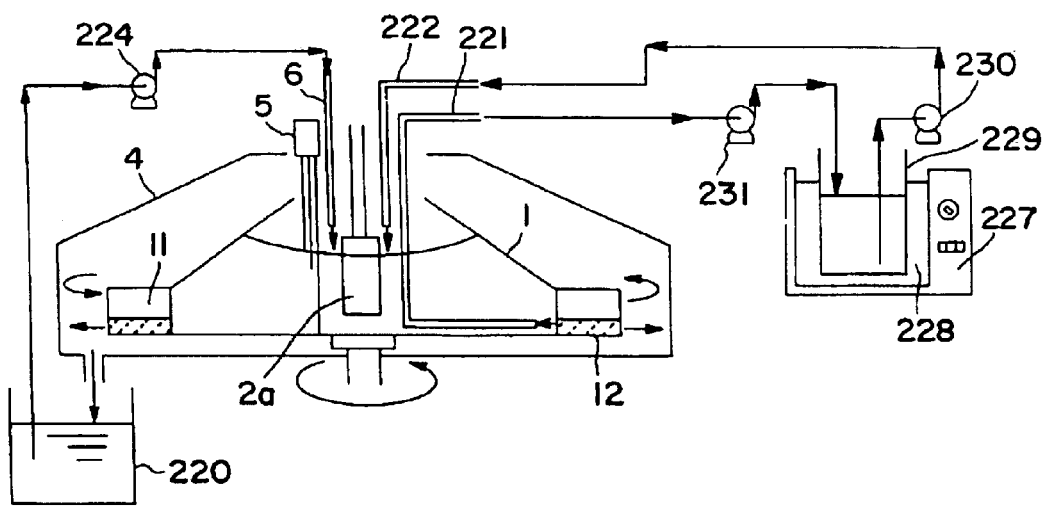
FIG. 18 is a flow diagram showing a circulation type in which an electroplating device of Example 18 and a pulverizing device (ultrasonic generator) are combined.

FIG. 18 shows a flow diagram showing such a circulation system having the combination of the electroplating device and the pulverizing device.

As illustrated in FIG. 18, a fine-particle drawing tube 221 was inserted from the upper opening of the treatment chamber (in which the tip of the drawing tube is placed in the vicinity of the contact ring 11), and a suspension of the plating solution and the fine particles in the vicinity of the contact ring was drawn by a plated fine-particle drawing pump 231, and sent to a glass container 229. The suspension of the plating solution and the fine particles, sent to the glass container 229, was isolated into individual particles by the pulverizing effect of ultrasonic waves exerted by the ultrasonic generator 227, and then returned to the treatment chamber 13 by a pulverized fine-particle sending pump 230 through a pulverized fine-particle supply tube 222.

Thus, conductive fine particles, each having a nickel plated layer formed on its surface, were obtained.

COMPARATIVE EXAMPLE 9

The same plating process as Example 16 was carried out so that conductive fine particles, each having a nickel plated layer formed on its surface, were obtained; however, the pulverizing process was omitted.

The results of Examples 16 and Comparative Example 9 are shown in Table 7.

TABLE 7

|  | Number of pulverizing process | Degree of aggregation | Presence of separation marks/scratches |
|---|---|---|---|
| Ex. 16 | Continuous pulverization | Grade 1 | Grade 0 |
| Compar. Ex. 9 | none | Grade 4 | Grade 0 |

EXAMPLE 17

A nickel plating layer was formed as a conductive base layer by an electroless plating method on each of organic resin fine particles having a specific gravity of 1.19, an average particle size of 98.76 μm, a standard deviation of 1.48 and a variation coefficient of 1.5%, obtained by copolymerizing styrene and divinylbenzene; thus, electroless nickel plated fine particles having an electroless nickel-film thickness of 2000 Å were obtained.

The resulting electroless nickel plated fine particles (20.0 g) were subjected to nickel plating on their surface by using a manufacturing device for conductive fine particles of the present invention 11 shown in FIG. 19.

With respect to the treatment chamber 315, a partition plate 314 which was formed by affixing a nylon filter sheet having a pore size of 10 μm and a thickness of 10 μm onto the inner side surface of a resin (HT-PVC) plate having a number of pores (ϕ5) was used to form it; thus, fine particles into the treatment chamber 315 were prevented from leaking into the plating vessel 313.

The treatment chamber 315 was designed to have a particle shifting distance A of 40 mm into the treatment chamber 315.

A ring-shaped porous member having a pore size of 100 μm and a thickness of 6 mm, made from high-density polyethylene, was used as the porous member 12. Metal nickel was used as the anode 2a.

A Watt bath was used as the plating solution. The composition of the plating solution was: nickel concentration 42 g/L, nickel chloride 39 g/L, nickel sulfate 150 g/L, and boric acid 31 g/L. The plating solution has a pH of 3.8 and a specific gravity of 1.11.

Power was applied across the electrodes under the conditions that the temperature of the plating solution was 50° C., the current was 34 A, and the current density was 0.37 A/dm². The driving condition was set so that the number of revolutions of the plating vessel 13 provides a centrifugal effect of 10.3. The plating vessel 13 used here had an inner diameter of 280 mm, the number of revolutions was 256.5 rpm, and the peripheral velocity of the inner side surface of the contact ring 11 was 225.6 m/min. The particle shifting time was 2 seconds, the power application time was 5 seconds, the deceleration time was 1 second, and the stoppage time was 1 second; thus, with the total 9 seconds as one cycle, the forward rotation and the reverse rotation were repeated. In this case, the power application rate (the ratio of the power application time in one cycle) was 55.6%. The total plating time was approximately 72 minutes.

The nickel plated resin fine particles having a nickel plated layer as the outermost layer thus obtained were observed under an optical microscope, and all the particles existed as individually isolated particles without any aggregation. Moreover, the average particle size of 300 of the nickel plated resin fine particles was 103.40 am and the thickness of the nickel plated layer was 2.12 μm. The variation coefficient of the particle size was 2.7%, thereby indicating that the thickness of the nickel plated layer was extremely uniform. Moreover, there were no particles influenced by a melt down base nickel plating layer due to the bipolar phenomenon.

EXAMPLE 18

Nickel plating was carried out in the same manner as Example 17 by using the electroless nickel plating fine particles used in Example 17, except that one cycle was set to 8 seconds including the particle shifting time of 2 seconds, the power application time of 5 seconds, the deceleration time of 1 second and the stoppage time of 0 second. In this case, the power application rate (the ratio of the power application time in one cycle) was 62.5%. The total plating time was approximately 64 minutes.

The nickel plated resin fine particles having a nickel plated layer as the outermost layer thus obtained were observed under an optical microscope, and all the particles existed as individually isolated particles without any aggregation. Moreover, the average particle size of 300 of the nickel plated resin fine particles was 103.26 μm and the thickness of the nickel plated layer was 2.05 μm. The variation coefficient of the particle size was 2.9%, thereby indicating that the thickness of the nickel plated layer was extremely uniform. Moreover, there were no particles influenced by a melt down base nickel plating layer due to the bipolar phenomenon.

EXAMPLE 19

By using the electroless nickel plating fine particles used in Example 17, nickel plating was carried out in the same manner as Example 17 except the following factors:

The treatment chamber 315 was formed so as to set the particle shifting distance A inside the treatment chamber at 15 mm, and as for the driving conditions, one cycle was set to 7 seconds including the particle shifting time of 1 second, the power application time of 5 seconds, the deceleration time of 1 second and the stoppage time of 0 second. In this case, the power application rate (the ratio of the power application time in one cycle) was 71.4%. The total plating time was approximately 56 minutes.

The nickel plated resin fine particles having a nickel plated layer as the outermost layer thus obtained were observed under an optical microscope, and all the particles existed as individually isolated particles without any aggregation. Moreover, the average particle size of 300 of the nickel plated resin fine particles was 103.34 μm and the thickness of the nickel plated layer was 2.09 μm. The variation coefficient of the particle size was 2.8%, thereby indicating that the thickness of the nickel plated layer was extremely uniform. Moreover, there were no particles influenced by a melt down base nickel plating layer due to the bipolar phenomenon.

COMPARATIVE EXAMPLE 9

Nickel plating was carried out in the same manner as Example 17 except that 20 g of the electroless nickel plating fine particles used in Example 17 was used, and that a conventional manufacturing device for conductive fine particles shown in FIG. 20 was used.

In the case of the conventional manufacturing device for conductive fine particles, since the particle shifting distance was too long, power application was started before the fine particles had reached the contact ring, with the result that the bipolar phenomenon occurred, causing melt-down in the electroless plating layers of not less than half the number of fine particles, as a result failing to carry out plating.

EXAMPLE 20

A nickel plating layer was formed as a conductive base layer on each of organic resin fine particles having an average particle size of 203.18 μm, a standard deviation of 3.05, and a variation coefficient 1.5%, obtained by copolymerizing styrene and divinylbenzene; thus, nickel coated fine particles having an average particle size of 208.29 μm, a standard deviation of 4.58 and a variation coefficient of 2.2% were obtained (with a nickel film thickness of approximately 2.5 μm). The resulting nickel plated fine particles (30.0 g) were subjected to eutectic solder plating on their surface by using a manufacturing device for conductive fine particles shown in FIG. 11.

A porous member, which was formed by affixing a nylon filter sheet 20 having a pore size of 10 μm and a thickness of 10 m onto the upper surface of a plate-shaped porous support 12 having a pore size of 100 μm and a thickness of 6 mm, made from high density polyethylene, was used as the porous member 21.

An alloy of tin (Sn):lead (Pb)=6:4 was used as the anode 2a.

Acid bath (537A) (made by Ishihara Chemical Co., Ltd.) was used as the plating solution.

The composition of the plating solution was adjusted so that the total metal concentration was 21.39 g/L, the metal ratio in the bath, Sn % was 65.3%, alkanol sulfonic acid was 106.4 g/L, and an additive was 40 mL.

Power was applied across the electrodes under the conditions that the temperature of the plating solution was 20° C., the current was 24.8 A, and the current density was 0.5 A/dm$^2$.

The driving condition was set so that the number of revolutions of the treatment chamber 13 provides a centrifugal effect of 10.3. The treatment chamber 13 used here had an inner diameter of 280 mm, the number of revolutions of the treatment chamber was 256.5 rpm, and the peripheral velocity thereof was 225.6 m/min. The driving pattern of the power application process was set so that one cycle included the particle shifting time of 2 seconds, the power application time of 6 seconds, the deceleration time of 0.5 second, and the stoppage time of 2 seconds, and the driving pattern of the stirring process was set so that one cycle included the rotation time of 1 second, the deceleration time of 0.5 second, and the stoppage time of 1 second; thus, the power application process and the stirring process were carried out alternately. The total plating time was approximately 83 minutes.

Figure 21:
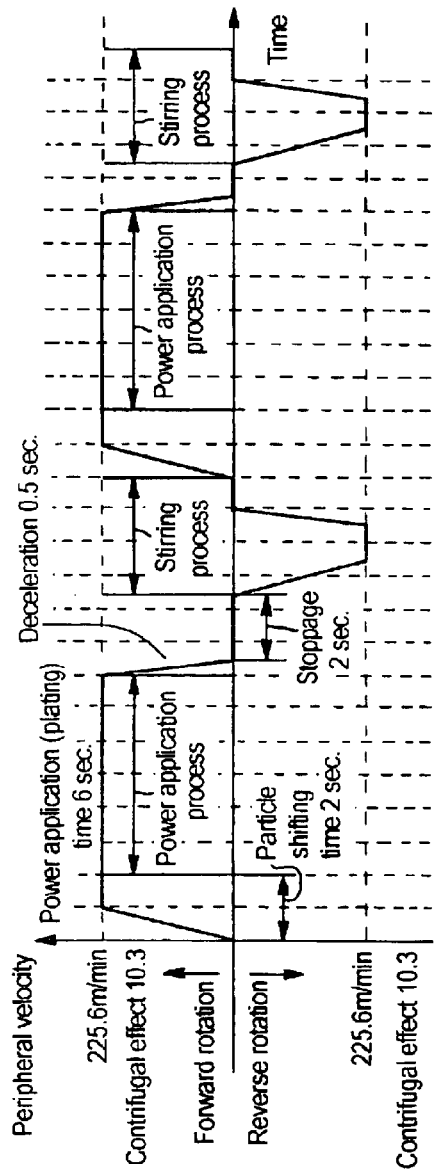
FIG. 21 is a time chart showing operation conditions of Example 20.

FIG. 21 shows a time chart of the driving conditions.

The eutectic solder plated resin fine particles having an eutectic solder plated layer as the outermost layer thus obtained were observed under an optical microscope, and all the particles existed as individually isolated particles.

Moreover, the average particle size of 300 of the eutectic solder plated resin fine particles was 219.47 μm and the thickness of the solder plated layer was 5.59 μm. The variation coefficient of the particle size was 3.1%, thereby indicating that the thickness of the solder plated layer was extremely uniform. Moreover, no scratches were found on the surface.

The resulting solder coat was analyzed by the atomic absorption method, and Sn was 61.3%, which proved its eutectic composition.

EXAMPLE 21

Eutectic solder plating was carried out in the same manner as Example 20 by using the same nickel plating fine particles (average particle size: 208.29 μm, a standard deviation: 4.58, variation coefficient: 2.2% and nickel film thickness: approximately 2.5 μm) as Example 20, except that the driving conditions were altered as follows:

The current value was set to 74.5 A, and the current density was set to 1.5 A/dm$^2$; thus, the plating was carried out.

The driving condition was set so that the number of revolutions of the treatment chamber provides a centrifugal effect of 10.3. The treatment chamber used here had an inner diameter of 280 mm, the number of revolutions of the treatment chamber was 256.5 rpm, and the peripheral velocity thereof was 225.6 m/min. The driving pattern of the power application process was set so that one cycle included the particle shifting time of 2 seconds, the power application time of 6 seconds, the deceleration time of 0.5 second, and the stoppage time of 2 seconds, and the driving pattern of the stirring process was set so that one cycle included the rotation time of 1 second, the deceleration time of 0.5 seconds, and the stoppage time of 1 second. The plating was carried out at the ratio of one cycle of the power application process to four cycles of the stirring processes, with the respective power-application process and the stirring process being repeated alternately in their forward and reverse rotations. The total plating time was approximately 49 minutes.

Figure 22:
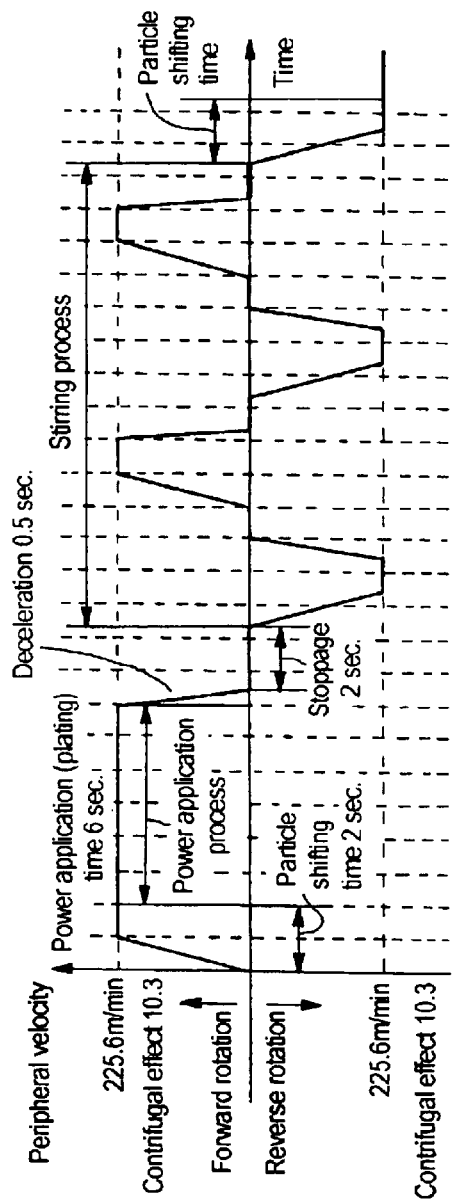
FIG. 22 is a time chart showing operation conditions of Example 21.

FIG. 22 shows a time chart of the driving conditions. The eutectic solder plated resin fine particles having an eutectic solder plated layer as the outermost layer thus obtained were observed under an optical microscope, and all the particles existed as individually isolated particles.

Moreover, the average particle size of 300 of the eutectic solder plated resin fine particles was 219.43 μm and the thickness of the solder plated layer was 5.57 μm. The variation coefficient of the particle size was 3.3%, thereby indicating that the thickness of the solder plated layer was extremely uniform.

The resulting solder coat was analyzed by the atomic absorption method, and Sn was 62.8%, which proved its eutectic composition.

COMPARATIVE EXAMPLE 10

Eutectic solder plating was carried out in the same manner as Example 20 by using the same nickel plating fine particles (average particle size: 208.29 μm, a standard deviation: 4.58, variation coefficient: 2.2% and nickel film thickness: approximately 2.5 μm), except that the driving conditions were altered as follows:

The current value was set to 24.8 A, and the current density was set to 0.5 A/dm$^2$; thus, the plating was carried out.

The driving condition was set so that the number of revolutions of the treatment chamber provides a centrifugal effect of 10.3. The treatment chamber used here had an inner diameter of 280 mm, the number of revolutions of the treatment chamber was 256.5 rpm, and the peripheral velocity thereof was 225.6 m/min. The driving pattern of the power application process was set so that one cycle included the particle shifting time of 2 seconds, the power application time of 6 seconds, the deceleration time of 0.5 second, and the stoppage time of 2 seconds, and no stirring process was applied; thus, the plating was carried out by repeating forward and reverse rotations during only the power application process. The total plating time was approximately 62 minutes.

Figure 23:
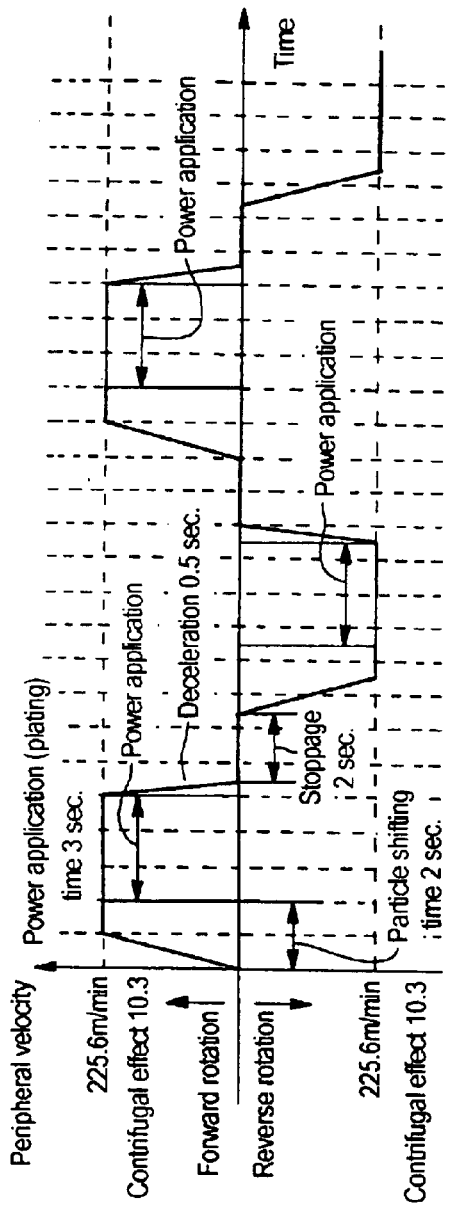
FIG. 23 is a time chart showing operation conditions of Comparative Example 10.

FIG. 23 shows a time chart of the driving conditions.

The eutectic solder plated resin fine particles having an eutectic solder plated layer as the outermost layer thus obtained were observed under an optical microscope, and a number of aggregated lumps, each formed by approximately 3 to 10 particles, were found. Thus, it was shown that aggregated lumps are formed in the case when no stirring process is applied while using the same power application time as Example 20.

COMPARATIVE EXAMPLE 11

Eutectic solder plating was carried out in the same manner as Example 20 by using the same nickel plating fine particles (average particle size: 208.29 μm, a standard deviation: 4.58, variation coefficient: 2.2% and nickel film thickness: approximately 2.5 μm), except that the driving conditions were altered as follows:

The current value was set to 74.5 A, and the current density was set to 1.5 A/dm$^2$; thus, the plating was carried out.

The driving condition was set so that the number of revolutions of the treatment chamber provides a centrifugal effect of 10.3. The treatment chamber used here had an inner diameter of 280 mm, the number of revolutions of the treatment chamber was 256.5 rpm, and the peripheral velocity thereof was 225.6 m/min. The driving pattern of the power application process was set so that one cycle included the particle shifting time of 2 seconds, the power application time of 3 seconds, the deceleration time of 0.5 second, and the stoppage time of 2 seconds, and no stirring process was applied; thus, the plating was carried out by repeating forward and reverse rotations during only the power application process. The total plating time was approximately 62 minutes.

Figure 24:
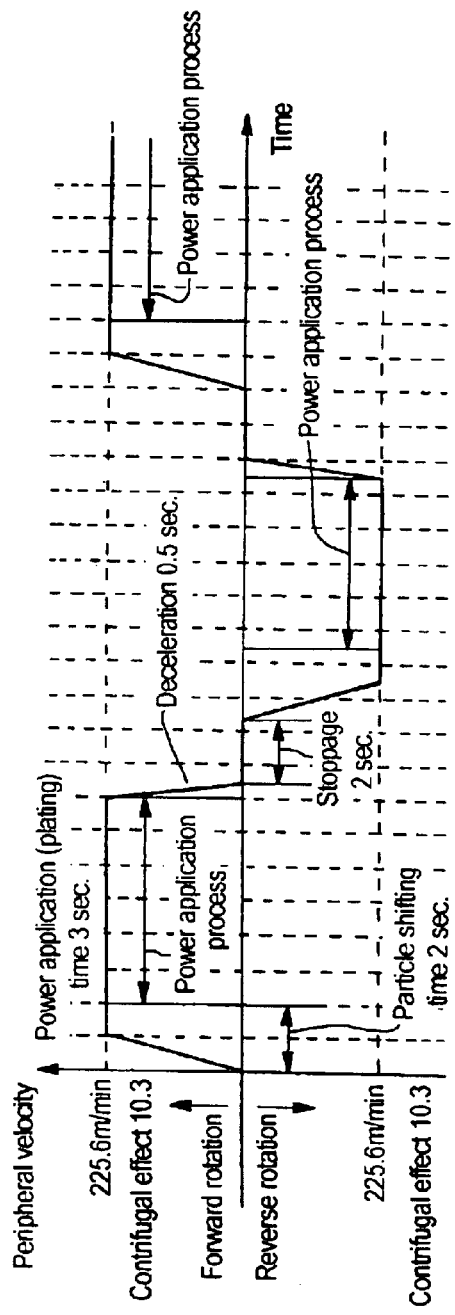
FIG. 24 is a time chart showing operation conditions of Comparative Example 11.
Figure 25:
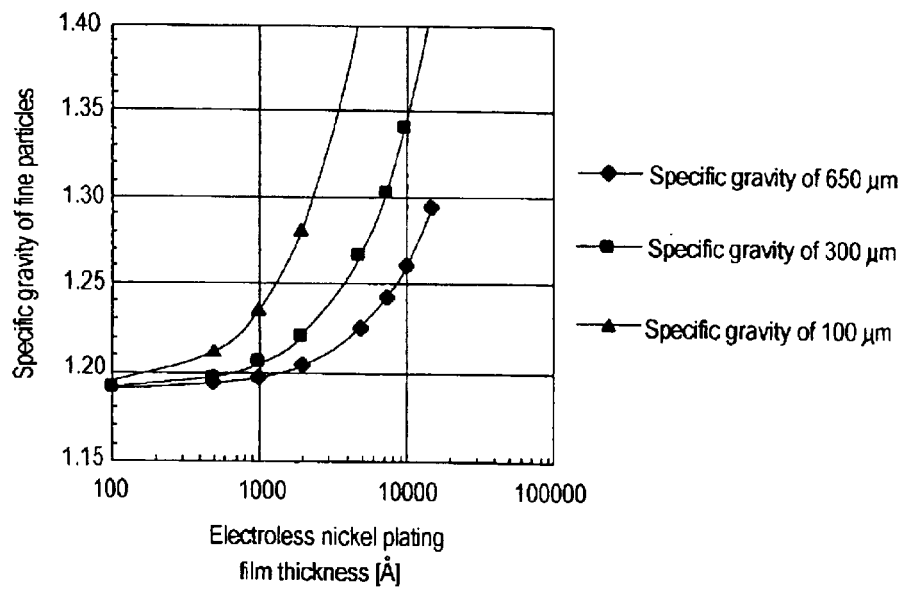
FIG. 25 is a graph that shows a relationship between the thickness of an electroless nickel plating film and the specific gravity of fine particles.
Figure 26:
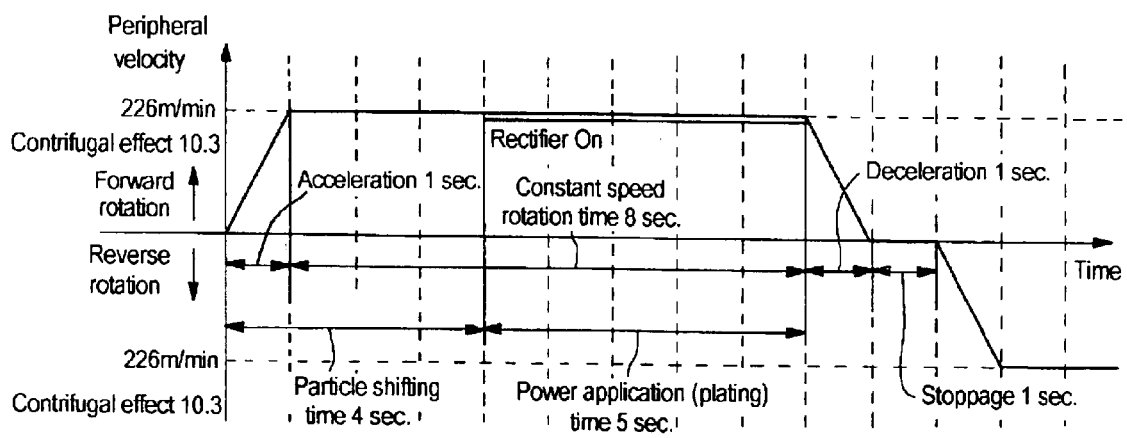
FIG. 26 is a time chart showing one embodiment of operation conditions of the present invention 14.

FIG. 24 shows a time chart of the driving conditions.

The eutectic solder plated resin fine particles having an eutectic solder plated layer as the outermost layer thus obtained were observed under an optical microscope, and a number of aggregated lumps, each formed by approximately 5 to 15 particles, were found. Thus, it was shown that aggregated lumps are formed in the case when no stirring process is applied with an increased current density.

Table 8 shows the results of Examples 20 and 21 as well as Comparative Examples 10 and 11.

TABLE 8

| | Current density (A/dm²) | shift | Power application process | | | Stirring process | | | | Total plating time (min.) | Presence of aggregation | Total evaluation |
|---|---|---|---|---|---|---|---|---|---|---|---|---|
| | | | Power application | Deceleration | Stoppage | Rotation | Deceleration | Stoppage | Number of repetitions | | | |
| Ex. 20 | 0.5 | 2 | 6 | 0.5 | 2 | 2 | 0.5 | 1 | 1 | 83 | none | ○ |
| Ex. 21 | 1.5 | 2 | 6 | 0.5 | 2 | 2 | 0.5 | 1 | 4 | 49 | none | ◎ |
| Comper. Ex. 10 | 0.5 | 2 | 6 | 0.5 | 2 | — | — | — | — | 62 | occurred | X |
| Comper. Ex. 11 | 1.5 | 2 | 3 | 0.5 | 2 | — | — | — | — | 30 | occurred | X |

EXAMPLE 22

A nickel plating layer was formed as a conductive base layer by an electroless plating method on each of organic resin fine particles having a specific gravity of 1.19, an average particle size of 650.38 μm, a standard deviation of 9.75 μm and a variation coefficient of 1.5%, obtained by copolymerizing styrene and divinylbenzene; thus, electroless nickel plated fine particles having an electroless nickel-film thickness of 5000 Å were obtained. The specific gravity of the electroless nickel plated fine particles thus obtained was 1.225.

The resulting nickel plated fine particles (105 g) were subjected to nickel plating on their surface by using a manufacturing device for conductive fine particles shown in FIG. 1.

A porous member, which was formed by affixing a nylon filter sheet having a pore size of 10 μm and a thickness of 10 μm onto the upper surface of a plate-shaped porous support having a pore size of 100 μm and a thickness of 6 mm, made from high density polyethylene, was used as the porous member 12.

Metal nickel was used as the anode 2a.

A Watt bath was used as the plating solution. The composition of the plating solution was 68 g/L of nickel concentration, 42 g/L of nickel chloride, 260 g/L of nickel sulfate, and 42 g/L of boric acid. The plating solution had a pH of 3.7 and a specific gravity of 1.18.

Power was applied across the electrodes under the conditions that the temperature of the plating solution was 50° C., the current was 32 A, and the current density was 0.4 A/dm². Here, the total power application time was approximately 80 minutes. The peripheral velocity of the treatment chamber was 226 m/min, and the rotation direction was reversed every 11 seconds.

By increasing the film thickness of the electroless plating as described above, the difference between it and the bath specific gravity was widened to not less than 0.04 so that all the fine particles were allowed to completely approach the contact ring, thereby as a result failing to form a uniform plating layer.

The nickel plated resin fine particles having a nickel plated layer as the outermost layer thus obtained were observed under an optical microscope, and all the particles existed as individually isolated particles without any aggregation. From cross-sectional photographs of the resulting nickel plated resin fine particles, it was confirmed that plating was uniformly formed on the surface of each particle. Moreover, the average particle size of 300 of the nickel plated resin fine particles was 661.18 μm and the thickness of the nickel plated layer was 5.40 μm. The variation coefficient of the particle size was 2.7%, thereby indicating that the thickness of the nickel plated layer was extremely uniform. Moreover, there were no particles influenced by a melt down base nickel plating layer due to the bipolar phenomenon.

EXAMPLE 23

A nickel layer was formed as a conductive base layer by an electroless plating method on each of organic resin fine particles same as those used in Example 22; thus, electroless nickel plated fine particles having an electroless nickel-film thickness of 2000 Å were obtained. The specific gravity of the electroless nickel plated fine particles thus obtained was 1.204.

The resulting nickel plated fine particles (105 g) were subjected to nickel plating on their surface by using a manufacturing device for conductive fine particles shown in FIG. 1.

The nickel plating was carried out in the same manner as Example 1, except that the composition of a Watt bath used here was altered as follows: nickel concentration was 42 g/L, nickel chloride was 39 g/L, nickel sulfate was 150 g/L, and boric acid was 31 g/L. The plating solution had a pH of 3.8 and a specific gravity of 1.11.

Even in the case when the film thickness of the electroless plating was thinner than that of Example 22 and the particle specific gravity was small, the difference between it and the bath specific gravity was increased to not less than 0.04 by reducing the electrolytic concentration of the Watt bath as described above, so that all the fine particles were allowed to completely approach the contact ring, thereby forming a uniform plating layer.

The nickel plated resin fine particles having a nickel plated layer as the outermost layer thus obtained were observed under an optical microscope, and all the particles existed as individually isolated particles without any aggregation. From cross-sectional photographs of the resulting nickel plated resin fine particles, it was confirmed that plating was uniformly formed on the surface of each particle. Moreover, the average particle size of 300 of the nickel plated resin fine particles was 660.72 μm and the thickness of the nickel plated layer was 5.170 μm. The variation coefficient of the particle size was 2.7%, thereby indicating that the thickness of the nickel plated layer was extremely uniform. Moreover, there were no particles influenced by a melt down base nickel plating layer due to the bipolar phenomenon.

EXAMPLE 24

A nickel layer was formed as a conductive base layer by an electroless plating method on each of glass beads having a specific gravity of 2.54, an average particle size of 203.67 μm, a standard deviation of 4.10 μm and a variation coefficient of 2.0%; thus, electroless nickel plated fine particles having a nickel-film thickness of 600 Å were obtained. The specific gravity of the electroless nickel plated fine particles thus obtained was 2.551.

The resulting nickel plated fine particles (75 g) were subjected to nickel plating on their surface by using a manufacturing device for conductive fine particles shown in FIG. 1.

A porous member, which was formed by affixing a nylon filter sheet having a pore size of 10 μm and a thickness of 10 μm onto the upper surface of a plate-shaped porous support having a pore size of 100 μm and a thickness of 6 mm, made from high density polyethylene, was used as the porous member 12.

Metal nickel was used as the anode 2a.

A Watt bath was used as the plating solution. The composition of the plating solution was 45 g/L of nickel chloride, 300 g/L of nickel sulfate, and 45 g/L of boric acid. The plating solution had a pH of 3.7 and a specific gravity of 1.23.

Power was applied across the electrodes under the conditions that the temperature of the plating solution was 50° C., the current was 40 A, and the current density was 0.90 A/dm$^2$. Here, the total power application time was approximately 35 minutes. The peripheral velocity of the treatment chamber was 226 m/min, and the rotation direction was reversed every 11 seconds.

As described above, by setting the difference between its specific gravity and the bath specific gravity to 1.321 so that all the fine particles were allowed to completely approach the contact ring, thereby forming a uniform plating layer.

The nickel plated glass beads having a nickel plated layer as the outermost layer thus obtained were observed under an optical microscope, and all the particles existed as individually isolated particles without any aggregation. From cross-sectional photographs of the resulting nickel plated glass beads, it was confirmed that plating was uniformly formed on the surfac of each particle. Moreover, the average particle size of 300 of the nickel plated glass beads was 210.13 μm and the thickness of the nickel plated layer was 3.23 μm. The variation coefficient of the particle size was 3.7%, thereby indicating that the thickness of the nickel plated layer was extremely uniform. Moreover, there were no particles influenced by a melt down base nickel plating layer due to the bipolar phenomenon.

EXAMPLE 25

Copper fine particles (200 g) having a specific gravity of 8.93, an average particle size of 301.45 μm, a standard deviation of 4.67 μm and a variation coefficient of 1.5% were subjected to nickel plating on their surface.

A porous member, which was formed by affixing a nylon filter sheet having a pore size of 10 μm and a thickness of 10 μm onto the upper surface of a plate-shaped porous support having a pore size of 100 μm and a thickness of 6 mm, made/from high density polyethylene, was used as the porous member 12.

Metal nickel was used as the anode 2a.

A Watt bath was used as the plating solution. The composition of the plating solution was 45 g/L of nickel chloride, 300 g/L of nickel sulfate, and 45 g/L of boric acid. The plating solution had a pH of 3.7 and a specific gravity of 1.23.

Power was applied across the electrodes under the conditions that the temperature of the plating solution was 50° C., the current was 40 A, and the current density was 0.90 A/dm$^2$. Here, the total power application time was approximately 35 minutes. The peripheral velocity of the treatment chamber was 226 m/min, and the rotation direction was reversed every 11 seconds.

As described above, by setting the difference between its specific gravity and the bath specific gravity to 7.7 so that all the fine particles were allowed to completely approach the contact ring, thereby forming a uniform plating layer.

The nickel plated copper fine particles having a nickel plated layer as the outermost layer thus obtained were observed under an optical microscope, and all the particles existed as individually isolated particles without any aggregation. From cross-sectional photographs of the resulting nickel plated copper fine particles, it was confirmed that plating was uniformly formed on the surfac of each particle. Moreover, the average particle size of 300 of the nickel plated copper fine particles was 310.38 μm and the thickness of the nickel plated layer was 4.46 μm. The variation coefficient of the particle size was 2.8%, thereby indicating that the thickness of the nickel plated layer was extremely uniform. Moreover, there were no particles influenced by a melt down base nickel plating layer due to the bipolar phenomenon.

EXAMPLE 26

Lead fine particles (200 g) having a specific gravity of 11.34, an average particle size of 448.76 μm, a standard deviation of 7.63 μm and a variation coefficient of 1.7% were subjected to nickel plating on their surface by using a manufacturing device for conductive fine particles shown in FIG. 1.

A porous member, which was formed by affixing a nylon filter sheet having a pore size of 10 μm and a thickness of 10 μm onto the upper surface of a plate-shaped porous support having a pore size of 100 μm and a thickness of 6 mm, made from high density polyethylene, was used as the porous member 12.

Metal nickel was used as the anode 2a.

A Watt bath was used as the plating solution. The composition of the plating solution was 45 g/L of nickel chloride, 300 g/L of nickel sulfate, and 45 g/L of boric acid. The plating solution had a pH of 3.7 and a specific gravity of 1.23.

Power was applied across the electrodes under the conditions that the temperature of the plating solution was 50° C., the current was 23.5 A, and the current density was 1.0 A/dm$^2$. Here, the total power application time was approximately 30 minutes. The peripheral velocity of the treatment chamber was 226 m/min, and the rotation direction was reversed every 11 seconds.

As described above, by setting the difference between its specific gravity and the bath specific gravity to 10.11 so that all the fine particles were allowed to completely approach the contact ring, thereby forming a uniform plating layer.

The nickel plated lead fine particles having a nickel plated layer as the outermost layer thus obtained were observed under an optical microscope, and all the particles existed as individually isolated particles without any aggregation. From cross-sectional photographs of the resulting nickel plated lead fine particles, it was confirmed that plating was uniformly formed on the surface of each particle. Moreover, the average particle size of 300 of the nickel plated lead fine particles was 459.26 μm and the thickness of the nickel plated layer was 5.25 μm. The variation coefficient of the particle size was 3.1%, thereby indicating that the thickness of the nickel plated layer was extremely uniform. Moreover, there were no particles influenced by a melt-down base nickel plating layer due to the bipolar phenomenon.

COMPARATIVE EXAMPLE 12

Nickel plating was carried out on the surface of the completely same electroless nickel plated fine particles (plating solution specific gravity: 1.204) as Example 23 by using a manufacturing device for conductive fine particles shown in FIG. 1 under the completely same plating conditions (specific gravity: 1.18) as Example 1.

Since the difference in specific gravity between the plated fine particles and the plating solution was as small as 0.024, power application was started before the fine particles had reached contact ring, with the result that there were a number of fine particles having melt-down conductive base layers due to the bipolar phenomenon.

COMPARATIVE EXAMPLE 13

A nickel plating layer was formed as a conductive base layer on each of the completely same organic resin fine particles as Example 22 by using an electroless plating method; thus, electroless nickel plated fine particles having an electroless nickel film thickness of 600 Å were obtained. The resulting electroless nickel plating fine particles had a specific gravity of 1.194.

The nickel plated fine particles (105 g) thus obtained were subjected to plating on their surface by using a manufacturing device for conductive fine particles shown in FIG. 1 under the completely same plating conditions (plating solution specific gravity: 1.18) as Example 1.

Since the difference in specific gravity between the plated fine particles and the plating solution was 0.014, which was far smaller than that of Comparative Example 1, power application was started before almost all the fine particles had reached contact ring, with the result that almost all the fine particles were subjected to melt down conductive base layers due to the bipolar phenomenon.

Table 9 shows the results of Examples 22 to 26 and Comparative Examples 12 and 13. Here, with respect to the evaluation in Table 9, the occurrence of malplating due to the bipolar phenomenon was evaluated based upon the following criteria.

EXAMPLE 27

A nickel plated layer was formed as a conductive base layer by an electroless plating method on each of organic resin fine particles having a specific gravity of 1.19, an average particle size of 650.8 μm, a standard deviation of 9.75 μm and a variation coefficient of 1.5%, formed by copolymerizing styrene and divinylbenzene; thus, electroless nickel plated fine particles having an ectrololess nickel-film thickness of 2000 Å were obtained. The specific gravity of the electroless nickel plated fine particles thus obtained was 1.204.

The resulting nickel plated fine particles (105 g) were subjected to nickel plating on their surface by using a manufacturing device for conductive fine particles shown in FIG. 11.

A porous member, which was formed by affixing a nylon filter sheet 20 having a pore size of 10 μm and a thickness of 10 μm onto the upper surface of a plate-shaped porous support 22 having a pore size of 100 μm and a thickness of 6 mm, made from high density polyethylene, was used as the porous member 21.

Metal nickel was used as the anode 2a.

A Watt bath was used as the plating solution.

The composition of the plating solution was 42 g/L of nickel concentration, 39 g/L of nickel chloride, 150 g/L of nickel sulfate, and 31 g/L of boric acid. The plating solution had a pH of 3.8 and a specific gravity of 1.11.

Power was applied across the electrodes under the conditions that the temperature of the plating solution was 50° C., the current was 32 A, and the current density was 0.4 A/dm$^2$. Here, the total power application time was approximately 80 minutes.

With respect to the driving conditions, the number of revolutions of the treatment chamber was set so as to provide a centrifugal effect of 10.3. The inner diameter of the treatment chamber used in this case was 280 mm, and the number of revolutions of the treatment chamber was 256.5 rpm, and the peripheral velocity thereof was 225.6 m/min. The particle shifting time was 4 seconds, the power application time was 5 seconds, the deceleration time was 1 second, and the stoppage time was 1 second; these were set as one cycle, and the forward and reverse rotations were repeated.

At this time, the power application efficiency (the ratio of power application time in one cycle) was 45.5%.

Figure 27:
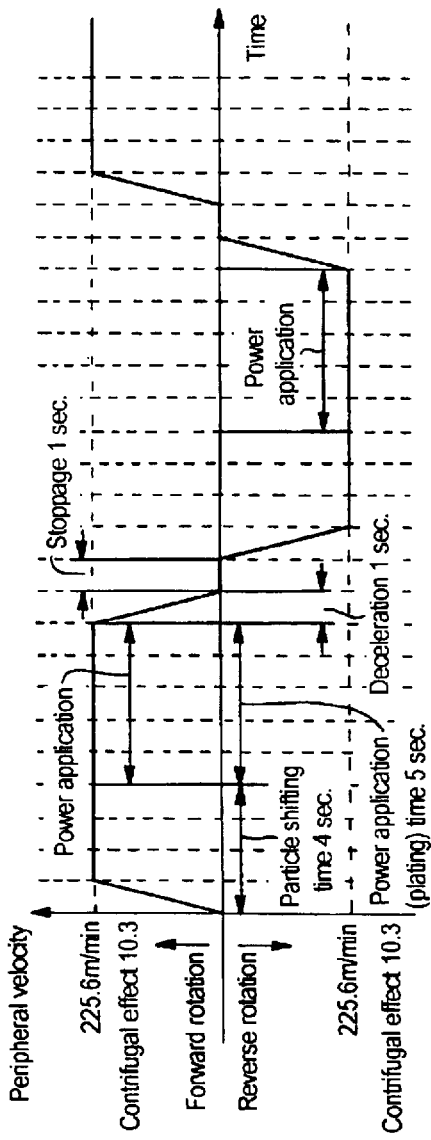
FIG. 27 is a time chart showing operation conditions of Example 27 and Example 31.

FIG. 27 shows a time chart of the driving conditions.

TABLE 9

| | Particle material | Particle size (μm) | Electroless Plating film thickness (Å) | Particle specific gravity | Bath specific gravity | Difference in specific gravity | Evaluation |
|---|---|---|---|---|---|---|---|
| Ex. 22 | Organic resin | 650.38 | 5000 | 1.225 | 1.18 | 0.045 | ○ |
| Ex. 23 | Organic resin | 650.38 | 2000 | 1.204 | 1.11 | 0.094 | ○ |
| Ex. 24 | Glass | 203.67 | 600 | 2.551 | 1.23 | 1.321 | ○ |
| Ex. 25 | Copper | 301.45 | — | 8.93 | 1.23 | 7.7 | ○ |
| Ex. 26 | Lead | 448.76 | — | 11.34 | 1.23 | 10.11 | ○ |
| Comper. Ex. 12 | Organic resin | 650.38 | 2000 | 1.204 | 1.18 | 0.024 | X |
| Comper. Ex. 13 | Organic resin | 650.38 | 600 | 1.194 | 1.18 | 0.014 | XX |

○: not observed
X: malplating in not less than half
XX: malplating in almost all The nickel plated resin fine particles having a nickel plated layer as the outermost layer thus obtained were observed under an optical microscope, and all the particles existed as individually isolated particles without any aggregation.

Moreover, the average particle size of 300 of the nickel plated resin fine particles was 661.18 µm and the thickness of the nickel plated layer was 5.40 µm. The variation coefficient of the particle size was 2.7%, thereby indicating that the thickness of the nickel plated layer was extremely uniform. Here, there were no particles influenced by a melt down base nickel plating layer due to the bipolar phenomenon.

EXAMPLE 28

A nickel plating layer was formed as a conductive base layer by an electroless plating method on each of completely the same organic resin fine particles as Example 27; thus, electroless nickel plated fine particles having an electroless nickel-film thickness of 2000 Å were obtained. The specific gravity of the electroless nickel plated fine particles thus obtained was 1.204.

The resulting nickel plated fine particles (105 g) were subjected to nickel plating on their surface by using a manufacturing device for conductive fine particles shown in FIG. 11.

Plating was carried out in the same manner as Example 27 except that the driving conditions were altered as follows:

The number of revolutions of the treatment chamber was set so as to provide a centrifugal effect of 28.6. The inner diameter of the treatment chamber used was 280 mm, and the number of revolutions of the treatment chamber was 427.5 rpm, the peripheral velocity thereof was 376.0 m/min. The particle shifting time was 2 seconds, the power application time was 3 seconds, the deceleration time was 1 second, and the stoppage time was 1 second; these were set as one cycle, and the forward and reverse rotations were repeated.

At this time, the power application efficiency (the ratio of power application time in one cycle) was 46.2%.

Figure 28:
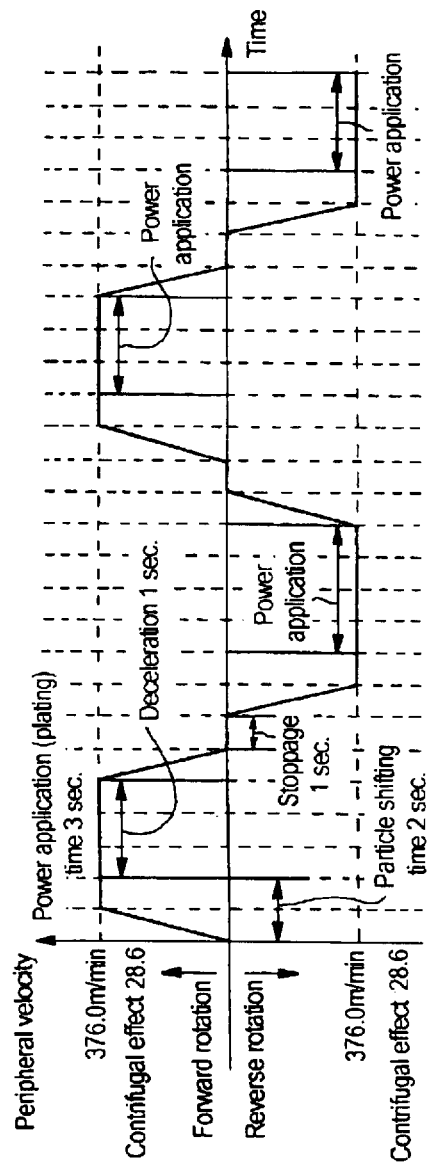
FIG. 28 is a time chart showing operation conditions of Example 28.

FIG. 28 shows a time chart of the driving conditions.

The nickel plated resin fine particles having a nickel plated layer as the outermost layer thus obtained were observed under an optical microscope, and all the particles existed as individually isolated particles without any aggregation.

Moreover, the average particle size of 300 of the nickel plated resin fine particles was 660.78 µm and the thickness of the nickel plated layer was 5.20 µm. The variation coefficient of the particle size was 2.5%, thereby indicating that the thickness of the nickel plated layer was extremely uniform. Here, there were no particles influenced by a melt down base nickel plating layer due to the bipolar phenomenon.

EXAMPLE 29

A nickel plated layer was formed as a conductive base layer by an electroless plating method on each of completely the same organic resin fine particles as Example 27; thus, electroless nickel plated fine particles having an electroless nickel-film thickness of 2000 Å were obtained. The specific gravity of the electroless nickel plated fine particles thus obtained was 1.204.

The resulting nickel plated fine particles (105 g) were subjected to nickel plating on their surface by using a manufacturing device for conductive fine particles shown in FIG. 11.

Plating was carried out in the same manner as Example 27 except that the driving conditions were altered as follows:

The number of revolutions of the treatment chamber was set so as to provide a centrifugal effect of 3.2. The inner diameter of the treatment chamber was 280 mm, and the number of revolutions of the treatment chamber was 142.5 rpm, the peripheral velocity thereof was 125.3 m/min. The particle shifting time was 8 seconds, the power application time was 5 seconds, the deceleration time was 1 second, and the stoppage time was 0 second; these were set as one cycle, and the forward and reverse rotations were repeated.

At this time, the power application efficiency (the ratio of power application time in one cycle) was 35.7%.

FIG. 29 shows a time chart of the driving conditions.

The nickel plated resin fine particles having a nickel plated layer as the outermost layer thus obtained were observed under an optical microscope, and all the particles existed as individually isolated particles without any aggregation.

Moreover, the average particle size of 300 of the nickel plated resin fine particles was 659.46 µm and the thickness of the nickel plated layer was 5.04 µm. The variation coefficient of the particle size was 2.5%, thereby indicating that the thickness of the nickel plated layer was extremely uniform. Here, there were no particles influenced by a melt down base nickel plating layer due to the bipolar phenomenon.

EXAMPLE 30

The nickel plated resin fine particles (140 g)(particle size: 661.18 µm, variation coefficient: 2.7%, specific gravity: 1.57) having a nickel plating layer as the outermost surface, obtained in Example 27, were subjected to eutectic solder plating on their surface by using a manufacturing device for conductive fine particles shown in FIG. 11.

A porous member, which was formed by affixing a nylon filter sheet 20 having a pore size of 10 µm and a thickness of 10 µm onto the upper surface of a plate-shaped porous support 22 having a pore size of 100 µm and a thickness of 6 mm, made from high density polyethylene, was used as the porous member 21.

An alloy of tin (Sn):lead (Pb)=6:4 was used as the anode 2a.

Acid bath (537A) (product by Ishihara Yakuhin Kogyo K.K.) was used as the plating solution.

The composition of the plating solution was adjusted so that the total metal concentration was 21.39 g/L, the metal ratio in the bath, Sn was 65.3%, alkanol sulfonic acid was 106.4 g/L, and an additive was 40 mL.

Power was applied across the electrodes under the conditions that the temperature of the plating solution was 20° C., the current was 40.5 A, and the current density was 0.5 A/dm$^2$. The total power application time was 105 minutes.

The driving condition was set so that the number of revolutions of the treatment chamber provides a centrifugal effect of 10.3. The treatment chamber used here had an inner diameter of 280 mm, the number of revolutions of the treatment chamber was 256.5 rpm, and the peripheral velocity thereof was 225.6 m/min. The driving pattern of the power application process was set so that one cycle included the particle shifting time of 2 seconds, the power application time of 3 seconds, the deceleration time of 0.5 seconds, and the stoppage time of 2 seconds; thus, in this cycle, the forward and reverse rotations were repeated.

At this time, the power application efficiency (the ratio of power application time in one cycle) was 40%.

FIG. 30 shows a time chart of the driving conditions.

The eutectic solder plated resin fine particles having an eutectic solder layer as the outermost layer thus obtained were observed under an optical microscope, and all the particles existed as individually isolated particles.

Moreover, the average particle size of 300 of the eutectic solder plated resin fine particles was 693.06 μm and the thickness of the solder plated layer was 15.94 μm. The variation coefficient of the particle size was 3.8%, thereby indicating that the thickness of the solder plated layer was extremely uniform. The resulting solder coat was analyzed by the atomic absorption method, and Sn was 61.7%, which proved its eutectic composition. Here, there were no particles influenced by a melt down base nickel plating layer due to the bipolar phenomenon.

EXAMPLE 31

A nickel plated layer was formed as a conductive base layer by an electroless plating method on each of organic resin fine particles having a specific gravity of 1.19, an average particle size of 106.42 μm, a standard deviation of 1.70 μm and a variation coefficient of 1.6%, formed by copolymerizing styrene and divinylbenzene; thus, electroless nickel plated fine particles having an electroless nickel-film thickness of 2000 Å were obtained. The specific gravity of the electroless nickel plated fine particles thus obtained was 1.276.

The resulting nickel plated fine particles (21.6 g) were subjected to nickel plating on their surface by using a manufacturing device for conductive fine particles shown in FIG. 11.

A porous member, which was formed by affixing a nylon filter sheet 20 having a pore size of 10 μm and a thickness of 10 μm onto the upper surface of a plate-shaped porous support 22 having a pore size of 100 μm and a thickness of 6 mm, made from high density polyethylene, was used as the porous member 21.

Metal nickel was used as the anode 2a.

A Watt bath was used as the plating solution.

The composition of the plating solution was 68 g/L of nickel concentration, 42 g/L of nickel chloride, nickel sulfate 260 g/L, and 42 g/L of boric acid. The plating solution had a pH of 3.7 and a specific gravity of 1.18.

Power was applied across the electrodes under the conditions that the temperature of the plating solution was 50° C., the current was 33 A, and the current density was 0.35 A/dm². Here, the total power application time was approximately 50 minutes.

With respect to the driving conditions, the number of revolutions of the treatment chamber was set so as to provide a centrifugal effect of 10.3. The inner diameter of the treatment chamber used in this case was 280 mm, and the number of revolutions of the treatment chamber was 256.5 rpm, and the peripheral velocity thereof was 225.6 m/min. The particle shifting time was 4 seconds, the power application time was 5 seconds, the deceleration time was 1 second, and the stoppage time was 1 second; these were set as one cycle, and the forward and reverse rotations were repeated.

At this time, the power application efficiency (the ratio of power application time in one cycle) was 45.5%.

FIG. 27 shows a time chart of the driving conditions.

The nickel plated resin fine particles having a nickel plated layer as the outermost layer thus obtained were observed under an optical microscope, and all the particles existed as individually isolated particles without any aggregation.

Moreover, the average particle size of 300 of the nickel plated resin fine particles was 111.06 μm and the thickness of the nickel plated layer was 2.32 μm. The variation coefficient of the particle size was 2.4%, thereby indicating that the thickness of the nickel plated layer was extremely uniform. Here, there were no particles influenced by a melt down base nickel plating layer due to the bipolar phenomenon.

EXAMPLE 32

The nickel plated resin fine particles (40 g)(particle size: 111.06 μm, variation coefficient: 2.4%, specific gravity: 2.111) having a nickel plating layer as the outermost surface, obtained in Example 31, were subjected to eutectic solder plating on their surface by using a manufacturing device for conductive fine particles shown in FIG. 11.

A porous member, which was formed by affixing a nylon filter sheet 20 having a pore size of 10 μm and a thickness of 10 μm onto the upper surface of a plate-shaped porous support 22 having a pore size of 100 μm and a thickness of 6 mm, made from high density polyethylene, was used as the porous member 21.

An alloy of tin (Sn):lead (Pb)=6:4 was used as the anode 2a.

Acid bath (537A) produced by Ishihara Yakuhin Kogyo K.K. was used as the plating solution.

The composition of the plating solution was adjusted so that the total metal concentration was 21.39 g/L, and the metal ratio in the bath was 65.3% of Sn, 106.4 g/L of alkanol sulfonic acid, and 40 mL of an additive.

Power was applied across the electrodes under the conditions that the temperature of the plating solution was 20° C., the current was 40.5 A, and the current density was 0.5 A/dm². The total power application time was 105 minutes.

The driving condition was set so that the number of revolutions of the treatment chamber provides a centrifugal effect of 10.3. The treatment chamber used here had an inner diameter of 280 mm, the number of revolutions was 256.5 rpm, and the peripheral velocity thereof was 225.6 m/min. The particle shifting time was 3 seconds, the power application time was 2 seconds, the deceleration time was 0.5 second, and the stoppage time of 2 seconds; thus, these were set as one cycle, and the forward and reverse rotations were repeated.

At this time, the power application efficiency (the ratio of power application time in one cycle) was 26.7%.

Figure 31:
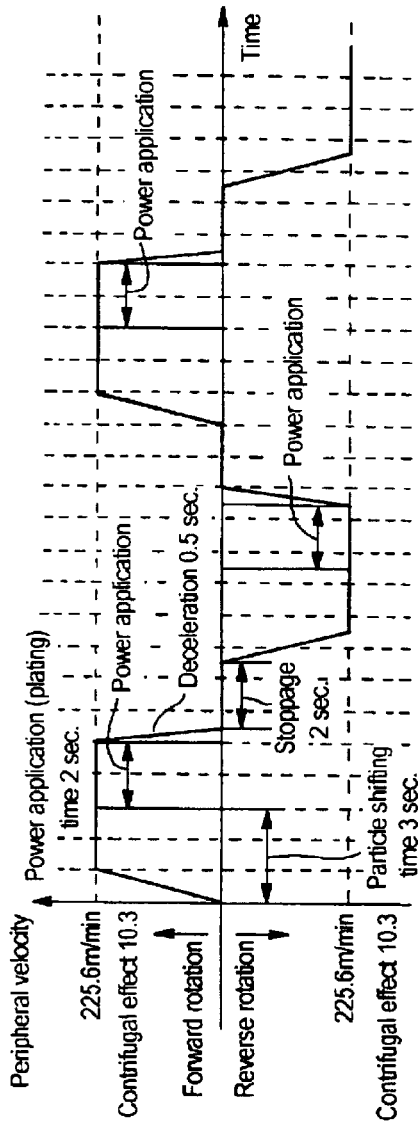
FIG. 31 is a time chart showing operation conditions of Example 31.

FIG. 31 shows a time chart of the driving conditions.

The eutectic solder plated resin fine particles having an eutectic solder plated layer as the outermost layer thus obtained were observed under an optical microscope, and all the particles existed as individually isolated particles.

Moreover, the average particle size of 300 of the nickel solder plated resin fine particles was 119.3 μm and the thickness of the solder plated layer was 4.12 μm. The variation coefficient of the particle size was 3.6%, thereby indicating that the thickness of the solder plated layer was extremely uniform. The resulting solder coat was analyzed by the atomic absorption method, and Sn was 62.6%, which proved its eutectic composition. Here, there were no particles influenced by a melt down base nickel plating layer due to the bipolar phenomenon.

EXAMPLE 33

A nickel plated layer was formed as a conductive base layer by an electroless plating method on each of organic resin fine particles having a specific gravity of 1.19, an average particle size of 19.74 μm, a standard deviation of 0.28 μm and a variation coefficient of 1.4%, formed by copolymerizing styrene and divinylbenzene; thus, electroless nickel plated fine particles having an electroless nickel-film thickness of 2000 Å were obtained. The specific gravity of the electroless nickel plated fine particles thus obtained was 1.637.

The resulting nickel plated fine particles (4.8 g) were subjected to nickel plating on their surface by using a manufacturing device for conductive fine particles shown in FIG. 11.

A porous member, which was formed by affixing a nylon filter sheet 20 having a pore size of 10 μm and a thickness of 10 μm onto the upper surface of a plate-shaped porous support 22 having a pore size of 100 μm and a thickness of 6 mm, made from high density polyethylene, was used as the porous member 21.

Metal nickel was used as the anode 2a.

A Watt bath was used as the plating solution.

The composition of the plating solution was 68 g/L of nickel concentration, 42 g/L of nickel chloride, 260 g/L of nickel sulfate, and 42 g/L of boric acid. The plating solution had a pH of 3.7 and a specific gravity of 1.18.

Power was applied across the electrodes under the conditions that the temperature of the plating solution was 50° C., the current was 33 A, and the current density was 0.35 A/dm$^2$. Here, the total power application time was approximately 50 minutes.

With respect to the driving conditions, the number of revolutions of the treatment chamber was set so as to provide a centrifugal effect of 10.3. The inner diameter of the treatment chamber used in this case was 280 mm, and the number of revolutions of the treatment chamber was 256.5 rpm, and the peripheral velocity thereof was 225.6 m/min. The particle shifting time was 7 seconds, the power application time was 3 seconds, the deceleration time was 0.5 second, and the stoppage time was 2 seconds; these were set as one cycle, and the forward and reverse rotations were repeated.

At this time, the power application efficiency (the ratio of power application time in one cycle) was 24.0%.

Figure 32:
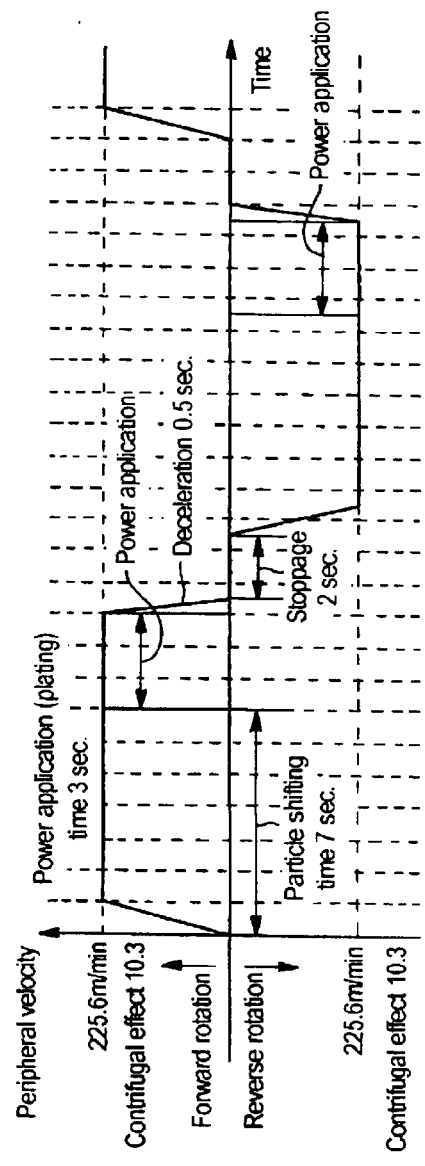
FIG. 32 is a time chart showing operation conditions of Example 32.

FIG. 32 shows a time chart of the driving conditions.

The nickel plated resin fine particles having a nickel plated layer as the outermost layer thus obtained were observed under an optical microscope, and all the particles existed as individually isolated particles without any aggregation. Moreover, the average particle size of 300 of the nickel plated resin fine particles was 22.62 μm and the thickness of the nickel plated layer was 1.44 μm. The variation coefficient of the particle size was 2.6%, thereby indicating that the thickness of the nickel plated layer was extremely uniform. Here, there were no particles influenced by a melt down base nickel plating layer due to the bipolar phenomenon.

EXAMPLE 34

The nickel plated resin fine particles (14.0 g) (particle size: 22.62 m, variation coefficient: 2.6%, specific gravity: 3.759) having a nickel plating layer as the outermost layer, obtained in Example 33, were subjected to eutectic solder plating on their surface by using a manufacturing device for conductive fine particles shown in FIG. 11.

A porous member, which was formed by affixing a nylon filter sheet 20 having a pore size of 10 μm and a thickness of 10 μm onto the upper surface of a plate-shaped porous support 22 having a pore size of 100 μm and a thickness of 6 mm, made from high density polyethylene, was used as the porous member 21.

An alloy of tin (Sn):lead (Pb)=6:4 was used as the anode 2a.

Acid bath (537A) produced by Ishihara Yakuhin Kogyo K.K. was used as the plating solution.

The composition of the plating solution was adjusted so that the total metal concentration was 21.39 g/L, the metal ratio in the bath was 65.3% of Sn, 106.4 g/L of alkanol sulfonic acid, and 40 mL of an additive.

Power was applied across the electrodes under the conditions that the temperature of the plating solution was 20° C., the current was 40.5 A, and the current density was 0.5 A/dm$^2$. The total power application time was 105 minutes.

The driving condition was set so that the number of revolutions of the treatment chamber provides a centrifugal effect of 10.3. The treatment chamber used here had an inner diameter of 280 mm, the number of revolutions of the treatment chamber was 256.5 rpm, and the peripheral velocity thereof was 225.6 m/min. The particle shifting time was 5 seconds, the power application time was 1.5 seconds, the deceleration time was 0.5 second, and the stoppage time of 2 seconds; thus, there were set as one cycle, and the forward and reverse rotations were repeated.

At this time, the power application efficiency (the ratio of power application time in one cycle) was 16.7%.

FIG. 33 shows a time chart of the driving conditions.

The eutectic solder plated resin fine particles having an eutectic solder plated layer as the outermost layer thus obtained were observed under an optical microscope, and all the particles existed as individually isolated particles.

Moreover, the average particle size of 300 of the nickel plated resin fine particles was 26.59 μm and the thickness of the solder plated layer was 1.99 μm. The variation coefficient of the particle size was 3.8%, thereby indicating that the thickness of the solder plated layer was extremely uniform. The resulting solder coat was analyzed by the atomic absorption method, and Sn was 59.7%, which proved its eutectic composition. Here, there were no particles influenced by a melt down base nickel plating layer due to the bipolar phenomenon.

COMPARATIVE EXAMPLE 14

A nickel plating layer was formed as a conductive base layer on each of the completely same organic resin fine particles as Example 27 by using an electroless plating method; thus, electroless nickel plated fine particles having an electroless nickel film thickness of 2000 Å were obtained. The resulting electroless nickel plating fine particles had a specific gravity of 1.204.

The nickel plated fine particles (105 g) thus obtained were subjected to nickel plating on their surface by using a manufacturing device for conductive fine particles shown in FIG. 11.

The plating was carried out in the same manner as Example 27 except that the driving conditions were altered as follows:

The number of revolutions of the treatment chamber was set so as to provide a centrifugal effect of 47.4. The inner diameter of the treatment chamber used in this case was 280 mm, the number of revolutions of the treatment chamber was 550.0 rpm, and the peripheral velocity thereof was 483.8 m/min. The particle shifting time was 1 second, the power application time was 3 seconds, the deceleration time was 1 second, and the stoppage time was 1 second; these were set as one cycle, and the forward and reverse rotations were repeated.

At this time, the power application efficiency (the ratio of power application time in one cycle) was 45.5%.

FIG. 34 shows a time chart of the driving conditions.

In the case of the centrifugal effect of not less than 40.0, the time it took for the fine particles to reach the contact ring was greatly shortened; however, since the plating solution, which had been subjected to a force in the outer circumferential direction due to the centrifugal force, formed a vortex having a mortar-like shape inside the treatment chamber, with the result that the anode placed in the center of the treatment chamber was exposed, failing to flow current and to carry out plating.

COMPARATIVE EXAMPLE 15

A nickel plating layer was formed as a conductive base layer on each of the completely same organic resin fine particles as Example 27 by using an electroless plating method; thus, electroless nickel plated fine particles having an electroless nickel film thickness of 2000 Å were obtained. The resulting electroless nickel plating fine particles had a specific gravity of 1.204.

The nickel plated fine particles (105 g) thus obtained were subjected to nickel plating on their surface by using a manufacturing device for conductive fine particles shown in FIG. 11.

The plating was carried out in the same manner as Example 27 except that the driving conditions were altered as follows:

The number of revolutions of the treatment chamber was set so as to provide a centrifugal effect of 1.6. The inner diameter of the treatment chamber used in this case was 280 mm, the number of revolutions of the treatment chamber was 99.8 rpm, and the peripheral velocity thereof was 87.7 m/min. The particle shifting time was 10 seconds, the power application time was 5 seconds, the deceleration time was 1 second, and the stoppage time was 1 second; these were set as one cycle, and the forward and reverse rotations were repeated.

At this time, the power application efficiency (the ratio of power application time in one cycle) was 29.4%.

Figure 35:
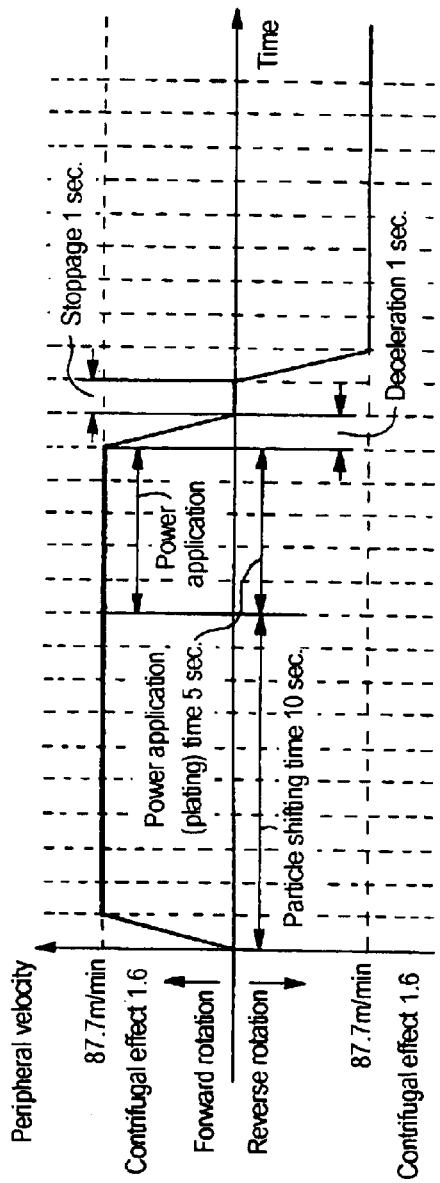
FIG. 35 is a time chart showing operation conditions of Comparative Example 15.

FIG. 35 shows a time chart of the driving conditions.

In the case of the centrifugal effect of not more than 2.0, the fine particles hardly approached the contact ring even when the particle shifting time was set to 10 seconds, the bipolar phenomenon occurred, causing melt-down in the electroless plating layers of almost all the particles, and the as a result failing to carry out plating.

COMPARATIVE EXAMPLE 16

A nickel plating layer was formed as a conductive base layer on each of the completely same organic resin fine particles as Example 27 by using an electroless plating method; thus, electroless nickel plated fine particles having an electroless nickel film thickness of 2000 Å were obtained. The resulting electroless nickel plating fine particles had a specific gravity of 1.204.

The nickel plated fine particles (105 g) thus obtained were subjected to nickel plating on their surface by using a manufacturing device for conductive fine particles shown in FIG. 11.

The plating was carried out in the same manner as Example 27 except that the driving conditions were altered as follows:

The number of revolutions of the treatment chamber was set so as to provide a centrifugal effect of 28.6. The inner diameter of the treatment chamber used in this case was 280 mm, the number of revolutions of the treatment chamber was 427.5 rpm, and the peripheral velocity thereof was 376.0 m/min. The particle shifting time was 12 seconds, the power application time was 3 seconds, the deceleration time was 1 second, and the stoppage time was 1 second; these were set as one cycle, and the forward and reverse rotations were repeated.

At this time, the power application efficiency (the ratio of power application time in one cycle) was 17.6%.

Figure 36:
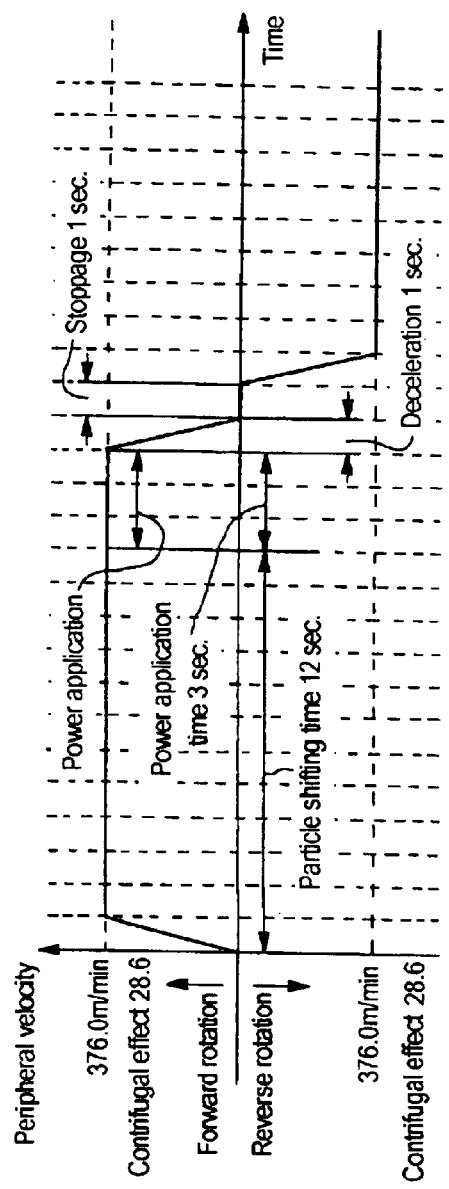
FIG. 36 is a time chart showing operation conditions of Comparative Example 16.

FIG. 36 shows a time chart of the driving conditions.

Even in the case of the centrifugal effect of 28.6 which was within the plating permissible range in Example 2, since the particle shifting time was set too long, the plating solution, which had been subjected to a force in the outer circumferential direction due to the centrifugal force, formed a vortex having a mortar-like shape inside the treatment chamber, with the result that the anode placed in the center of the treatment chamber was exposed. As a result, the current did not flow and plating did not be curried out.

COMPARATIVE EXAMPLE 17

A nickel plating layer was formed as a conductive base layer on each of the completely same organic resin fine particles as Example 27 by using an electroless plating method; thus, electroless nickel plated fine particles having an electroless nickel film thickness of 2000 Å were obtained. The resulting electroless nickel plating fine particles had a specific gravity of 1.204.

The nickel plated fine particles (105 g) thus obtained were subjected to nickel plating on their surface by using a manufacturing device for conductive fine particles shown in FIG. 11.

The plating was carried out in the same manner as Example 27 except that the driving conditions were altered as follows:

The number of revolutions of the treatment chamber was set so as to provide a centrifugal effect of 28.6. The inner diameter of the treatment chamber used in this case was 280 mm, the number of revolutions of the treatment chamber was 427.5 rpm, and the peripheral velocity thereof was 376.0 m/min. The particle shifting time was 0 seconds, the power application time was 5 seconds, the deceleration time was 1 second, and the stoppage time was 1 second; these were set as one cycle, and the forward and reverse rotations were repeated.

At this time, the power application efficiency (the ratio of power application time in one cycle) was 71.4%.

Figure 37:
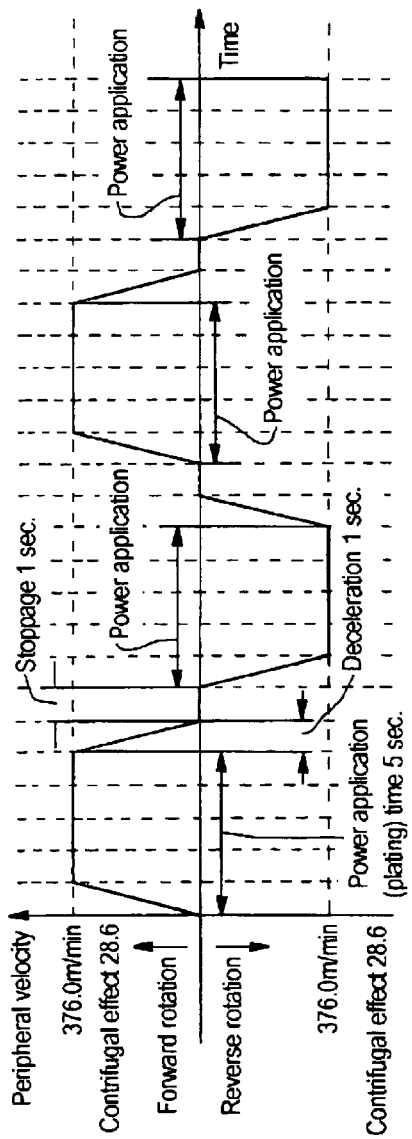
FIG. 37 is a time chart showing operation conditions of Comparative Example 17.

FIG. 37 shows a time chart of the driving conditions.

Since the power application was started simultaneously with the rotation of the treatment chamber, an electric current was allowed to flow while the fine particles were shifting toward the contact ring. As a result, the bipolar phenomenon occurred, causing melt-down in the electroless plating layers of almost all the fine particles, and failing to carry out plating.

When the resulting fine particles were observed under an optical microscope, it was found that approximately 90% of the, fine particles had melt-down electroless plating layers due to the bipolar phenomenon, and were left as exposed resin fine particles.

COMPARATIVE EXAMPLE 18

A nickel plating layer was formed as a conductive base layer on each of the completely same organic resin fine particles as Example 27 by using an electroless plating method; thus, electroless nickel plated fine particles having an electroless nickel film thickness of 2000 Å were obtained.

long, the efficiency became inferior and the total plating times took approximately twice longer than that of Example 1.

Table 10 shows the results of Examples 27 to 34 as well as Comparative Examples 14 to 18.

TABLE 10

|  | Particle size (μm) | Particle specific gravity | Centrifugal effect | Peripheral velocity (m/min.) | Number of revolutions (rpm) | Particle shifting time (sec.) | Power application time (sec.) | Deceleration time (sec.) | Stoppage time (sec.) | Power application efficiency (%) | Evaluation |
|---|---|---|---|---|---|---|---|---|---|---|---|
| Ex. 27 | 650 | 1.20 | 10.3 | 225.6 | 256.5 | 4 | 5 | 1 | 1 | 45.5 | ○ |
| Ex. 28 | 650 | 1.20 | 28.6 | 376 | 427.5 | 2 | 3 | 0.5 | 1 | 46.2 | ○ |
| Ex. 29 | 650 | 1.20 | 3.2 | 125.3 | 142.5 | 8 | 5 | 1 | 0 | 35.7 | ○ |
| Ex. 30 | 650 | 1.57 | 10.3 | 225.6 | 256.5 | 2 | 3 | 0.5 | 2 | 40.0 | ○ |
| Ex. 31 | 106 | 1.28 | 10.3 | 225.6 | 256.5 | 4 | 5 | 1 | 1 | 45.5 | ○ |
| Ex. 32 | 106 | 2.11 | 10.3 | 225.6 | 256.5 | 3 | 2 | 0.5 | 2 | 26.7 | ○ |
| Ex. 33 | 20 | 1.64 | 10.3 | 225.6 | 256.5 | 7 | 3 | 0.5 | 2 | 24.0 | ○ |
| Ex. 34 | 20 | 3.76 | 10.3 | 225.6 | 256.5 | 5 | 1.5 | 0.5 | 2 | 16.7 | ○ |
| Compar. Ex. 14 | 650 | 1.20 | 47.4 | 483.8 | 550 | 1 | 3 | 1 | 1 | 50.0 | X |
| Compar. Ex. 15 | 650 | 1.20 | 1.6 | 87.7 | 99.8 | 10 | 5 | 1 | 1 | 29.4 | X |
| Compar. Ex. 16 | 650 | 1.20 | 28.6 | 376 | 427.5 | 12 | 3 | 1 | 1 | 17.6 | Δ |
| Compar. Ex. 17 | 650 | 1.20 | 28.6 | 376 | 427.5 | 0 | 5 | 1 | 1 | 71.4 | X |
| Compar. Ex. 18 | 650 | 1.20 | 10.3 | 225.6 | 256.5 | 4 | 5 | 1 | 12 | 22.7 | Δ |

The resulting electroless nickel plating fine particles had a specific gravity of 1.204.

The nickel plated fine particles (105 g) thus obtained were subjected to nickel plating on their surface by using a manufacturing device for conductive fine particles shown in FIG. 11.

The plating was carried out in the same manner as Example 27 except that the driving conditions were altered as follows: The number of revolutions of the treatment chamber was set so as to provide a centrifugal effect of 10.3. The inner diameter of the treatment chamber used in this case was 280 mm, the number of revolutions of the treatment chamber was 256.5 rpm, and the peripheral velocity thereof was 225.6 m/min. The particle shifting time was 4 seconds, the power application time was 5 seconds, the deceleration time was 1 second, and the stoppage time was 12 seconds; these were set as one cycle, and the forward and reverse rotations were repeated.

At this time, the power application efficiency (the ratio of power application time in one cycle) was 22.7%.

Figure 38:
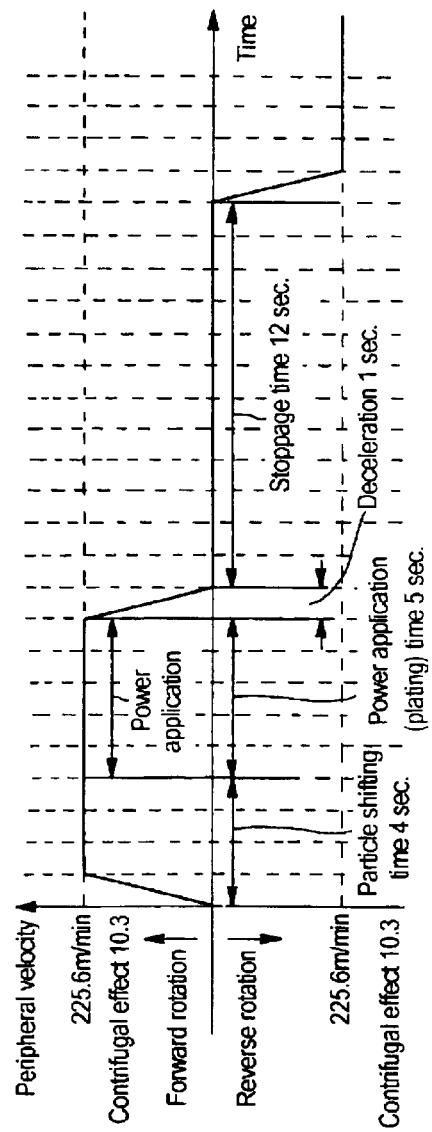
FIG. 38 is a time chart showing operation conditions of Compative Example 18.

FIG. 38 shows a time chart of the driving conditions.

The nickel plated resin fine particles having a nickel plating layer as the outermost layer thus obtained were observed under an optical microscope, and all the particles existed as individually isolated particles without any aggregation.

Moreover, the average particle size of 300 of the nickel plated resin fine particles was 660.33 μm and the thickness of the nickel plated layer was 4.98 μm. The variation coefficient of the particle size was 2.8%, thereby indicating that the thickness of the nickel plated layer was extremely uniform. Here, there were no particles influenced by a melt down base nickel plating layer due to the bipolar phenomenon.

The fine particles thus obtained were the same as those of Example 1; however, since the stoppage time was set too

EXAMPLE 35

A nickel plated layer was formed as a conductive base layer by an electroless plating method on each of organic resin fine particles having a specific gravity of 1.19, an average particle size 650.8 μm, a standard deviation 9.75 μm and a variation coefficient of 1.5%, formed by copolymerizing styrene and divinylbenzene; thus, electroless nickel plated fine particles having a nickel-film thickness of 2000 Å were obtained. The specific gravity of the electroless nickel plated fine particles thus obtained was 1.204.

The resulting nickel plated fine particles (105 g) were subjected to nickel plating on their surface by using a manufacturing device for conductive fine particles shown in FIG. 11.

A porous member, which was formed by affixing a nylon filter sheet 20 having a pore size of 10 μm and a thickness of 10 μm onto the upper surface of a plate-shaped porous support 22 having a pore size of 100 μm and a thickness of 6 mm, made from high density polyethylene, was used as the porous member 21.

Metal nickel was used as the anode 2a.

A Watt bath was used as the plating solution.

The composition of the plating solution was 42 g/L of nickel concentration, 39 g/L of nickel chloride, 150 g/L of nickel sulfate, and 45 g/L of boric acid. The plating solution had a pH of 3.8 and a specific gravity of 1.11.

Power was applied across the electrodes under the conditions that the temperature of the plating solution was 50° C., the current was 32 A, and the current density was 0.4 A/dm$^2$. Here, the total power application time was approximately 80 minutes.

With respect to the driving conditions, the number of revolutions of the treatment chamber was set so as to provide a centrifugal effect of 10.3. The inner diameter of the treatment chamber used in this case was 280 mm, and the number of revolutions of the treatment chamber was 256.5 rpm, and the peripheral velocity thereof was 225.6 m/min.

With respect to the driving pattern in the plating initial stage, the particle shifting time was 4 seconds, the power application time was 5 seconds, the deceleration time was 1 second, and the stoppage time was 1 second; these were set as one cycle, and the forward and reverse rotations were repeated. Approximately 39 minutes after the plating start, the fine particles were sampled and observed under an optical microscope, and all the particles existed as individually isolated particles without any aggregation. Moreover, the average particle size of 100 of the nickel plated resin fine particles was 652.82 $\mu$m and the thickness of the nickel plated layer was 1.02 $\mu$m, and the specific gravity thereof was 1.276. Here, the driving pattern was altered so as to shorten the particle shifting time so that one cycle included the particle shifting time of 2 seconds, the power application time of 5 seconds, the deceleration time of 1 second and the stoppage time of 1 second, and the forward and reverse rotations were repeated; thus, the plating was continued. The total plating time was approximately 168 minutes.

The nickel plated resin fine particles having a nickel plated layer as the outermost layer thus obtained were observed under an optical microscope, and all the particles existed as individually isolated particles without any aggregation.

Moreover, the average particle size of 300 of the nickel plated resin fine particles was 661.06 $\mu$m and the thickness of the nickel plated layer was 5.14 $\mu$m. The variation coefficient of the particle size was 2.5%, thereby indicating that the thickness of the nickel plated layer was extremely uniform. Here, there were no particles influenced by a melt down base nickel plating layer due to the bipolar phenomenon.

From the above-mentioned plating film thickness and the total plating time, it was found that the plating time per 1 $\mu$m of coat film was approximately 32.7 minutes.

EXAMPLE 36

By using completely the same electroless nickel plated fine particles as Example 35, plating was carried out in the same manner as Example 35 except that the driving conditions were altered as follows:

With respect to the driving pattern in the plating initial stage, the particle shifting time was 4 seconds, the power application time was 5 seconds, the deceleration time was 1 second, and the stoppage time was 1 second; these were set as one cycle, and the forward and reverse rotations were repeated. Approximately 37 minutes after the plating start, the fine particles were sampled and observed under an optical microscope, and all the particles existed as individually isolated particles without any aggregation. Moreover, the average particle size of 100 of the nickel plated resin fine particles was 652.74 $\mu$m and the thickness of the nickel plated layer was 0.98 $\mu$m, and the specific gravity thereof was 1.273. Here, the driving pattern was altered so as to shorten the particle shifting time so that one cycle included the particle shifting time of 0.5 seconds, the power application time of 5 seconds, the deceleration time of 1 second and the stoppage time of 1 second, and the forward and reverse rotations were repeated; thus, the plating was continued. The total plating time was approximately 143 minutes.

The nickel plated resin fine particles having a nickel plated layer as the outermost layer thus obtained were observed under an optical microscope, and all the particles existed as individually isolated particles without any aggregation.

Moreover, the average particle size of 300 of the nickel plated resin fine particles was 660.88 $\mu$m and the thickness of the nickel plated layer was 5.05 $\mu$m. The variation coefficient of the particle size was 2.5%, thereby indicating that the thickness of the nickel plated layer was extremely uniform. Here, there were no particles influenced by a melt down base nickel plating layer due to the bipolar phenomenon.

From the above-mentioned plating film thickness and the total plating time, it was found that the plating time per 1 m of coat film was approximately 28.3 minutes.

EXAMPLE 37

By using completely the same electroless nickel plated fine particles as Example 35, plating was carried out in the same manner as Example 35 except that the driving conditions were altered as follows:

With respect to the driving pattern in the plating initial stage, the particle shifting time was 4 seconds, the power application time was 5 seconds, the deceleration time was 1 second, and the stoppage time was 1 second; these were set as one cycle, and the forward and reverse rotations were repeated. At approximately 23 minutes after the plating start, the fine particles were sampled and observed under an optical microscope, and all the particles existed as individually isolated particles without any aggregation. Moreover, the average particle size of 100 of the nickel plated resin fine particles was 650.00 $\mu$m and the thickness of the nickel plated layer was 0.61 $\mu$m, and the specific gravity thereof was 1.247. Here, the driving pattern was altered so as to shorten the particle shifting time so that one cycle included the particle shifting time of 0.5 seconds, the power application time of 5 seconds, the deceleration time of 1 second and the stoppage time of 1 second, and the forward and reverse rotations were repeated; thus, the plating was continued. The total plating time was approximately 140 minutes.

The nickel plated resin fine particles having a nickel plated layer as the outermost layer thus obtained were observed under an optical microscope, and all the particles existed as individually isolated particles without any aggregation.

Moreover, the average particle size of 300 of the nickel plated resin fine particles was 660.98 $\mu$m and the thickness of the nickel plated layer was 5.10 $\mu$m. The variation coefficient of the particle size was 2.6%, thereby indicating that the thickness of the nickel plated layer was extremely uniform. Here, there were no particles influenced by a melt down base nickel plating layer due to the bipolar phenomenon.

From the above-mentioned plating film thickness and the total plating time, it was found that the plating time per 1 $\mu$m of coat film was approximately 27.5 minutes.

COMPARATIVE EXAMPLE 19

By using completely the same electroless nickel plated fine particles as Example 35, plating was carried out in the same manner as Example 35 except that the driving conditions were altered as follows:

With respect to the driving pattern in the plating initial stage, the particle shifting time was 12 seconds, the power application time was 5 seconds, the deceleration time was 1 second, and the stoppage time was 1 second; these were set as one cycle, and the forward and reverse rotations were repeated.

Since the particle shifting time was extended to 12 seconds, the plating solution, which had been subjected to a force in the outer circumferential direction due to the centrifugal force, formed a vortex having a mortar-like shape inside the treatment chamber, with the result that the anode placed in the center of the treatment chamber was exposed, failing to flow current and to carry out plating.

Moreover, the average particle size of 300 of the nickel plated resin fine particles was 657.76 μm and the thickness of the nickel plated layer was 3.69 μm. The variation coefficient of the particle size was 13.2%, thereby indicating that the thickness of the nickel plated layer was extremely ununiform.

Table 11 shows Examples 35 to 37 and Comparative Examples 19 and 20.

TABLE 11

|  | Initial driving pattern (sec.) | | | | Driving pattern after alternation (sec.) | | | | Start time of pattern alternation (min.) | Film thickness at the time of alternation (μm) | Film thickness at the time of completion of plating (μm) | Variation coefficient (%) | Total plating time (min.) | Plating time 1 μm of coat film (min./μm) |
| --- | --- | --- | --- | --- | --- | --- | --- | --- | --- | --- | --- | --- | --- | --- |
|  | Particle shifting time | Power application time | Deceleration time | Stoppage time | Particle shifting time | Power application time | Deceleration time | Stoppage time |  |  |  |  |  |  |
| Ex. 35 | 4 | 5 | 1 | 1 | 2 | 5 | 1 | 1 | 39 | 1.02 | 5.14 | 2.5 | 168 | 32.68 |
| Ex. 36 | 4 | 5 | 1 | 1 | 0.5 | 5 | 1 | 1 | 37 | 0.98 | 5.05 | 2.7 | 143 | 28.32 |
| Ex. 37 | 4 | 5 | 1 | 1 | 0.5 | 5 | 1 | 1 | 23 | 0.61 | 5.10 | 2.6 | 140 | 27.45 |
| Compar. Ex. 19 | 12 | 5 | 1 | 1 | — | — | — | — | — | — | Formation of vortex, no current flow, no plating | | | |
| Compar. Ex. 20 | 4 | 5 | 1 | 1 | 0 | 5 | 1 | 1 | 44 | 1.14 | 3.69 | 13.2 | Bipolar phenomenon occurred | |

COMPARATIVE EXAMPLE 20

By using completely the same electroless nickel plated fine particles as Example 35, plating was carried out in the same manner as Example 9 except that the driving conditions were altered as follows:

With respect to the driving pattern in the plating initial stage, the particle shifting time was 4 seconds, the power application time was 5 seconds, the deceleration time was 1 second, and the stoppage time was 1 second; these were set as one cycle, and the forward and reverse rotations were repeated. Approximately 44 minutes after the plating start, the fine particles were sampled and observed under an optical microscope, and all the particles existed as individually isolated particles without any aggregation. Moreover, the average particle size of 100 of the nickel plated resin fine particles was 653.06 μm and the thickness of the nickel plated layer was 1.14 μm, and the specific gravity thereof was 1.276. Here, the driving pattern was altered so as to shorten the particle shifting time so that one cycle included the particle shifting time of 0 seconds, the power application time of 5 seconds, the deceleration time of 1 second and the stoppage time of 1 second, and the forward and reverse rotations were repeated; thus, the plating was continued. The total plating time was approximately 140 minutes.

The nickel plated resin fine particles having a nickel plated layer as the outermost layer thus obtained were observed under an optical microscope, and all the particles existed as individually isolated particles without any aggregation.

However, since the particle shifting time was set to 0 after the alternation of the driving pattern, power was applied simultaneously as the particles started to shift toward the cathode; therefore, the bipolar phenomenon occurred until they contacted the cathode, with the result that a few particles had melt-down electroless nickel layers, although the number thereof was small.

EXAMPLE 38

A nickel coating with a thickness of 0.2 μm was formed by electroless plating on a divinylbenzene polymer having an average particle size of 23 μm, a CV value of 5%, an aspect ratio of 1.04, a K value of 400 kgf/mm² at the time of 10% deformation and a recovery rate of 60%. Thereafter, a filter was formed on the outer circumferential portion of a rotatable electroplating device having a cathode on the circumferential portion and an anode that was placed in a manner so as not to contact the cathode, and while this is being continuously rotated, stopped, subjected to a ultrasonic process, and reversed, gold was plated with a thickness of 0.8 μm with a plating solution being supplied thereto; thus, conductive fine particles having a plating thickness variation coefficient of 10%, an average particle size 25 μm, a CV value of 5%, and an aspect ratio of 1.04 were formed.

Here, the average particle size, the CV value (standard deviation/average particle size) and the aspect ratio are values obtained through observation of 300 particles under an electronic microscope. The K value is represented by:

$$K = (3/\sqrt{2}) \cdot F \cdot S^{-3/2} \cdot R^{-1/2}$$

where F is a load value (kgf) at 20° C. at the time of 10% compressed deformation, S represents a compressed dislocation (mm) and R is a radius (mm).

The recovery rate is a value after the 10% compressed deformation at 20° C.

The plating thickness and the plating variation coefficient were found through observation on cross-sections of 20 plating particles under an electronic microscope.

The conductive fine particles were mixed with, and dispersed in a thermosetting epoxy resin with a concentration of 10% so that an anisotropic conductive paste was formed. This was applied to a glass-epoxy copper coated substrate (thickness: 1.6 mm, wiring width: 80 μm, electrode pitch: 200 μm) with a virtually uniform thickness by a screen printing method.

On this is superposed a polyimide film substrate (thickness: 50 μm, wiring width: 80 μm, electrode pitch: 200 μm) with a thickness of 100 μm, and this was then heated and pressed at 150° C. for two minutes; thus, a conductive connecting element was formed.

This conductive connecting element had a sufficiently low connecting resistivity of 0.002Ω, and a connecting resistance between the adjacent electrodes was not less than 1×10$^9$, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; however, the connecting resistance virtually showed no change.

Furthermore, the conductive fine particles were immersed into hot water of 120° C. for 24 hours, and then subjected to the same tests; however, no change was found in the connecting resistivity and the insulating property.

Here, the electric resistivity can be reduced by increasing the concentration of the conductive fine particles in the anisotropic conductive paste, the concentration of the conductive fine particles was gradually increased, and no leakage occurred between the electrodes until the concentration had reached 35%.

EXAMPLE 39

A nickel coating with a thickness of 0.1 μm was formed by electroless plating on a divinylbenzene polymer having an average particle size of 11 μm, a CV value of 10%, an aspect ratio of 1.09, a K value of 430 kgf/mm$^2$ and a recovery rate of 50%, with the other factors being the same as Example 38. Thereafter, gold was plated with a thickness of 0.4 μm; thus, conductive fine particles having a plating thickness variation coefficient of 20%, 12 μm of an average particle size, 10% of a CV value, and 1.09 of an aspect ratio were formed.

These conductive fine particles were subjected to the same tests as Example 38, and the results showed that the conductive connecting element had a sufficiently low connecting resistivity of 0.004 Ω, and a connecting resistance between the adjacent electrodes was not less than 1×10$^9$, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; however, the connecting resistance virtually showed no change.

Furthermore, the conductive fine particles were immersed into hot water of 120° C. for 24 hours, and then subjected to the same tests; however, no change was found in the connecting resistivity and the insulating property.

Here, the concentration of the conductive fine particles in the anisotropic conductive paste was gradually increased, and no leakage occurred between the electrodes until the concentration had reached 30%.

EXAMPLE 40

A nickel coating with a thickness of 0.2 μm was formed by electroless plating on a crosslinking acrylonitrile copolymer having an average particle size of 58 μm, a CV value of 5%, an aspect ratio of 1.04, a K value of 600 kgf/mm$^2$ and a recovery rate of 70%, with the other factors being the same as Example 38. Thereafter, gold was plated with a thickness of 0.8 μm; thus, conductive fine particles having a plating thickness variation coefficient of 10%, an average particle size 60 μm, a CV value of 5%, and an aspect ratio of 1.04 were formed.

These conductive fine particles were subjected to the same tests as Example 38, and the results showed that the conductive connecting element had a sufficiently low connecting resistivity of 0.004Ω, and a connecting resistance between the adjacent electrodes was not less than 1×10$^9$, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; however, the connecting resistance virtually showed no change.

Furthermore, the conductive fine particles were immersed into hot water of 120° C. for 24 hours, and then subjected to the same tests; however, no change was found in the connecting resistivity and the insulating property.

Here, the concentration of the conductive fine particles in the anisotropic conductive paste was gradually increased, and no leakage occurred between the electrodes until the concentration had reached 25%.

EXAMPLE 41

A nickel coating with a thickness of 0.2 μm was formed by electroless plating on a divinylbenzene polymer having an average particle size of 23 μm, a CV value of 15%, an aspect ratio of 1.1, a K value of 400 kgf/mm$^2$ and a recovery rate of 60%, with the other factors being the same as Example 38. Thereafter, gold was plated with a thickness of 0.8 μm; thus, conductive fine particles having a plating thickness variation coefficient of 10%, an average particle size 25 μm, a CV value of 15%, and an aspect ratio of 1.1 were formed.

These conductive fine particles were subjected to the same tests as Example 38, and the results showed that the conductive connecting element had a sufficiently low connecting resistivity of 0.008 Ω, and a connecting resistance between the adjacent electrodes was not less than 1×10$^9$ thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; however, the connecting resistance virtually showed no change.

Furthermore, the conductive fine particles were immersed into hot water of 120° C. for 24 hours, and then subjected to the same tests; however, no change was found in the connecting resistivity and the insulating property.

Here, the concentration of the conductive fine particles in the anisotropic conductive paste was gradually increased, and no leakage occurred between the electrodes until the concentration had reached 25%.

EXAMPLE 42

A nickel coating with a thickness of 0.2 μm was formed by electroless plating on a divinylbenzene polymer having an average particle size of 23 μm, a CV value of 10%, an aspect ratio of 1.2, a K value of 400 kgf/mm$^2$ and a recovery rate of 60%, with the other factors being the same as Example 38. Thereafter, gold was plated with a thickness of 0.8 μm; thus, conductive fine particles having a plating thickness variation coefficient of 10%, an average particle size 25 μm, a CV value of 10%, and an aspect ratio of 1.2 were formed.

These conductive fine particles were subjected to the same tests as Example 38, and the results showed that the conductive connecting element had a sufficiently low connecting resistivity of 0.008Ω, and a connecting resistance between the adjacent electrodes was not less than 1×10$^9$, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; however, the connecting resistance virtually showed no change.

Furthermore, the conductive fine particles were immersed into hot water of 120° C. for 24 hours, and then subjected to the same tests; however, no change was found in the connecting resistivity and the insulating property.

Here, the concentration of the conductive fine particles in the anisotropic conductive paste was gradually increased, and no leakage occurred between the electrodes until the concentration had reached 25%.

EXAMPLE 43

A nickel coating with a thickness of 0.2 μm was formed by electroless plating on an acrylic copolymer having an average particle size of 23 μm, a CV value of 10%, an aspect ratio of 1.09, a K value of 100 kgf/mm$^2$ and a recovery rate of 9%, with the other factors being the same as Example 38. Thereafter, gold was plated with a thickness of 0.8 μm; thus, conductive fine particles having a plating thickness variation coefficient of 10%, an average particle size 25 μm, a CV value of 10%, and an aspect ratio of 1.09 were formed.

These conductive fine particles were subjected to the same tests as Example 38, and the results showed that the conductive connecting element had a sufficiently low connecting resistivity of 0.01Ω, and a connecting resistance between the adjacent electrodes was not less than 1×10$^9$, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; and, although the connecting resistivity slightly increased, no problem arose in practical use.

Furthermore, the conductive fine particles were immersed into hot water of 120° C. for 24 hours, and then subjected to the same tests; however, no change was found in the connecting resistivity and the insulating property.

Here, the concentration of the conductive fine particles in the anisotropic conductive paste was gradually increased, and no leakage occurred between the electrodes until the concentration had reached 25%.

EXAMPLE 44

A nickel coating with a thickness of 0.2 μm was formed by electroless plating on silica having an average particle size of 23 μm, a CV value of 5%, an aspect ratio of 1.04, a K value of 3000 kgf/mm$^2$ and a recovery rate of 90%, with the other factors being the same as Example 38. Thereafter, gold was plated with a thickness of 0.8 μm; thus, conductive fine particles having a plating thickness variation coefficient of 10%, an average particle size of 25 μm, a CV value of 5%, and an aspect ratio of 1.04 were formed.

These conductive fine particles were subjected to the same tests as Example 38, and the results showed that the conductive connecting element had a sufficiently low connecting resistivity of 0.01Ω, and a connecting resistance between the adjacent electrodes was not less than 1×10$^9$, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; however, the connecting resistance virtually showed no change.

Furthermore, the conductive fine particles were immersed into hot water of 120° C. for 24 hours, and then subjected to the same tests; however, no change was found in the connecting resistivity and the insulating property.

Here, the concentration of the conductive fine particles in the anisotropic conductive paste was gradually increased, and no leakage occurred between the electrodes until the concentration had reached 35%.

EXAMPLE 45

A nickel coating with a thickness of 0.2 μm was formed by electroless plating on a divinylbenzene polymer having an average particle size of 24.5 μm, a CV value of 5%, an aspect ratio of 1.04, a K value of 4000 kgf/mm$^2$ and a recovery rate of 60%, with the other factors being the same as Example 38. Thereafter, gold was plated with a thickness of 0.1 μm; thus, conductive fine particles having a plating thickness variation coefficient of 30%, an average particle size of 25 μm, a CV value of 5%, and an aspect ratio of 1.04 were formed.

These conductive fine particles were subjected to the same tests as Example 38, and the results showed that the conductive connecting element had a sufficiently low connecting resistivity of 0.01Ω, and a connecting resistance between the adjacent electrodes was not less than 1×10$^9$, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; however, the connecting resistance virtually showed no change.

Furthermore, the conductive fine particles were immersed into hot water of 120° C. for 24 hours, and then subjected to the same tests; however, no change was found in the connecting resistivity and the insulating property.

Here, the concentration of the conductive fine particles in the anisotropic conductive paste was gradually increased, and no leakage occurred between the electrodes until the concentration had reached 25%.

EXAMPLE 46

A nickel coating with a thickness of 0.2 μm was formed by electroless plating on a divinylbenzene polymer having an average particle size of 14.5 μm, a CV value of 10%, an aspect ratio of 1.09, a K value of 430 kgf/mm$^2$ and a recovery rate of 50%, with the other factors being the same as Example 38. Thereafter, gold was plated with a thickness of 5 μm; thus, conductive fine particles having a plating thickness variation coefficient of 10%, an average particle size 25 μm, a CV value of 10%, and an aspect ratio of 1.09 were formed.

These conductive fine particles were subjected to the same tests as Example 38, and the results showed that the conductive connecting element had a sufficiently low connecting resistivity of 0.001Ω, and a connecting resistance between the adjacent electrodes was not less than 1×10⁹, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; and although the value became 5 times higher than the initial value, the connecting resistivity was still sufficiently low.

Furthermore, the conductive fine particles were immersed into hot water of 120° C. for 24 hours, and then subjected to the same tests; however, no change was found in the connecting resistivity and the insulating property.

Here, the concentration of the conductive fine particles in the anisotropic conductive paste was gradually increased, and no leakage occurred between the electrodes until the concentration had reached 40%.

EXAMPLE 47

A nickel coating with a thickness of 0.2 μm was formed by electroless plating on a divinylbenzene polymer having an average particle size of 23 μm, a CV value of 5%, an aspect ratio of 1.05, a K value of 400 kgf/mm² and a recovery rate of 60%, with the other factors being the same as Example 38. Thereafter, gold was plated with a thickness of 0.8 μm by barrel plating; thus, conductive fine particles having a plating thickness variation coefficient of 50%, an average particle size 30 μm, a CV value of 10%, and an aspect ratio of 1.1 were formed.

These conductive fine particles were subjected to the same tests as Example 38, and the results showed that the conductive connecting element had a sufficiently low connecting resistivity of 0.015Ω, and a connecting resistance between the adjacent electrodes was not less than 1×10⁹, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; and a slight increase in the connecting resistivity was seen, but this was considered to be within a permissible range of practical use.

Furthermore, the conductive fine particles were immersed into hot water of 120° C. for 24 hours, and then subjected to the same tests; however, no change was found in the connecting resistivity and the insulating property.

Here, the concentration of the conductive fine particles in the anisotropic conductive paste was gradually increased, and no leakage occurred between the electrodes until the concentration had reached 25%.

EXAMPLE 48

A nickel coating with a thickness of 0.2 μm was formed by electroless plating on a divinylbenzene polymer having an average particle size of 21.5 μm, a CV value of 5%, an aspect ratio of 1.04, a K value of 400 kgf/mm² and a recovery rate of 60%, with the other factors being the same as Example 38. Thereafter, solder was electroplated with a thickness of 5 μm; thus, conductive fine particles having a plating thickness variation coefficient of 10%, an average particle size 32 μm, a CV value of 5%, and an aspect ratio of 1.04 were formed.

These conductive fine particles were subjected to the same tests as Example 38, and the results showed that the conductive connecting element had a sufficiently low connecting resistivity of 0.002Ω, and a connecting resistance between the adjacent electrodes was not less than 1×10⁹, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; however, the connecting resistance virtually showed no change.

Furthermore, the conductive fine particles were immersed into hot water of 120° C. for 24 hours, and then subjected to the same tests; and although the connecting resistivity became 2 times greater than before, no change was found in the insulating property.

Here, the concentration of the conductive fine particles in the anisotropic conductive paste was gradually increased, and no leakage occurred between the electrodes until the concentration had reached 40%.

EXAMPLE 49

The conductive fine particles obtained in Example 48 were alloy-bonded onto bumps of an IC chip, and after the periphery of the conductive fine particles had been surrounded by epoxy resin, this was positioned on the bumps on the substrate, and heated and pressed so as to be alloy-bonded. The resulting structural element had a low resistivity in the same manner as Example 48 with high reliability.

COMPARATIVE EXAMPLE 21

A nickel coating with a thickness of 0.2 μm was formed by electroless plating on a divinylbenzene polymer having an average particle size of 24.5 μm, a CV value of 5%, an aspect ratio of 1.04, a K value of 400 kgf/mm² and a recovery rate of 60%, with the other factors being the same as Example 38. Thereafter, gold was deposited as much as possible by substitute plating so as to have a thickness of 0.1 μm; thus, conductive fine particles having a plating thickness variation coefficient of 10%, an average particle size of 25 μm, a CV value of 5%, and an aspect ratio of 1.04 were formed.

These conductive fine particles were subjected to the same tests as Example 38, and the results showed that the conductive connecting element had a connecting resistivity of 0.04Ω, and it was inferior to the conductive fine particles of the present invention, but a connecting resistance between the adjacent electrodes was not less than 1×10⁹, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; and a significant increase in the connecting resistivity was seen.

Furthermore, the conductive fine particles were immersed into hot water of 120° C. for 24 hours, and then subjected to the same tests; and no change was found in the insulating resistivity, but a significant increase was seen in the connecting resistivity.

Here, the concentration of the conductive fine particles in the anisotropic conductive paste was gradually increased, and no leakage occurred between the electrodes until the concentration had reached 25%.

COMPARATIVE EXAMPLE 22

A nickel coating with a thickness of 0.05 μm was formed by electroless plating on a divinylbenzene polymer having an average particle size of 0.2 μm, a CV value of 30%, an aspect ratio of 1.1, a K value of 600 kgf/mm² and a recovery rate of 40%, with the other factors being the same as Example 38. Thereafter, gold was electroplated with a thickness of 0.05 μm; thus, conductive fine particles having a plating thickness variation coefficient of 20%, an average particle size of 0.4 λm, a CV value of 25%, and an aspect ratio of 1.2 were formed.

These conductive fine particles were subjected to the same tests as Example 38; however, failure in connection occurred in one portion.

COMPARATIVE EXAMPLE 23

A nickel coating with a thickness of 0.2 μm was formed by electroless plating on a divinylbenzene polymer having an average particle size of 6000 μm, a CV value of 5%, an aspect ratio of 1.04, a K value of 300 kgf/mm² and a recovery rate of 60%, with the other factors being the same as Example 38. Thereafter, gold was electroplated with a thickness of 0.8 μm; thus, conductive fine particles having a plating thickness variation coefficient of 10%, an average particle size of 6000 μm, a CV value of 5%, and an aspect ratio of 1.04 were formed.

These conductive fine particles were subjected to the same tests as Example 38; however, shortcircuiting occurred due to failure in serving as fine electrodes even in the case of electrode pitches of 3000 μm.

COMPARATIVE EXAMPLE 24

A nickel coating with a thickness of 0.2 μm was formed by electroless plating on a divinylbenzene polymer having an average particle size of 23 μm, a CV value of 60%, an aspect ratio of 1.08, a K value of 400 kgf/mm² and a recovery rate of 60%, with the other factors being the same as Example 38. Thereafter, gold was electroplated with a thickness of 0.8 μm; thus, conductive fine particles having a plating thickness variation coefficient of 20%, an average particle size of 25 μm, a CV value of 60%, and an aspect ratio of 1.1 were formed.

These conductive fine particles were subjected to the same tests as Example 38, and the results showed that the conductive connecting element had a significantly high connecting resistivity of 0.03Ω; however, a connecting resistance between the adjacent electrodes was not less than 1×10⁹, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; however, the connecting resistance virtually showed no change.

Furthermore, the conductive fine particles were immersed into hot water of 120° C. for 24 hours, and then subjected to the same tests; however, no change was found in the connecting resistivity and the insulating property.

Here, when the concentration of the conductive fine particles in the anisotropic conductive paste was gradually increased, current leakage occurred between the electrodes at the concentration of 15%.

COMPARATIVE EXAMPLE 25

A nickel coating with a thickness of 0.2 μm was formed by electroless plating on a divinylbenzene polymer having an average particle size of 23 μm, a CV value of 15%, an aspect ratio of 1.6, a K value of 400 kgf/mm² and a recovery rate of 60%, with the other factors being the same as Example 38. Thereafter, gold was electroplated with a thickness of 0.8 μm; thus, conductive fine particles having a plating thickness variation coefficient of 10%, an average particle size of 25 μm, a CV value of 15%, and an aspect ratio of 1.6 were formed.

These conductive fine particles were subjected to the same tests as Example 38, and the results showed that the conductive connecting element had a significantly high connecting resistivity of 0.03Ω; however, a connecting resistance between the adjacent electrodes was not less than 1×10⁹, thereby providing a sufficient line-to-line insulating property.

Cooling and heating cycle tests were carried out 1000 times in the range of −40 to 85° C.; however, the connecting resistance virtually showed no change. Moreover, these tests were carried out as many as 5000 times; however, the connecting resistance virtually showed no change.

Furthermore, the conductive fine particles were immersed into hot water of 120° C. for 24 hours, and then subjected to the same tests; however, no change was found in the connecting resistivity and the insulating property.

Here, when the concentration of the conductive fine particles in the anisotropic conductive paste was gradually increased, current leakage occurred between the electrodes at the concentration of 15%.

EXAMPLE 50

Nickel particles of 0.4 μm were driven onto nickel balls by using a hybridizer so as to provide protrusions on their surface, and gold plating was then carried out; except these, the same processes as Example 39 were carried out to obtain conductive fine particles. These were then subjected to the same tests, and the results showed that the conductive connecting element had a sufficiently low connecting resistivity of 0.006Ω, and a connecting resistance between the adjacent electrodes was not less than 1×10⁹, thereby providing a sufficient line-to-line insulating property.

Cooling and heating cycle tests were carried out 1000 times in the range of −40 to 85° C.; however, the connecting resistance virtually showed no change. Here, the concentration of the conductive fine particles in the anisotropic conductive paste was gradually increased, and no leakage occurred between the electrodes until the concentration had reached 40%.

EXAMPLE 51

The same processes as Example 39 were carried out except that nickel-gold plated balls were coated with thermoplastic vinyl copolymer resin having a thickness of 1 μm; thus, conductive fine particles were obtained. These were then subjected to the same tests, and the results showed that the conductive fine particles had a sufficiently low connecting resistivity of 0.006Ω, and a connecting resistance between the adjacent electrodes was not less than 1×10⁹, thereby providing a sufficient line-to-line insulating property.

Cooling and heating cycle tests were carried out 1000 times in the range of −40 to 85° C.; however, the connecting resistance virtually showed no change. Here, the concentration of the conductive fine particles in the anisotropic conductive paste was gradually increased, and no leakage occurred between the electrodes until the concentration had reached 60%.

EXAMPLE 52

Nickel-gold plated balls having an average particle size of 8 μm, an aspect ratio of 1.17 and a CV value of 20% were mixed with and dispersed in epoxy resin so that an anisotropic conductive paste was formed. This was applied to a glass-epoxy copper clad substrate (thickness: 1.6 mm, wiring width: 50 μm, electrode pitch: 100 μm) with a virtually uniform thickness by a screen printing method.

On this is superposed a polyimide film substrate (thickness:30 μm, wiring width: 50 μm, electrode pitch: 100 μm) with a thickness of 100 μm, and this was then heated and pressed at 150° C. for two minutes; thus, a conductive connecting element was formed.

This conductive connecting element had a sufficiently low connecting resistivity of 0.006Ω, and a connecting resistance between the adjacent electrodes was not less than $1\times10^9$, thereby providing a sufficient line-to-line insulating property.

Cooling and heating cycle tests were carried out 1000 times in the range of −40 to 85° C.; however, the connecting resistance virtually showed no change. Here, the concentration of the conductive fine particles in the anisotropic conductive paste was gradually increased, however, no leakage occurred between the electrodes until the concentration had reached 40%.

EXAMPLE 53

The same processes as Example 39 were carried out except that nickel-palladium plated balls were used so that conductive fine particles were obtained. These were subjected to the same tests, and the conductive fine particles had a sufficiently low connecting resistivity of 0.007Ω, and a connecting resistance between the adjacent electrodes was not less than $1\times10^9$, thereby providing a sufficient line-to-line insulating property.

Cooling and heating cycle tests were carried out 1000 times in the range of −40 to 85° C.; however, the connecting resistance virtually showed no change. Here, the concentration of the conductive fine particles in the anisotropic conductive paste was gradually increased; however, no leakage occurred between the electrodes until the concentration had reached 40%.

EXAMPLE 54

The same processes as Example 39 were carried out except that the gold plating was carried out by electroplating with a thickness of 0.2 μm so that conductive fine particles were obtained. These were subjected to the same tests, and the conductive fine particles had a sufficiently low connecting resistivity of 0.007Ω, and a connecting resistance between the adjacent electrodes was not less than $1\times10^9$, thereby providing a sufficient line-to-line insulating property.

Cooling and heating cycle tests were carried out 1000 times in the range of −40 to 85° C.; however, the connecting resistance virtually showed no change. Here, the concentration of the conductive fine particles in the anisotropic conductive paste was gradually increased; however, no leakage occurred between the electrodes until the concentration had reached 40%.

EXAMPLE 55

The same processes as Example 39 were carried out except that copper-gold plated balls having an aspect ratio of 1.17 and a CV value of 18% were used, so that conductive fine particles were obtained. These were subjected to the same tests, and the conductive fine particles had a sufficiently low connecting resistivity of 0.005Ω, and a connecting resistance between the adjacent electrodes was not less than $1\times10^9$, thereby providing a sufficient line-to-line insulating property.

Cooling and heating cycle tests were carried out 1000 times in the range of −40 to 85° C.; however, the connecting resistance virtually showed no change. Here, the concentration of the conductive fine particles in the anisotropic conductive paste was gradually increased; however, no leakage occurred between the electrodes until the concentration had reached 35%.

EXAMPLE 56

The same processes as Example 39 were carried out except that metal balls, formed by applying nickel electroless plating with a thickness of 0.15 μm to copper having an aspect ratio of 1.17 and a CV value of 18% and then further applying gold plating to this, were used, so that conductive fine particles were obtained. These were subjected to the same tests, and the conductive fine particles had a sufficiently low connecting resistivity of 0.005Ω, and a connecting resistance between the adjacent electrodes was not less than $1\times10^9$, thereby providing a sufficient line-to-line insulating property.

Cooling and heating cycle tests were carried out 1000 times in the range of −40 to 85° C.; however, the connecting resistance virtually showed no change. Here, the concentration of the conductive fine particles in the anisotropic conductive paste was gradually increased; however, no leakage occurred between the electrodes until the concentration had reached 35%.

COMPARATIVE EXAMPLE 26

The same processes as Example 38 were carried out except that nickel (having an aspect ratio of 1.2 and a CV value of 42%, made by INCO Co., Ltd., Nickel Powder 4SP)-gold plated balls were used, so that conductive fine particles were obtained. These were subjected to the same tests, and the conductive fine particles had an inferior connecting resistivity of 0.025Ω, but a connecting resistance between the adjacent electrodes was not less than $1\times10^9$, thereby providing a sufficient line-to-line insulating property.

Cooling and heating cycle tests were carried out 1000 times in the range of −40 to 85° C.; however, the connecting resistance virtually showed no change. Here, the concentration of the conductive fine particles in the anisotropic conductive paste was gradually increased, and current leakage occurred between the electrodes at the concentration of 30%.

COMPARATIVE EXAMPLE 27

The same processes as Example 38 were carried out except that nickel balls having an aspect ratio of 1.17 and a CV value of 18% were used so that conductive fine particles were obtained. These were subjected to the same tests; and the conductive fine particles had a sufficient connecting resistivity of 0.009Ω, and a connecting resistance between the adjacent electrodes was not less than $1\times10^9$, thereby providing a sufficient line-to-line insulating property.

Here, the concentration of the conductive fine particles in the anisotropic conductive paste was gradually increased; however, no current leakage occurred between the electrodes until the concentration had reached 45%. However, when cooling and heating cycle tests were carried out 1000 times in the range of −40 to 85° C., the connecting resistance became 10 times greater than the initial value.

COMPARATIVE EXAMPLE 28

The same processes as Example 38 were carried out except that copper balls having an aspect ratio of 1.17 and a CV value of 18% were used so that conductive fine particles were obtained. These were subjected to the same tests; and the conductive fine particles had a sufficient connecting resistivity of 0.006Ω, and a connecting resistance between the adjacent electrodes was not less than $1 \times 10^9$, thereby providing a sufficient line-to-line insulating property.

Here, the concentration of the conductive fine particles in the anisotropic conductive paste was gradually increased; however, no current leakage occurred between the electrodes until the concentration had reached 40%. However, when cooling and heating cycle tests were carried out 1000 times in the range of −40 to 85° C., the connecting resistance became 3 times greater than the initial value.

COMPARATIVE EXAMPLE 29

The same processes as Example 38 were carried out except that copper balls having an aspect ratio of 1.17 and a CV value of 18% were used so that conductive fine particles were obtained. These were subjected to the same tests; and the conductive fine particles had a sufficient connecting resistivity of 0.006Ω, and a connecting resistance between the adjacent electrodes was not less than $1 \times 10^9$, thereby providing a sufficient line-to-line insulating property.

Here, the concentration of the conductive fine particles in the anisotropic conductive paste was gradually increased; however, no current leakage occurred between the electrodes until the concentration had reached 40%. However, when cooling and heating cycle tests were carried out 1000 times in the range of −40 to 85° C., shortcircuiting, which was supposedly caused by migration, was observed.

COMPARATIVE EXAMPLE 30

The same processes as Example 38 were carried out except that balls which were obtained by gold plating onto a crosslinked polystylene polymer and that had an aspect ratio of 1.05 and a CV value of 8% were used so that conductive fine particles were obtained. These were subjected to the same tests; and the conductive fine particles had an inferior connecting resistivity of 0.02Ω, but a connecting resistance between the adjacent electrodes was not less than $1 \times 10^9$, thereby providing a sufficient line-to-line insulating property.

Here, the concentration of the conductive fine particles in the anisotropic conductive paste was gradually increased; and current leakage occurred when the concentration reached 25%. When cooling and heating cycle tests were carried out 1000 times in the range of −40 to 85° C., the connecting resistance virtually showed no change.

COMPARATIVE EXAMPLE 31

The same processes as Example 38 were carried out except that nickel-gold plated balls having an average particle size of 200 μm, an aspect ratio of 1.05 and a CV value of 8% were used so that conductive fine particles were obtained. These were supposed to be subjected to the same tests; however, the particles settled in the stage of a binder solution, failing to provide an anisotropic conductive paste.

COMPARATIVE EXAMPLE 32

The same processes as Example 38 were carried out except that nickel-gold plating powder of not more than 0.2 μm was used, so that conductive fine particles were obtained. These were supposed to be subjected to the same tests; however, poor connection occurred in some places even though the concentration of the powder increased, resulting in failure to carry out the tests.

EXAMPLE 57

(A) Production of Base Particles

Divinylbenzene were polymerized by a suspension polymerization method, and this was then classified by a wet-method to produce base particles. These base particles had an average particle size of 100 μm, a standard deviation of 0.98 μm and a CV value of 0.98%.

(B) Production of Conductive Fine Particles by the Formation of a Conductive Metal Layer Next, the base particles were subjected to an electroless nickel plating process as a pre-treatment for the base particles so that a nickel plating layer of 0.15 μm was formed on the surface of each of the base particles.

Successively, after completion of the pre-treatment, the base particles were immersed in a plating bath containing nickel chloride, nickel sulfate and boric acid so as to carry out electroplating by using a flow-through plater (produced by Uemura Kogyo K.K.); thus, conductive fine particles having three types of conductive metal layers, that is, nickel thicknesses of 2, 5 and 13 μm, were produced.

(C) Application of the Conductive Fine Particles onto an IC Chip

An IC chip (wafer), which had electrode sections comprising plated nickel and plated copper on aluminum, with electrode pitches of 150 μm (peripheral arrangement) and 200 pins, was used, and silver paste (silver flake/epoxy adhesive) was formed with a thickness of 10 μm on the electrode sections of this IC chip by using the screen printing.

Next, by using a ball mounter produced by Nittetsu Micro K.K., balls were sucked onto ball suction holes in a mold provided with ball suction holes having a diameter of 30 μm at positions corresponding to the electrodes of the IC chip; thus, the balls were placed on the electrode sections of the IC chip.

Thereafter, the conductive fine particles were secured to the electrode sections of the IC chip (wafer) by heating at 130° C. for five minutes, and by cutting the wafer so that the IC chips (wafer) were divided into its chip size.

(D) Connection and Securing of the IC Chip onto a Substrate

Next, a glass-epoxy substrate in which electrode sections were formed by electroless copper plating at positions corresponding to the electrode sections of the IC chip was used, and after a silver paste printing process had been carried out on the electrode sections of the glass-epoxy substrate, the IC chip on which the conductive fine particles had been secured was secured thereon by heat by using a bonding device.

Evaluation

With respect to the glass-epoxy substrate on which the base particles, the conductive fine particles and the IC chip were connected and secured, obtained in Example 57, the following evaluation tests were carried out to evaluate the characteristics thereof. Table 12 shows the results of the tests.

(1) Thermal Conductivity of the Base Particles

A sheet having a thickness of 1.0 mm and comprising the same material as the base particles was prepared, and the thermal conductivity was measured thereon by using a quick thermal conductivity meter (produced by Kyoto Denshisha K.K., Type QTM-D3).

(2) Tensile Strength of the Conductive Metal Layer

A film-shaped sample having a thickness of 0.5 mm was manufactured under the same conditions as the plating process onto the base particles, and this was subjected to measurements at a tension speed of 10 mm/min by using a tension tester (made by Simadzu Corporation, Autograph).

(3) Evaluation on Bonding Strength of the Conductive Fine Particles to the IC Chip (Wafer)

By using a bonding tester (produced by Leska K.K. PTR-10 Type) as a testing device, strain deformation tests were carried out at a strain dislocation speed of 0.05 mm/sec with a location of 30 $\mu$m; thus, the amount of recoverable elastic strain and the strength against separation of the IC chip (wafer) from the electrode section due to strain deformation of the conductive fine particles were found.

(4) Heat Resistance Test

By using a Perfect Oven produced by Tabai Seisakusho K.K. was used as a testing device, tests were carried out at 200° C. for 500 hours to examine the electrical bonding state.

(5) Heat Cycle Test

By using a heat cycle tester produced by Kondo Kagakusha K.K. as a testing device, heat cycles, each setting 30-minute hold at 160° C. and 30-minute hold at −40° C., were repeated 1000 times, and the electrical connecting state of the connecting section was then examined.

(6) Limiting Current Value Test

An electric current was allowed to flow while the applied voltage across the electrodes was gradually increased by using a de-stabilized power source so that the current at the limited point on the voltage-current straight line was found.

EXAMPLE 58

(A) Production of Base Particles

The same processes as Example 57 were carried out except that divinylbenzene manufactured had an average particle size of 50 $\mu$m, a standard deviation of 0.53 $\mu$m and a CV value of 1.06%.

(B) Production of Conductive Fine Particles by the Formation of a Conductive Metal Layer Next, the base particles were subjected to a pre-treatment in the same manner as Example 57, and a nickel plating layer of 0.15 $\mu$m was formed on the surface of each of the base particles.

Successively, after completion of the pre-treatment, the base particles were immersed in a plating bath containing potassium gold cyanide to carry out electroplating by using the same plating device as Example 57; thus, conductive fine particles were manufactured by forming a conductive metal layer having a gold thickness of 2 $\mu$m.

(C) Application of the Conductive Fine Particles onto an IC Chip and Connection and Securing of the IC Chip to the Substrate The same processes as Example 57 were carried out.

Evaluation

With respect to the glass-epoxy substrate on which the base particles, the conductive fine particles and the IC chip were connected and secured, the same evaluation tests as Example 57 were carried out. Table 12 shows the results of the tests.

EXAMPLE 59

(A) Production of Conductive Fine Particles by Formation of a Conductive Metal Layer and a Low-melting-point Metal Layer The same base particles as Example 57 was used and subjected to electroless nickel plating. Further, by using the same plating device and plating bath as Example 57, particles having a conductive metal layer composed of nickel with a thickness of 5 $\mu$m were manufactured. Then, these particles were immersed in a solder plating bath (produced by Okuno Seiyaku Kogyo K.K., Toptina MS), comprising an acidic brightening bath, to carry out an electroplating process; thus, a low-melting-point metal layer comprising an eutectic solder layer with a thickness of 10 $\mu$m and a composition of tin 63 weight %/lead 37 weight % was formed around each of the fine particles, thereby preparing conductive fine particles.

(B) Application of the Conductive Fine Particles onto an IC Chip and Connection and Securing of the IC Chip to the Substrate The conductive fine particles were applied onto the IC chip in the same manner as Example 57, and the conductive fine particles were connected and secured to the electrode sections of the IC chip (wafer) by heating at 230° C. for 10 seconds, and the IC chip (wafer) was cut into its chip size.

Thereafter, the IC chip was connected and secured to the substrate in the same manner as Example 57.

Evaluation

With respect to the glass-epoxy substrate on which the base particles, the conductive fine particles and the IC chip were connected and secured, the same evaluation tests as Example 57 were carried out. Table 12 shows the results of the tests.

EXAMPLE 60

(A) Production of Base Particles

First, after styrene and methaacryloxytriethoxysilane (6 to 4 weight ratio) were copolymerized by using a suspension polymerization method, alcoxysilyl groups were subjected to a hydrolysis reaction with each other so as to be crosslinked, and this was classified by a wet-method so that base particles were manufactured. These base particles had an average particle size of 95 $\mu$m, a standard deviation of 0.79 $\mu$m and a CV value of 0.83%.

(B) Production of Conductive Fine Particles by the Formation of a Conductive Metal Layer and a Low-melting-point Metal Layer Next, the base particles were subjected to a pre-treatment in the same manner as Example 57, and a nickel plating layer of 2 $\mu$m was formed on the surface of each of the base particles. Moreover, the same processes as Example 3 were carried out so that a low-melting-point metal layer comprising an eutectic solder plating layer with a thickness of 10 $\mu$m was formed, thereby preparing conductive fine particles.

(C) Application of the Conductive Fine Particles onto an IC Chip and Connection and Securing of the IC Chip to the Substrate After the conductive fine particles were applied to the IC chip in the same manner as Example 57, this was heated at 210° C. for one minute so that the conductive fine particles were connected and secured to the electrode sections of the IC chip (wafer), and the IC chip (wafer) was then cut into its chip size.

Thereafter in the same manner as Example 57, the chip was connected and secured to the substrate.

Evaluation

With respect to the glass-epoxy substrate on which the base particles, the conductive fine particles and the IC chip were connected and secured, the same evaluation tests as Example 57 were carried out. Table 12 shows the results of the tests.

EXAMPLE 61

(A) Production of Base Particles

First, a polymer in which 10% by weight of titanium oxide whisker was uniformly blended in a divinylbenzene polymer was manufactured by using a suspension polymerization method, and this was classified by a wet-method so that base particles were manufactured. These base particles had an average particle size of 103 μm, a standard deviation of 1.34 μm and a CV value of 1.3%.

(B) Production of Conductive Fine Particles by the Formation of a Conductive Metal Layer and a Low-melting-point Metal Layer In the same manner as Example 60, a conductive metal layer which comprises a nickel plating layer of 2 μm and a low-melting-point metal layer comprising an eutectic solder plating layer with a thickness of 10 μm were formed, thereby preparing conductive fine particles.

(C) Application of the Conductive Fine Particles onto an IC Chip and Connection and Securing of the IC Chip to the Substrate In the same manner as Example 4, the application of the conductive fine particles to the IC chip and the connection and securing of the IC chip onto the substrate were carried out.

Evaluation

With respect to the glass-epoxy substrate on which the base particles, the conductive fine particles and the IC chip were connected and secured, the same evaluation tests as Example 57 were carried out. Table 12 shows the results of the tests.

EXAMPLE 62

(A) Production of Base Particles

The same base particles as manufactured in Example 57 were used.

(B) Production of Conductive Fine Particles by the Formation of a Conductive Metal Layer and a Low-melting-point Metal Layer Next, in the same manner as Example 57, the base particles were subjected to a pre-treatment, and a conductive metal layer having a nickel thickness of 5 μm was prepared.

By using the same plating device as Example 57, the base particles having the conductive metal layer were immersed in a plating bath containing tin pyrophosphate and silver iodide so as to carry out an electroplating process; thus, a low-melting-point metal layer comprising an eutectic solder layer that had a thickness of 12 μm and a composition of tin 96.5 weight %/silver 3.5 weight % was formed around each of the fine particles, thereby preparing conductive fine particles.

(C) Application of the Conductive Fine Particles onto an IC Chip and Connection and Securing of the IC Chip to the Substrate In the same manner as Example 4, the application of the conductive fine particles to the IC chip and the connection and securing of the IC chip onto the substrate were carried out.

Evaluation

With respect to the glass-epoxy substrate on which the base particles, the conductive fine particles and the IC chip were connected and secured, the same evaluation tests as Example 57 were carried out. Table 12 shows the results of the tests.

EXAMPLE 63

(A) Production of Base Particles

The base particles were manufactured in the same manner as Example 57.

(B) Production of Conductive Fine Particles by the Formation of a Conductive Metal Layer and a Low-melting-point Metal Layer Next, in the same manner as Example 57, the base particles were subjected to a pre-treatment, and a conductive metal layer having a nickel thickness of 5 μm was prepared.

By using the same plating device as Example 57, the base particles having the conductive metal layer were immersed in a plating bath containing methasulfonic acid and bismuth methasulfonate to carry out an electroplating process; thus, a low-melting-point metal layer comprising an eutectic solder layer that had a thickness of 10 μm and a composition of tin 92.5 weight %/bismuth 7.5 weight % was formed around each of the fine particles, thereby preparing conductive fine particles.

(C) Application of the Conductive Fine Particles onto an IC Chip and Connection and Securing of the IC Chip to the Substrate In the same manner as Example 4, the application of the conductive fine particles to the IC chip and the connection and securing of the IC chip onto the substrate were carried out.

Evaluation

With respect to the glass-epoxy substrate on which the base particles, the conductive fine particles and the IC chip were connected and secured, the same evaluation tests as Example 57 were carried out. Table 12 shows the results of the tests.

EXAMPLE 64

(A) Production of Base Particles

The base particles were manufactured in the same manner as Example 57.

(B) Production of Conductive Fine Particles by the Formation of a Conductive Metal Layer and a Low-melting-point Metal Layer Next, in the same manner as Example 57, the base particles were subjected to a pre-treatment, and after completion of the tre-treatment, the base particles were subjected to an electroplating process to the pre-treated base particles by using the same plating device as Example 57 so that a conductive metal layer having a copper thickness of 8 μm was prepared.

Then, the base particles having the conductive metal layer were immersed in a plating bath containing bismuth methasulfonate to carry out an electroplating process; thus, a low-melting-point metal layer comprising bismuth with a thickness of 1 μm was formed. Further, this was subjected to an electroplating process using a plating bath containing tin pyrophosphate and silver iodide; thus, a low-melting-point metal layer comprising an eutectic solder layer that had a thickness of 10 μm and a composition of tin 96.5 weight %/silver 3.5 weight % was formed on the low-melting-point metal layer comprising bismuth, thereby preparing conductive fine particles.

(C) Application of the Conductive Fine Particles onto an IC Chip and Connection and Securing of the IC Chip to the Substrate In the same manner as Example 60, the application of the conductive fine particles to the IC chip, the connection and securing of the IC chip onto the substrate were carried out.

Evaluation

With respect to the glass-epoxy substrate on which the base particles, the conductive fine particles and the IC chip were connected and secured, the same evaluation tests as Example 57 were carried out. Table 12 shows the results of the tests.

EXAMPLE 65

(A) Production of Base Particles

First, divinylbenzene was polymerized by a suspension polymerization method, and this was classified by a wet-method so that base particles were manufactured. These base particles had an average particle size of 300 μm, a standard deviation of 2.90 μm and a CV value of 0.97%.

(B) Production of Conductive Fine Particles by the Formation of a Conductive Metal Layer and a Low-melting-point Metal Layer Next, the base particles were subjected an electroless nickel plating process, as a pre-treatment so that a nickel plating layer of 0.3 μm was formed on the surface of each of the base particles.

Then, by using the same plating device as Example 57, the base particles after completion of the pre-treatment were immersed in a plating bath containing nickel chloride, nickel sulfate and boric acid to carry out an electroplating process; thus, a conductive metal layer having a nickel thickness of 30 μm was formed.

Next, the base particles having the conductive metal layer were subjected to an electroplating process so that a low-melting-point metal layer comprising an eutectic solder layer that had a thickness of 25 μm and a composition of tin 63 weight %/lead 37 weight % was formed, thereby preparing conductive fine particles.

(C) Application of the Conductive Fine Particles onto an IC Chip and Connection and Securing of the IC Chip to the Substrate In the same manner as Example 4, the application of the conductive fine particles to the IC chip, the connection and securing of the IC chip onto the substrate were carried out.

Evaluation

With respect to the glass-epoxy substrate on which the base particles, the conductive fine particles and the IC chip were connected and secured, the same evaluation tests as Example 57 were carried out. Table 12 shows the results of the tests.

EXAMPLE 66

(A) Production of Base Particles

First, divinylbenzene was polymerized by a suspension polymerization method, and this was classified by a wet-method so that base particles were manufactured. These base particles had an average particle size of 650 μm, a standard deviation of 4.88 μm and a CV value of 0.75%.

(B) Production of Conductive Fine Particles by the Formation of a Conductive Metal Layer and a Low-melting-point Metal Layer Next, the base particles were subjected an electroless nickel plating process as a pre-treatment so that a nickel plating layer of 0.3 μm was formed on the surface of each of the base particles.

Then, by using the same plating device as Example 57, the base particles after completion of the pre-treatment were immersed in a plating bath containing nickel chloride, nickel sulfate and boric acid to carry out an electroplating process; thus, a conductive metal layer having a nickel thickness of 55 μm was formed.

Next, the base particles having the conductive metal layer were subjected to an electroplating process so that a low-melting-point metal layer comprising an eutectic solder layer that had a thickness of 50 μm and a composition of tin 63 weight %/lead 37 weight % was formed, thereby preparing conductive fine particles.

(C) Application of the Conductive Fine Particles onto an IC Chip and Connection and Securing of the IC Chip to the Substrate In the same manner as Example 60, the application of the conductive fine particles to the IC chip, the connection and securing of the IC chip onto the substrate were carried out.

Evaluation

With respect to the glass-epoxy substrate on which the base particles, the conductive fine particles and the IC chip were connected and secured, the same evaluation tests as Example 57 were carried out. Table 12 shows the results of the tests.

EXAMPLE 67

(A) Production of Base Particles

The same base particles as Example 57 were used.

(B) Production of Conductive Fine Particles by the Formation of a Conductive Metal Layer and a Low-melting-point Metal Layer Next, in the same manner as Example 57, the base particles were subjected to a pre-treatment by electroless plating, with the result that an electroless nickel plating layer having a thickness of 0.15 μm was formed. Then, the base particles after completion of the pre-treatment was subjected to an electroplating process in the same manner as Example 8 so that a metal layer comprising copper which a thickness of 8 μm was prepared. This was coated with a nickel plating layer of 1 μm by electroplating. Moreover, this was coated with a low-melting-point metal layer which comprises a solder layer composed of tin 96.5 weight %/silver 3.5 weight % and which has a thickness of 10 μm in the same manner as Example 6 so that conductive fine particles were prepared.

(C) Application of the Conductive Fine Particles onto an IC Chip and Connection and Securing of the IC Chip to the Substrate In the same manner as Example 60, the application of the conductive fine particles to the IC chip, the connection and securing of the IC chip onto the substrate were carried out.

Evaluation

With respect to the glass-epoxy substrate on which the base particles, the conductive fine particles and the IC chip were connected and secured, the same evaluation tests as Example 57 were carried out. Table 12 shows the results of the tests.

EXAMPLE 68

(A) Production of Base Particles

The same base particles as Example 57 were used.

(B) Production of Conductive Fine Particles by the Formation of a Conductive Metal Layer and a Low-melting-point Metal Layer Next, in the same manner as Example 57, the base particles were subjected to a pre-treatment by electroless plating, with the result that an electroless nickel plating layer having a thickness of 0.15 μm was formed. Then, the base particles after completion of the pre-treatment was subjected to an electroplating process in the same manner as Example 2 to form a conductive metal layer comprising gold having a thickness of 8 μm; thus, conductive fine particles were prepared.

(C) Application of the Conductive Fine Particles onto an IC Chip and Connection and Securing of the IC Chip to the Substrate By using the same ball mounter as Example 57, the conductive fine particles were placed on the electrodes of an IC chip, and the conductive fine particles were then pressed onto the electrode sections with heat by a bonding machine at 300° C. while applying ultrasonic waves.

(D) Connection and Securing of the IC Chip to the Substrate

The IC chip to which the conductive fine particles had been connected and secured was connected and secured to a glass-epoxy substrate in the same manner as Example 57.

Evaluation

With respect to the glass-epoxy substrate on which the base particles, the conductive fine particles and the IC chip were connected and secured, the same evaluation tests as Example 57 were carried out. Table 12 shows the results of the tests.

COMPARATIVE EXAMPLE 32

(A) Conductive Fine Particles

Particles, which comprises high-melting-point solder particles having an average particle size of 78 μm and comprising tin 10 weight %/lead 90 weight %, and formed thereon, an eutectic solder plating having a thickness of 10 μm and comprising tin 63 weight %/lead 37 weight %, were used as the conductive fine particles. The standard deviation thereof was 0.9 μm.

(B) Application of the Conductive Fine Particles onto an IC Chip and Connection and Securing of the IC Chip to the Substrate The conductive fine particles were applied onto the IC chip in the same manner as Example 57, and the conductive fine particles were connected and secured to the electrode sections of the IC chip (wafer) by heating at 230° C. for 10 seconds, and the IC chip (wafer) was cut into its chip size.

Thereafter, the IC chip was connected and secured to the substrate in the same manner as Example 57.

Evaluation

With respect to the glass-epoxy substrate to which the IC chip was connected and secured by using the conductive fine particles, evaluation tests were carried out. As a result, separation occurred at connecting sections between the conductive fine particles and the IC chip, and after the heat cycle tests of 450 times, a failure occurred in conduction.

COMPARATIVE EXAMPLE 33

(A) Conductive Fine Particles

Particles, which comprises copper balls having an average particle size of 80 μm, and formed thereon, a gold plating layer having a thickness of 7 μm were used as the conductive fine particles. The standard deviation thereof was 1.1 μm.

(B) Application of the Conductive Fine Particles onto an IC Chip and Connection and Securing of the IC Chip to the Substrate The conductive fine particles were applied onto the IC chip in the same manner as Example 57, and the conductive fine particles were connected and secured to the electrode sections of the IC chip (wafer) by heating at 230° C. for 10 seconds, and the IC chip (wafer) was cut into its chip size.

Thereafter, the IC chip was connected and secured to the substrate in the same manner as Example 57.

Evaluation

With respect to the glass-epoxy substrate to which the IC chip was connected and secured by using the conductive fine particles, evaluation tests were carried out. As a result, separation occurred at connecting sections between the conductive fine particles and the IC chip, and after the heat cycle tests of 550 times, a failure occurred in conduction.

COMPARATIVE EXAMPLE 34

(A) Production of Base Particles

The same base particles as manufactured in Example 57 were used.

(B) Production of Conductive Fine Particles by the Formation of a Conductive Metal Layer The base particles were subjected to a pre-treatment in the same manner as Example 57, and a nickel plating layer having a thickness of 0.8 μm was formed thereon by electroplating; thus, conductive fine particles were manufactured.

(C) Application of the Conductive Fine Particles onto an IC Chip and Connection and Securing of the IC Chip to the Substrate The conductive fine particles were placed on the electrode sections of the IC chip, and connected and secured thereto under the same conditions as Example 57.

Evaluation

With respect to the glass-epoxy substrate to which the base particles, the conductive fine particles and the IC chip were connected and secured, evaluation tests were carried out in the same manner as Example 57. As a result, cracks took place in the conductive metal layer due to heat; consequently, after the heat resistance test of 50 hours, a failure occurred in conduction. Moreover, after the heat cycle tests of 170 times, a failure occurred in conduction.

COMPARATIVE EXAMPLE 35

(A) Production of Base Particles

The same base particles as manufactured in Example 57 were used.

(B) Production of Conductive Fine Particles by the Formation of a Conductive Metal Layer The base particles were subjected to a pre-treatment in the same manner as Example 57, and a nickel plating layer having a thickness of 2.5 μm was formed thereon by electroplating; thus, conductive fine particles were manufactured.

(C) Application of the Conductive Fine Particles onto an IC Chip and Connection and Securing of the IC Chip to the Substrate The conductive fine particles were placed on the electrode sections of the IC chip, and connected and secured thereto under the same conditions as Example 57.

Evaluation

With respect to the glass-epoxy substrate to which the base particles, the conductive fine particles and the IC chip were connected and secured, evaluation tests were carried out in the same manner as Example 57. As a result, the results of the heat resistance test was good; however, after the heat cycle tests of 350 times, a failure occurred in conduction.

COMPARATIVE EXAMPLE 36

(A) Production of Base Particles

The same base particles as manufactured in Example 57 were used.

(B) Production of Conductive Fine Particles by the Formation of a Conductive Metal Layer The base particles were allowed to adsorb a catalyst comprising a tin/palladium double salt on their surface, and these were treated with a sulfuric acid solution to be activated. A nickel layer having a thickness of 0.9 μm was formed on the surface thereof by electroless plating so that conductive fine particles were manufactured.

(C) Application of the Conductive Fine Particles onto an IC Chip and Connection and Securing of the IC Chip to the Substrate The conductive fine particles were placed on the electrode sections of the IC chip, and connected and secured thereto under the same conditions as Example 57.

Evaluation

With respect to the glass-epoxy substrate to which the base particles, the conductive fine particles and the IC chip were connected and secured, evaluation tests were carried out in the same manner as Example 57. As a result, after the heat resistance test of 270 hours, cracks took place in the nickel plating layer, resulting in failure in conduction. Moreover, after the heat cycle tests of 560 times, a failure occurred in conduction.

COMPARATIVE EXAMPLE 37

(A) Production of Base Particles

The same base particles as Example 57 were used.

(B) Production of Conductive Fine Particles by the Formation of a Conductive Metal Layer and a Low-melting-point Metal Layer Next, in the same manner as Example 57, the base particles were subjected to a pre-treatment by electroless plating, with the result that an electroless nickel plating layer having a thickness of 0.15 µm was formed. Then, the base particles after completion of the pre-treatment was subjected to an electroplating process in the same manner as Example 57 so as to form a conductive metal layer comprising nickel with a thickness of 5 µm. Moreover, this was coated with eutectic solder plating with a thickness of 53 µm and comprising tin 63 weight %/lead 37 weight % in the same manner as Example 3; thus, particles were prepared. The standard deviation was 2.3 µm.

(C) Application of the Conductive Fine Particles onto an IC Chip and Connection and Securing of the IC Chip to the Substrate The conductive fine particles were placed on the IC chip, and the IC chip was connected and secured to the substrate in the same manner as Example 3.

Evaluation

With respect to the glass-epoxy substrate to which the base particles, the conductive fine particles and the IC chip were connected and secured, evaluation tests were carried out in the same manner as Example 57. As a result, the results of the heat resistance test was good; however, after the heat cycle tests of 750 times, a failure occurred in conduction.

COMPARATIVE EXAMPLE 38

(A) Production of Base Particles

The same base particles as Example 57 were used.

(B) Production of Conductive Fine Particles by the Formation of a Conductive Metal Layer and a Low-melting-point Metal Layer Next, in the same manner as Example 57, the base particles were subjected to a pre-treatment by an electroless plating, with the result that an electroless nickel plating layer with a thickness of 0.15 µm was formed. Then, the base particles after completion of the pre-treatment was subjected to an electroplating process in the same manner as Example 57 to form a conductive metal layer comprising nickel having a thickness of 5 µm. Moreover, this was coated with eutectic solder plating having a thickness of 2.5 µm and comprising tin 63 weight %/lead 37 weight % in the same manner as Example 3; thus, particles were prepared. The standard deviation was 1.7 µm.

(C) Application of the Conductive Fine Particles onto an IC Chip and Connection and Securing of the IC Chip to the Substrate The conductive fine particles were placed on the IC chip, and the IC chip was connected and secured to the substrate in the same manner as Example 59.

Evaluation

With respect to the glass-epoxy substrate to which the base particles, the conductive fine particles and the IC chip were connected and secured, evaluation tests were carried out in the same manner as Example 57. As a result, since the solder plating layer was thin, the limited current value was as low as 0.4 Amp. Moreover, after the heat cycle tests of 750 times, a failure occurred in conduction.

TABLE 12

| | Evaluation of conductive particles | | | Evaluation of electronic circuit part | | |
| --- | --- | --- | --- | --- | --- | --- |
| | Thermal conductivity of base particles (W/mK) | Tensile strength of conductive metal layer (kg/mm$^2$) | Peel strength (gr) | Connection state after heat resistance test | Connection state after heat cycle test | Limiting current value test (A) |
| Ex. 57 | 0.12 | 85 | 38 | Good | Good | 4 |
| Ex. 58 | 0.12 | 23 | 35 | Good | Good | 5 |
| Ex. 59 | 0.12 | 85 | 38 | Good | Good | 4.5 |
| Ex. 60 | 0.36 | 85 | 34 | Good | Good | 3.6 |
| Ex. 61 | 0.32 | 85 | 45 | Good | Good | 5 |
| Ex. 62 | 0.12 | 85 | 50 | Good | Good | 3.8 |
| Ex. 63 | 0.12 | 85 | 43 | Good | Good | 4.8 |
| Ex. 64 | 0.12 | — | 57 | Good | Good | 4.5 |
| Ex. 65 | 0.12 | 85 | 350 | Good | Good | 8 |
| Ex. 66 | 0.12 | 85 | 1150 | Good | Good | 8 |
| Ex. 67 | 0.12 | — | 55 | Good | Good | 5 |
| Ex. 68 | 0.12 | 23 | 30 | Good | Good | 5 |

INDUSTRIAL APPLICABILITY

As described above, in the manufacturing device for conductive fine particles of the present invention, even if the number of revolutions of the treatment chamber is increased, no overflow occurs, and the amount of flow from the porous member is increased; therefore, plating is uniformly carried out even on particles having a size not more than 100 µm. Moreover, even in the case of a large particle size of not less than 100 µm, since the amount of a plating solution inside the treatment chamber is increased and a high current density is obtained, it is possible to shorten the plating time. Moreover, a sheet-shaped filter is affixed on the inner side face of the porous member so that clogging of particles is not occurred and consequently to increase the number of applications thereof. The sheet-shaped filter is more inexpensive than the porous member of plastic, ceramics or the like, and it results in cutting costs. Furthermore, the application of a plate-shaped porous member contributes to avoid aggregation of fine particles without adding dummy chips; therefore, it is possible to obtain clean conductive fine particles free from scratches and dents on the plating surface thereof, and also to omit the separation process between the dummy chips and the fine particles. Accordingly, the manufacturing device for conductive fine particles of the present invention is particularly effective when applied to cases in which plating is carried out on metal which tends to aggregate and has a soft coat film, such as solder plating.

The manufacturing method for conductive fine particles of the present invention has a superior stirring effect so that aggregated lumps, caused at the time of extended power application time or a high current density, can be pulverized; thus, it is possible to form a uniform plating layer with high efficiency.

In the manufacturing method for conductive fine particles of the present invention, even in the case that fine particles are relatively small, it is possible to form a uniform plating layer effectively on all the fine particles, by controlling the film thickness of the conductive base layer by means of an electroless plating, adjusting the specific gravity of the plating solution or the like.

The conductive fine particles of the present invention can provide an anisotropic conductive adhesive that has a greater current capacity upon connection and high reliability in connecting processes, and is free from current leakage.

The electronic circuit part of the present invention makes it possible to systematically eliminate poor connection, etc. resulting from various reasons between the electronic circuit element and the electronic circuit substrate, and also to minimize the connection pitches; therefore, it contributes to solve various conventional problems by using, for example, electronic circuit elements and electronic circuit substrates with high-density wiring.

What is claimed is:

1. An electronic circuit part which is formed by electrically connecting an electrode section of an electronic circuit element and an electronic section of an electronic circuit substrate, wherein the connection is formed by using a laminated conductive fine particle provided with a conductive metal layer on the surface of a spherical elastic base particle by electroless plating and electroplating and, further on the surface of the conductive metal layer, a low-melting-point metal layer, the conductive metal layer comprises a plurality of metal layers, the low-melting-point metal layer is formed by at least one element having a melting point of not more than 260° C. selected from the group consisting of tin, lead, bismuth, silver, zinc, indium, and copper, and the electrical connection is formed by a plurality of the laminated conductive fine particles per each connecting section at connecting sections between the electrode section of the electronic circuit element and the electrode section of the electronic circuit substrate.

2. The electronic circuit part according to claim 1, wherein the thickness (t; unit mm) of the conductive metal layer is set in a range represented by formula [1]

$P \times D/\sigma < t < 0.2 \times D$  [formula 1]

where P is a constant of pressure unit, 0.7 Kg/mm², D is the diameter (unit: mm) of an elastic base particle, and σ is a tensile strength (unit: Kg/mm²) of a metal material forming the conductive metal layer which is measured under the condition that a sheet shaped from the metal material having a thickness of 0.5 to 2 mm is tested at a tensile speed of 10 mm/mm. by a tensile tester.

3. The electronic circuit part according to claim 1, wherein the spherical elastic base particles have a thermal conductivity of not less than 0.30 W/m K.

4. The electronic circuit part according to claim 1, wherein the spherical elastic base particles is a resin material or an organic/inorganic hybrid material.

5. The electronic circuit part according to claim 1, wherein a spherical elastic base particle further includes an inorganic filler.

6. The electronic circuit part according to claim 1, wherein the conductive metal layer comprises at least one component selected from the group consisting of nickel, palladium, gold, silver, copper, aluminum and platinum.

7. The electronic circuit part according to claim 1, wherein the conductive metal layer comprises a plurality of metal layers.

8. The electronic circuit part according to claim 1, wherein at least one of the metal layers constituting a conductive metal layer is formed by electroplating.

9. The electronic circuit part according to claim 1, wherein a low-melting-point metal layer has a thickness of not more than 50% of the diameter of the elastic base particles.

10. The electronic circuit part according to claim 1, wherein a low-melting-point metal layer has a thickness of not less than 3% of the diameter of the elastic base particles.

11. The electronic circuit part according to claim 1, wherein a metal constituting the low-melting-point metal layer has a melting point of not more than 260° C.

12. The electronic circuit part according to claim 1, wherein a metal constituting the low-melting-point metal layer comprises at least one metal selected from the group consisting of tin, lead, bismuth, silver, zinc, indium and copper.

13. The electronic circuit part according to claim 1, wherein a metal constituting the low-melting-point metal layer comprises at least one metal selected from the group consisting of tin and alloys of tin.

14. The electronic circuit part according to claim 1, wherein a metal constituting the low-melting-point metal layer comprises at least one metal selected from the group consisting of tin and alloys of tin, and further comprises at least one metal selected from the group consisting of lead, bismuth, silver, zinc, indium and copper.

15. The electronic circuit part according to claim 1, wherein the low-melting-point metal layer is constituted by a plurality of metal layers.

16. The electronic circuit part according to claim 1, wherein at least one portion constituting a low-melting-point metal layer is formed by electroplating.

17. The electronic circuit part according to claim 9, wherein at least one metal layer constituting the conductive metal layer is formed by electroplating using an electroplating device, the electroplating device comprises a disk-shaped bottom plate secured to the upper end of a perpendicular driving shaft; a porous member that is placed on the outer circumferential upper face of the bottom plate and that has a larger pore size than that of a filter formed by affixing the sheet-shaped filter having a thickness of 10 to 1000 μm with a pore size allowing only a plating solution to pass there through; a contact ring for conducting electricity placed on the upper face of the porous member; a hollow cover of a trapezoidal cone shape having an opening on an upper center portion thereof, to the upper end of which a hollow cylinder having the same pore diameter as the opening diameter is joined, with the upper end of the hollow cylinder being bent toward the inner wall side of the hollow cylinder; a rotatable treatment chamber formed in a manner so as to sandwich the porous member and the contact ring, between the outer circumferential portion of the hollow cover and the bottom plate; a supply tube for supplying the plating solution to the treatment chamber through the opening; a container for receiving plating solution scattered from the pores of the porous member; a drain tube for draining the plating solution accumulated in the container; and an electrode inserted through the opening to contact the plating solution.

18. The electronic circuit part according to claim 1, wherein an elastic base particles has a diameter in orange of 5 to 700 μm.

19. The electronic circuit part according to claim 1, wherein an elastic base particles has a diameter in a range of 10 to 150 μm.

20. The electronic circuit part according to claim 1, wherein even in the case when, of the electrode section of the electronic circuit element and the electrode section of the electronic circuit substrate, one is dislocated in parallel with the other due to a physical force in the parallel direction, a laminated conductive fine particle or a double laminated conductive fine particle exert an elastic shearing deformation, thereby providing a recovering capability.

21. The electronic circuit part according to claim 1, wherein the current flowing between an electrode section of an electronic circuit element and an electrode section of an electronic circuit substrate has a limited value in a range of 0.5 to 10 Amp per the electrode section.

22. The electronic circuit part according to claim 1, wherein an electronic circuit element is an IC bear chip and a flip chip bonding is formed between the electronic circuit element and an electronic circuit substrate.

23. The electronic circuit part according to claim 1, wherein an electronic circuit element is a chip size package (CSP), and a ball grid array (BGA) bonding is formed between the electronic circuit element and an electronic circuit substrate.

24. A laminated conductive fine particle or a double laminated conductive fine particle which is used in the electronic circuit part according to claim 1.

25. An electronic circuit element which is used in the electronic circuit part according to claim 1.

26. An electronic circuit substrate which is used in the electronic circuit part according to claim 1.

27. An electronic circuit part which is formed by electrically connecting an electrode section of an electronic circuit element and an electrode section of an electronic circuit substrate,
   wherein the connection is formed by using a laminated conductive fine particle provided with a conductive metal layer around a spherical elastic base particle by electroless plating and electroplating and, further on the surface of the conductive metal layer, a low-melting-point metal layer,
   the conductive metal layer comprises a plurality of metal layers,
   the low-melting-point metal layer is formed by at least one element having a melting point of not more than 260° C. selected from the group consisting of tin, lead, bismuth, silver, zinc, indium, and copper, and
   the electrical connection is formed by one laminated conductive fine particle per each connecting section at each of connecting sections between the conductive metal layer and the low-melting-point metal layer of the laminated conductive fine particles and the electrode section of the electrode circuit element.

28. The electronic circuit part according to claim 27, wherein the thickness (t: unit mm) of the conductive metal layer is set in a range represented by formula [1]

$$P \times D/\sigma < t < 0.2 \times D \quad \text{[Formula 1]}$$

where P is a constant of pressure unit, 1.0 Kg/mm², D is the diameter (unit: mm) of an elastic base particle, σ is a tensile strength (unit: Kg/mm²) of a metal material forming the conductive metal layer, which is measured under the condition that a sheet shaped from the metal material having a thickness of 0.5 to 2 m is tested at a tensile speed of 10 mm/min. by a tensile tester.

29. The electronic circuit part according to claim 27, wherein at least one metal layer constituting the conductive metal layer is formed by electroplating using an, electroplating device,
   the electroplating device comprises a disk-shaped bottom plate secured to the upper end of a perpendicular driving shaft; a porous member that is placed on the outer circumferential upper face of the bottom plate and that has a pore size a larger pore size then that of a filter formed by affixing the sheet-shaped filter having a thickness of 10 to 1000 μm with a pore size allowing only a plating solution to pass there through; a contact ring for conducting electricity placed on the upper face of the porous member; a hollow cover of a trapezoidal cone shape having an opening on an upper center portion thereof, to the upper end of which a hollow cylinder having the same pore diameter as the opening diameter is joined, with the upper end of the hollow cylinder being bent toward the inner wall side of the hollow cylinder; a rotatable treatment chamber formed in a manner so as to sandwich the porous member and the contact ring, between the outer circumferential portion of the hollow cover and the bottom plate; a supply tube for supplying the plating solution to the treatment chamber through the opening; a container for receiving plating solution scattered from the pores of the porous member; a drain tube for draining the plating solution accumulated in the container; and an electrode inserted through the opening to contact the plating solution.

30. An electronic circuit element or an electronic circuit substrate, which is connected by a conductive fine particle, wherein a bonding strength F (unit: gr) between the conductive fine particle and an electrode section of an electronic circuit element or an electrode section of an electronic circuit substrate is set in a range represented by [Formula 2]:

$$500 \times D' \times D'(\text{gr/mm mm}) < F < 8000 \times D' \times D'(\text{gr/mm mm}) \quad \text{[Formula 2]}$$

wherein D' represents the diameter (unit: mm) of the conductive fine particle,
   the conductive fine particle is a laminated conductive fine particle provided with a conductive metal layer on the surface of a spherical elastic base particle by electroless plating and electroplating and, further on the surface of the conductive metal layer, a low-melting-point metal layer,
   the conductive metal layer comprises a plurality of metal layers, and
   the low-melting-point metal layer is formed by at least one element having a melting point of not more than 260° C. selected from the group consisting of tin, lead, bismuth, silver, zinc, indium, and copper.

* * * * *